US006847529B2

(12) United States Patent
Dibene, II et al.

(10) Patent No.: US 6,847,529 B2
(45) Date of Patent: Jan. 25, 2005

(54) ULTRA-LOW IMPEDANCE POWER INTERCONNECTION SYSTEM FOR ELECTRONIC PACKAGES

(75) Inventors: Joseph Ted Dibene, II, Oceanside, CA (US); David H. Hartke, Durango, CO (US); Carl E. Hoge, San Diego, CA (US); Edward J. Derian, San Diego, CA (US)

(73) Assignee: INCEP Technologies, Inc., San Diego, CA (US)

( * ) Notice: Subject to any disclaimer, the term of this patent is extended or adjusted under 35 U.S.C. 154(b) by 313 days.

(21) Appl. No.: 10/036,957

(22) Filed: Dec. 20, 2001

(65) Prior Publication Data

US 2003/0002268 A1 Jan. 2, 2003

Related U.S. Application Data

(63) Continuation-in-part of application No. 09/885,780, filed on Jun. 19, 2001, now abandoned, which is a continuation-in-part of application No. 09/353,428, filed on Jul. 15, 1999.

(List continued on next page.)

(60) Provisional application No. 60/313,338, filed on Aug. 17, 2001, provisional application No. 60/310,038, filed on Aug. 3, 2001, provisional application No. 60/304,930, filed on Jul. 11, 2001, provisional application No. 60/304,929, filed on Jul. 11, 2001, provisional application No. 60/301,753, filed on Jun. 27, 2001, provisional application No. 60/299,573, filed on Jun. 19, 2001, provisional application No. 60/292,125, filed on May 18, 2001, provisional application No. 60/291,772, filed on May 16, 2001, provisional application No. 60/291,749, provisional application No. 60/287,860, filed on May 1, 2001, provisional application No. 60/277,369, filed on Mar. 19, 2001, provisional application No. 60/266,941, filed on Feb. 6, 2001, provisional application No. 60/232,971, filed on Sep. 14, 2000, provisional application No. 60/222,407, filed on Aug. 2, 2000, provisional application No. 60/222,386, filed on Aug. 2, 2000, provisional application No. 60/219,813, filed on Jul. 21, 2000, provisional application No. 60/219,506, filed on Jul. 20, 2000, provisional application No. 60/196,059, filed on Apr. 10, 2000, provisional application No. 60/187,777, filed on Mar. 8, 2000, provisional application No. 60/183,474, filed on Feb. 18, 2000, provisional application No. 60/171,065, filed on Dec. 16, 1999, provisional application No. 60/167,792, filed on Nov. 29, 1999, provisional application No. 60/186,769, filed on Mar. 3, 2000, provisional application No. 60/251,222, filed on Dec. 4, 2000, provisional application No. 60/251,223, filed on Dec. 4, 2000, provisional application No. 60/251,184, filed on Dec. 4, 2000, and provisional application No. 60/266,941, filed on Feb. 6, 2001.

(51) Int. Cl.[7] .................................. H05K 1/11; H05K 1/14
(52) U.S. Cl. ........................ 361/803; 361/790; 174/257; 174/260
(58) Field of Search .......................... 361/767–792, 361/803; 257/685–686, 723–725; 174/255–260; 439/66, 71; 29/830–832; 438/118, 125

(56) References Cited

U.S. PATENT DOCUMENTS 3,596,138 A    7/1971   Lehrfeld (List continued on next page.)

FOREIGN PATENT DOCUMENTS

EP    0 582 145 A1    2/1994

(List continued on next page.)

OTHER PUBLICATIONS

Chung, "Ball–Grid–Array Package Thermal Management," 14th IEEE Semi–therm TM Symposium, 1998, 78–87.

(List continued on next page.)

*Primary Examiner*—Kamand Cuneo
*Assistant Examiner*—Tuan Dinh
(74) *Attorney, Agent, or Firm*—Knobbe Martens Olson & Bear LLP

(57) ABSTRACT

A power interconnection system comprising a plurality of z-axis compliant connectors passing power and ground signals between a first circuit board to a second circuit board is disclosed. The interconnection system provides for an extremely low impedance through a broad range of frequencies and allows for large amounts of current to pass from one substrate to the next either statically or dynamically. The interconnection system may be located close to the die or may be further away depending upon the system requirements. The interconnection may also be used to take up mechanical tolerances between the two substrates while providing a low impedance interconnect.

37 Claims, 27 Drawing Sheets

Related U.S. Application Data now Pat. No. 6,304,450, application No. 10/036,957, which is a continuation-in-part of application No. 09/432,878, filed on Nov. 2, 1999, now Pat. No. 6,356,448, which is a continuation-in-part of application No. 09/353,428, filed on Jul. 15, 1999, now Pat. No. 6,304,450, application No. 10/036,957, which is a continuation-in-part of application No. 09/727,016, filed on Nov. 28, 2000, now abandoned, application No. 10/036,957, which is a continuation-in-part of application No. 09/785,892, filed on Feb. 16, 2001, now Pat. No. 6,452,113, application No. 10/036,957, which is a continuation-in-part of application No. 09/798,541, filed on Mar. 2, 2001, now abandoned, which is a continuation-in-part of application No. 09/727,016, and a continuation-in-part of application No. 09/785,892, and a continuation-in-part of application No. 09/432,878, which is a continuation-in-part of application No. 09/353,428, application No. 10/036,957, which is a continuation-in-part of application No. 09/801,437, filed on Mar. 8, 2001, now Pat. No. 6,618,268, which is a continuation-in-part of application No. 09/798,541, and a continuation-in-part of application No. 09/785,892, and a continuation-in-part of application No. 09/727,016, and a continuation-in-part of application No. 09/432,878, which is a continuation-in-part of application No. 09/353,428, application No. 10/036,957, which is a continuation-in-part of application No. 09/802,329, filed on Mar. 8, 2001, now Pat. No. 6,452,804, which is a continuation-in-part of application No. 09/798,541, which is a continuation-in-part of application No. 09/727,016, and a continuation-in-part of application No. 09/785,892, and a continuation-in-part of application No. 09/432,878, which is a continuation-in-part of application No. 09/353,428, said application No. 09/802,329, is a continuation-in-part of application No. 09/785,892, and a continuation-in-part of application No. 09/727,016, and a continuation-in-part of application No. 09/432,878, which is a continuation-in-part of application No. 09/353,428, application No. 10/036,957, which is a continuation-in-part of application No. 09/910,524, filed on Jul. 20, 2001, now abandoned, which is a continuation-in-part of application No. 09/801,437, and a continuation-in-part of application No. 09/802,329, and a continuation-in-part of application No. 09/798,541, and a continuation-in-part of application No. 09/785,892, said application No. 09/910,524, is a continuation-in-part of application No. 09/727,016, and a continuation-in-part of application No. 09/432,878, which is a continuation-in-part of application No. 09/353,428, application No. 10/036,957, which is a continuation-in-part of application No. 09/818,173, filed on Mar. 26, 2001, now abandoned, which is a continuation-in-part of application No. 09/801,437, and a continuation-in-part of application No. 09/802,329, and a continuation-in-part of application No. 09/798,541, which is a continuation-in-part of application No. 09/727,016, and a continuation-in-part of application No. 09/785,892, and a continuation-in-part of application No. 09/432,878, which is a continuation-in-part of application No. 09/353,428, said application No. 09/818,173, is a continuation-in-part of application No. 09/785,892, and a continuation-in-part of application No. 09/727,016, and a continuation-in-part of application No. 09/432,878, which is a continuation-in-part of application No. 09/353,428, application No. 10/036,957, which is a continuation-in-part of application No. 09/921,153, filed on Aug. 2, 2001, now Pat. No. 6,490,160, which is a continuation-in-part of application No. 09/921,152, filed on Aug. 2, 2001, now Pat. No. 6,609,914, and a continuation-in-part of application No. 09/910,524, and a continuation-in-part of application No. 09/801,437, and a continuation-in-part of application No. 09/802,329, and a continuation-in-part of application No. 09/798,541, which is a continuation-in-part of application No. 09/727,016, and a continuation-in-part of application No. 09/785,892, and a continuation-in-part of application No. 09/432,878, said application No. 09/921,153, is a continuation-in-part of application No. 09/785,892, which is a continuation-in-part of application No. 09/353,428, said application No. 09/921,153, is a continuation-in-part of application No. 09/727,016, and a continuation-in-part of application No. 09/432,878, which is a continuation-in-part of application No. 09/353,428, said application No. 10/036,957, is a continuation-in-part of application No. 09/921,152, which is a continuation-in-part of application No. 09/921,153, and a continuation-in-part of application No. 09/910,524, and a continuation-in-part of application No. 09/801,437, and a continuation-in-part of application No. 09/802,329, and a continuation-in-part of application No. 09/798,541, which is a continuation-in-part of application No. 09/727,016, and a continuation-in-part of application No. 09/785,892, and a continuation-in-part of application No. 09/432,878, which is a continuation-in-part of application No. 09/353,428, said application No. 09/921,152, is a continuation-in-part of application No. 09/785,892, and a continuation-in-part of application No. 09/727,016, and a continuation-in-part of application No. 09/432,878, which is a continuation-in-part of application No. 09/353,428.

U.S. PATENT DOCUMENTS

| | | |
|---|---|---|
| 3,854,374 A | 12/1974 | Boyle et al. |
| 4,358,503 A | 11/1982 | Homeyer |
| 4,446,173 A | 5/1984 | Barrell et al. |
| 4,498,530 A | 2/1985 | Lipschutz |
| 4,502,193 A | 3/1985 | Harmon et al. |
| 4,521,829 A | 6/1985 | Wessely |
| 4,589,057 A | 5/1986 | Short |
| 4,724,901 A | 2/1988 | Munekawa |
| 4,742,385 A | 5/1988 | Kohmoto |
| 4,760,495 A | 7/1988 | Till |
| 4,771,365 A | 9/1988 | Cichocki et al. |
| 4,793,814 A * | 12/1988 | Zifcak et al. ............... 439/66 |
| 4,875,140 A | 10/1989 | Delpech et al. |
| 4,942,497 A | 7/1990 | Mine et al. |
| 4,974,119 A | 11/1990 | Martin |
| 4,982,311 A | 1/1991 | Dehaine et al. |

| Patent No. | Date | Inventor |
|---|---|---|
| 5,052,481 A | 10/1991 | Horvath et al. |
| 5,065,280 A | 11/1991 | Karnezos et al. |
| 5,092,783 A | 3/1992 | Suarez et al. |
| 5,161,089 A | 11/1992 | Chu et al. |
| 5,173,055 A * | 12/1992 | Grabbe ........................ 439/66 |
| 5,194,480 A | 3/1993 | Block et al. |
| 5,195,020 A | 3/1993 | Suzuki et al. |
| 5,198,889 A | 3/1993 | Hisano et al. |
| 5,216,580 A | 6/1993 | Davidson et al. |
| 5,258,887 A | 11/1993 | Fortune |
| 5,272,599 A | 12/1993 | Koenen |
| 5,312,508 A | 5/1994 | Chisholm |
| 5,315,069 A | 5/1994 | Gebara |
| 5,331,510 A | 7/1994 | Ouchi et al. |
| 5,343,358 A | 8/1994 | Hilbrink |
| 5,345,366 A | 9/1994 | Cheng et al. |
| 5,355,282 A | 10/1994 | Yokemura et al. |
| 5,365,402 A | 11/1994 | Hatada et al. |
| 5,380,211 A | 1/1995 | Kawaguchi et al. |
| 5,386,143 A | 1/1995 | Fitch |
| 5,390,078 A | 2/1995 | Taylor |
| 5,396,403 A | 3/1995 | Patel |
| 5,409,055 A | 4/1995 | Tanaka et al. |
| 5,413,489 A | 5/1995 | Switky |
| 5,460,543 A | 10/1995 | Kosmala |
| 5,467,251 A | 11/1995 | Katchmar |
| 5,473,510 A | 12/1995 | Dozier, II |
| 5,504,924 A | 4/1996 | Ohashi et al. |
| 5,510,958 A | 4/1996 | Shimabara et al. |
| 5,515,241 A | 5/1996 | Werther |
| 5,515,912 A | 5/1996 | Daikoku et al. |
| 5,520,976 A | 5/1996 | Giannetti et al. |
| 5,544,017 A | 8/1996 | Beilin et al. |
| 5,545,473 A | 8/1996 | Ameen et al. |
| 5,586,011 A | 12/1996 | Alexander |
| 5,591,034 A | 1/1997 | Ameen et al. |
| 5,608,610 A | 3/1997 | Brzezinski |
| 5,617,300 A | 4/1997 | Anzawa et al. |
| 5,619,399 A | 4/1997 | Mok |
| 5,621,615 A | 4/1997 | Dawson et al. |
| 5,632,158 A | 5/1997 | Tajima |
| 5,646,826 A | 7/1997 | Katchmar |
| 5,647,430 A | 7/1997 | Tajima |
| 5,661,902 A | 9/1997 | Katchmar |
| 5,694,297 A | 12/1997 | Smith et al. |
| 5,704,416 A | 1/1998 | Larson et al. |
| 5,708,566 A | 1/1998 | Hunninghaus et al. |
| 5,721,454 A | 2/1998 | Palmer |
| 5,729,433 A | 3/1998 | Mok |
| 5,734,555 A | 3/1998 | McMahon |
| 5,738,936 A | 4/1998 | Hanrahan |
| 5,754,412 A | 5/1998 | Clavin |
| 5,761,043 A | 6/1998 | Salmonson |
| 5,770,891 A | 6/1998 | Frankeny et al. |
| 5,783,316 A | 7/1998 | Colella et al. |
| 5,786,075 A | 7/1998 | Mishuku et al. |
| 5,794,454 A | 8/1998 | Harris et al. |
| 5,796,582 A | 8/1998 | Katchmar |
| 5,800,905 A | 9/1998 | Sheridan et al. |
| 5,801,924 A | 9/1998 | Salmonson |
| 5,815,921 A | 10/1998 | Burward-Hoy |
| 5,825,630 A | 10/1998 | Taylor et al. |
| 5,825,633 A | 10/1998 | Bujalski et al. |
| 5,842,514 A | 12/1998 | Zapach et al. |
| 5,856,911 A | 1/1999 | Riley |
| 5,864,466 A | 1/1999 | Remsburg |
| 5,864,478 A | 1/1999 | McCutchan et al. |
| 5,898,573 A | 4/1999 | Fugaro |
| 5,904,796 A | 5/1999 | Freuler et al. |
| 5,905,638 A | 5/1999 | MacDonald, Jr. et al. |
| 5,920,458 A | 7/1999 | Azar |
| 5,930,115 A | 7/1999 | Tracy et al. |
| 5,945,217 A | 8/1999 | Hanrahan |
| 5,956,835 A | 9/1999 | Aksu |
| 5,966,294 A | 10/1999 | Harada et al. |
| 5,974,662 A | 11/1999 | Eldridge et al. |
| 5,980,267 A | 11/1999 | Ayers et al. |
| 5,981,869 A | 11/1999 | Kroger |
| 5,982,635 A | 11/1999 | Menzies et al. |
| 5,986,887 A | 11/1999 | Smith et al. |
| 5,995,370 A | 11/1999 | Nakamori |
| 6,014,313 A | 1/2000 | Hesselbom |
| 6,018,465 A | 1/2000 | Borkar et al. |
| 6,031,727 A | 2/2000 | Duesman et al. |
| 6,037,659 A | 3/2000 | Weixel |
| 6,062,302 A | 5/2000 | Davis et al. |
| 6,092,281 A | 7/2000 | Glenn |
| 6,096,414 A | 8/2000 | Young |
| 6,131,646 A | 10/2000 | Kelley |
| 6,137,693 A | 10/2000 | Schwiebert et al. |
| 6,157,544 A | 12/2000 | Ferling et al. |
| 6,191,475 B1 | 2/2001 | Skinner et al. |
| 6,191,945 B1 | 2/2001 | Belady et al. |
| 6,222,265 B1 | 4/2001 | Akram et al. |
| 6,225,566 B1 | 5/2001 | Dienst |
| 6,226,179 B1 | 5/2001 | Lee |
| 6,231,352 B1 | 5/2001 | Gonzales |
| 6,237,223 B1 | 5/2001 | McCullough |
| 6,262,887 B1 | 7/2001 | Lee |
| 6,265,672 B1 | 7/2001 | Eum et al. |
| 6,285,550 B1 | 9/2001 | Belady |
| 6,297,551 B1 | 10/2001 | Dudderar et al. |
| 6,304,450 B1 | 10/2001 | Dibene, II et al. |
| 6,338,634 B1 | 1/2002 | Yu |
| 6,347,042 B1 | 2/2002 | White |
| 6,347,044 B1 | 2/2002 | Won et al. |
| 6,351,392 B1 | 2/2002 | Palaniappa |
| 6,356,448 B1 | 3/2002 | DiBene, II et al. |
| 6,359,783 B1 | 3/2002 | Noble |
| 6,360,431 B1 | 3/2002 | Harrison et al. |
| 6,390,829 B1 | 5/2002 | Rademacher |
| 6,392,899 B1 | 5/2002 | Harrison et al. |
| 6,399,887 B1 | 6/2002 | Lin |
| 6,427,323 B2 * | 8/2002 | Appelt et al. .................. 29/830 |
| 6,493,233 B1 | 12/2002 | De Lorenzo et al. |
| 6,523,253 B1 | 2/2003 | Harrison et al. |
| 2002/0040811 A1 | 4/2002 | Harrison et al. |
| 2002/0042214 A1 | 4/2002 | Harrison et al. |
| 2002/0105791 A1 | 8/2002 | Harrison et al. |

FOREIGN PATENT DOCUMENTS

| | | |
|---|---|---|
| EP | 0 717 443 A1 | 7/1995 |
| EP | 0 910 235 A1 | 4/1999 |
| EP | 0 920 055 A2 | 6/1999 |
| FR | 2 722 334 A1 | 7/1994 |
| JP | 57066654 | 4/1982 |
| JP | 58175851 | 10/1983 |
| JP | 1174427 | 7/1989 |
| JP | 03041753 | 2/1991 |
| JP | 08204304 | 8/1996 |
| JP | 08330699 | 12/1996 |
| WO | WO 96/23397 | 8/1996 |
| WO | WO 01/06821 A1 | 1/2001 |
| WO | WO 01/33927 A1 | 5/2001 |
| WO | WO 01/65344 | 9/2001 |
| WO | WO 01/67512 | 9/2001 |

OTHER PUBLICATIONS

XP000124263, IBM Tech Disc Bulletin, "Multiple Electronic Board . . . System," 1994, 33(3B):55–56.

IBM Corp. Technical Disclosure Bulletin, "Pin Fin Array Heat Pipe Apparatus," Sep. 1994, vol. 37, No. 9, 1pp.

Samtec, "Board Interface Guide," Full Line Catalog F–202, Apr. 2002, 2pp.

\* cited by examiner

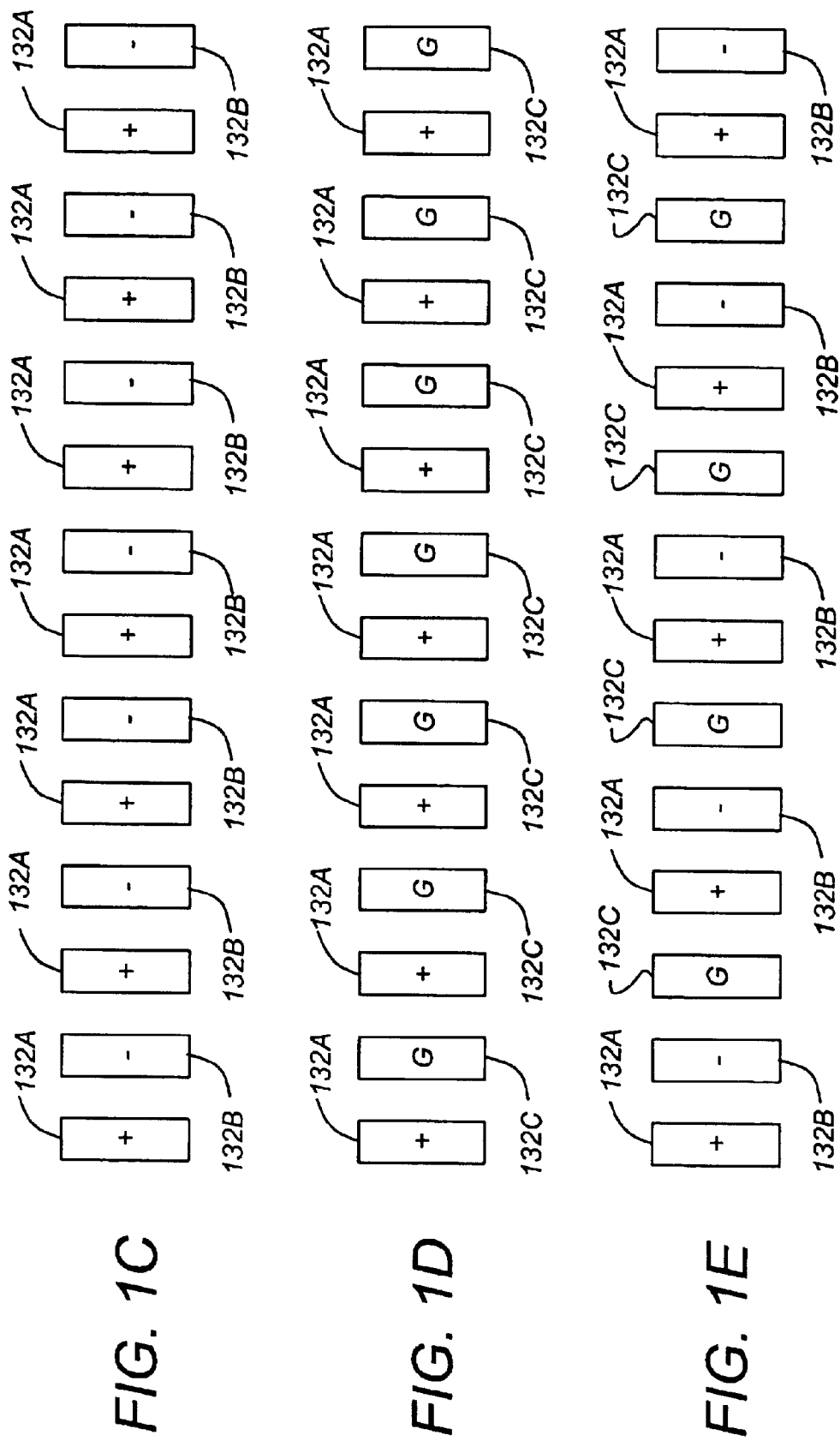

SECTION A-A

SECTION A-A

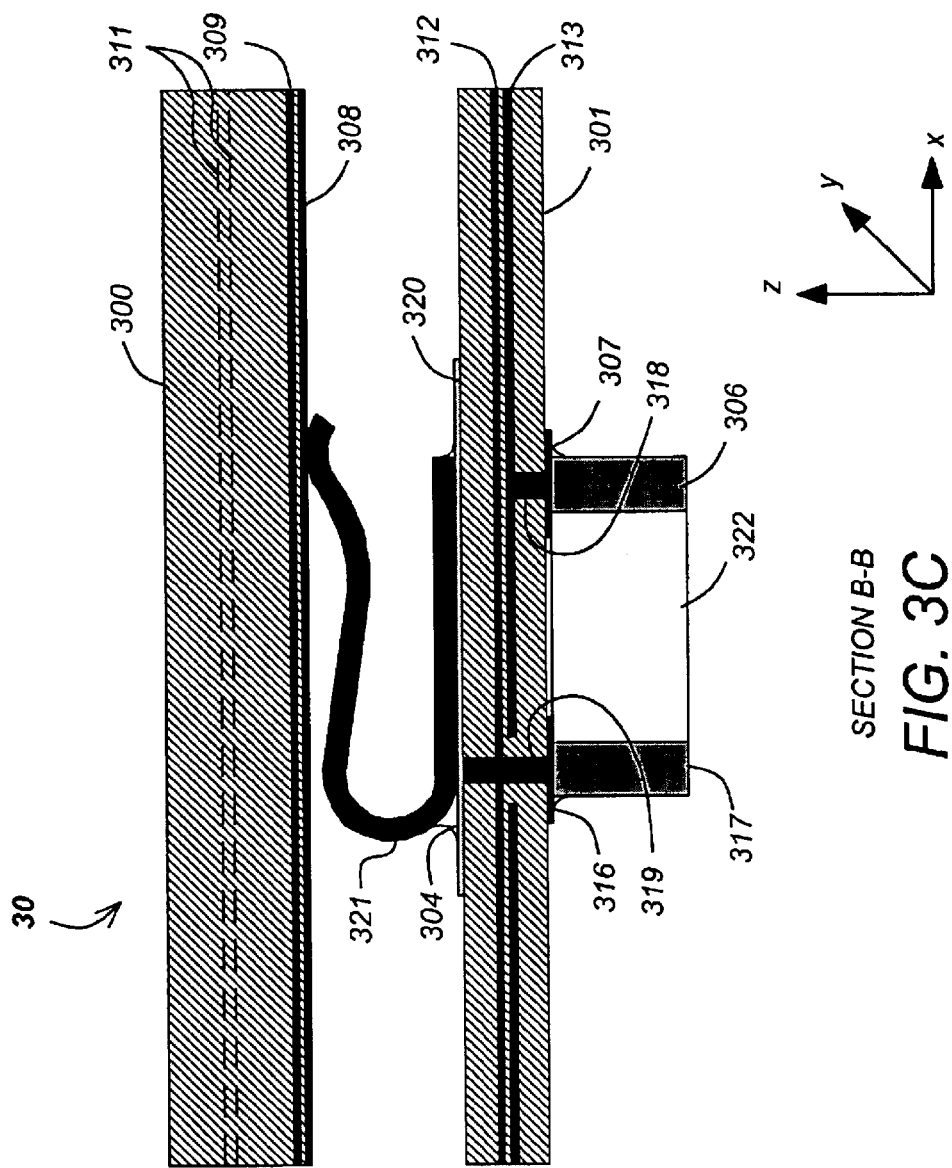

SECTION A-A

Section B-B

ULTRA-LOW IMPEDANCE POWER INTERCONNECTION SYSTEM FOR ELECTRONIC PACKAGES

CROSS-REFERENCE TO RELATED APPLICATIONS

This application claims benefit of the following provisional patent applications, which are hereby incorporated by reference herein.

Application Ser. No. 60/266,941, entitled "MECHANICAL INTERCONNECTION TECHNOLOGIES USING FLEX CABLE INTERCONNECT FOR POWER DELIVERY IN 'INCEP' INTEGRATED ARCHITECTURE," by Joseph T. DiBene II, David H. Hartke, and James M. Broder, filed Feb. 6, 2001;

Application Ser. No. 60/277,369, entitled "THERMAL-MECHANICICAL MEASUREMENT AND ANALYSIS OF ADVANCED THERMAL INTEREFACE MATERIAL CONSTRUCTION," by Joseph T. DiBene II, David H. Hartke an Farhad Raiszadeh, filed Mar. 19, 2001;

Application Ser. No. 60/287,860, entitled "POWER TRANSMISSION DEVICE," by Joseph T. DiBene II, David H. Hartke, Carl E. Hoge, and Edward J. Derian, filed May 1, 2001;

Application Ser. No. 60/291,749, entitled "MICRO I-PAK ARCHITECTURE HAVING A FLEXIBLE CONNECTOR BETWEEN A VOLTAGE REGULATION MODULE AND SUBSTRATE," by Joseph T. DiBene II, filed May 16, 2001;

Application Ser. No. 60/291,772, entitled "I-PAK ARCHITECTURE POWERING MULTIPLE DEVICES," by Joseph T. DiBene II, David H. Hartke, Carl E. Hoge, and Edward J. Derian, filed May 16, 2001;

Application Ser. No. 60/292,125, entitled "VORTEX HEATSINK FOR LOW PRESSURE DROP HIGH PERFORMANCE THERMAL MANAGEMENT ELECTRONIC ASSEMBLY SOLUTIONS," by Joseph T. DiBene II, Farhad Raiszadeh, filed May 18, 2001;

Application Ser. No. 60/299,573, entitled "IMPROVED MICRO-I-PAK STACK-UP ARCHITECTURE," by Joseph T. DiBene, Carl E. Hoge, and David H. Hartke, filed Jun. 19, 2001;

Application Ser. No. 60/301,753, entitled "INTEGRATED POWER DELIVERY USING HIGH PERFORMANCE LINEAR REGULATORS ON PACKAGE WITH A MICROPROCESSOR," by Joseph T. DiBene II, Carl E. Hoge, and David H. Hartke, filed Jun. 27, 2001;

Application Ser. No. 60/304,929, entitled "BORREGO ARCHITECTURE," by David H. Hartke and Joseph T. DiBene II, filed Jul. 11, 2001;

Application Ser. No. 60/304,930, entitled "MICRO-I-PAK," by Joseph T. DiBene II, Carl E. Hoge, David H. Hartke, and Edward J. Denan, filed Jul. 11, 2001;

Application Ser. No. 60/310,038, entitled "TOOL-LESS CONCEPTS FOR BORREGO," by Edward J. Derian and Joseph T. DiBene II, filed Aug. 3, 2001;

Application Ser. No. 60/313,338, entitled "TOOL-LESS PRISM IPA ASSEMBLY TO SUPPORT IA64 MCKINLEY MICROPROCESSOR," by David H. Hartke and Edward J. Derian, filed Aug. 17, 2001; and Application Ser. No. 60/338,004, entitled MICRO-SPRING CONFIGURATIONS FOR POWER DELIVERY FROM VOLTAGE REGULATOR MODULES TO INTEGRATED CIRCUITS AND MICROPROCESSORS, by Joseph T. DiBene II, David H. Hartke, Carl E. Hoge, and Edward J. Derian, filed Nov. 8, 2001.

This patent application is also continuation-in-part of the following co-pending and commonly assigned patent applications, each of which applications are hereby incorporated by reference herein:

Application Ser. No. 09/885,780, entitled "INTER-CIRCUIT ENCAPSULATED PACKAGING," by Joseph T. DiBene II and David H. Hartke, filed Jun. 19, 2001, now abandoned which is a continuation in-part of application Ser. No. 09/353,428, entitled "INTER-CIRCUIT ENCAPSULATED PACKAGING," by Joseph T. DiBene II and David H. Hartke, filed Jul. 15, 1999 and now issued as U.S. Pat. No. 6,304,450;

Application Ser. No. 09/432,878, entitled "INTER-CIRCUIT ENCAPSULATED PACKAGING FOR POWER DELIVERY," by Joseph T. DiBene II and David H. Hartke, filed Nov. 2, 1999, now U.S. Pat. No. 6,356,448, which is a continuation-in-part of application Ser. No. 09/353,428, entitled "INTER-CIRCUIT ENCAPSULATED PACKAGING," by Joseph T. DiBene II and David H. Hartke, filed Jul. 15, 1999 and now issued as U.S. Pat. No. 6,304,450;

Application Ser. No. 09/727,016, entitled "EMI CONTAINMENT USING INTER-CIRCUIT ENCAPSULATED PACKAGING TECHNOLOGY" by Joseph T. DiBene II and David Hartke, filed Nov. 28, 2000, now abandoned, which claims priority to the following U.S. Provisional Patent Applications:

Application Ser. No. 60/167,792, entitled "EMI CONTAINMENT USING INTER-CIRCUIT ENCAPSULATED PACKAGING TECHNOLOGY," by Joseph T. DiBene II and David H. Hartke, filed Nov. 29, 1999;

Application Ser. No. 60/171,065, entitled "INTER-CIRCUIT ENCAPSULATED PACKAGING TECHNOLOGY," by Joseph T. DiBene II and David H. Hartke, filed Dec. 16, 1999;

Application Ser. No. 60/183,474, entitled "DIRECT ATTACH POWER/THERMAL WITH INCEP," by Joseph T. DiBene II and David H. Hartke, filed Feb. 18, 2000;

Application Ser. No. 60/187,777, entitled "NEXT GENERATION PACKAGING FOR EMI CONTAINMENT, POWER DELIVERY, AND THERMAL DISSIPATION USING INTER-CIRCUIT ENCAPSULATED PACKAGING TECHNOLOGY," by Joseph T. DiBene II and David H. Hartke, filed Mar. 8, 2000;

Application Ser. No. 60/196,059, entitled "EMI FRAME WITH POWER FEED-THROUGH AND THERMAL INTERFACE MATERIAL IN AN AGGREGATE DIAMOND MIXTURE," by Joseph T. DiBene and David H. Hartke, filed Apr. 10, 2000;

Application Ser. No. 60/219,506, entitled "HIGH PERFORMANCE THERMAL MECHANICAL INTERFACE," by Wendell C. Johnson, David H. Hartke and Joseph T. DiBene II, flied Jul. 20, 2000;

Application Ser. No. 60/219,813, entitled "HIGH-CURRENT MICROPROCESSOR POWER DELIVERY SYSTEMS," by Joseph T. DiBene II, filed Jul. 21, 2000;

Application Ser. No. 60/222,386, entitled "HIGH DENSITY CIRCULAR 'PIN' CONNECTOR FOR HIGH SPEED SIGNAL INTERCONNENT," by David H. Hartke and Joseph T. DiBene II, filed Aug. 2, 2000;

Application Ser. No. 60/222,407, entitled "VAPOR HEAT SINK COMBINATION FOR HIGH EFFICIENCY THERMAL MANAGEMENT," by David H. Hartke and Joseph T. DiBene II, filed Aug. 2, 2000; and Application Ser. No. 60/232,971, entitled "INTEGRATED POWER DISTRIBUTION AND SEMICONDUCTOR PACKAGE," by Joseph T. DiBene II, James J. Hjerpe, , filed Sep. 14, 2000;

Application Ser. No. 09/785,892, entitled "METHOD AND APPARATUS FOR PROVIDING POWER TO A MICROPROCESSOR WITH INTEGRATED THERMAL AND EMI MANAGEMENT," by Joseph T. DiBene II, David H. Hartke, James J. Hjerpe Kaskade, and Carl E. Hoge, filed Feb. 16, 2001, now U.S. Pat. No. 6,452,113, which claims priority to the following Provisional Patent Applicaitons;

Application Ser. No. 60/183,474, entitled "DIRECT ATTACH POWER/THERMAL WITH INCEP," by Joseph T. DiBene II and David H. Hartke, filed Feb. 18, 2000;

Application Ser. No. 60/186,769, entitled "THERMACEP SPRING BEAM," by Joseph T. DiBene II and David H. Hartke, filed Mar. 3, 2000;

Application Ser. No. 60/187,777, entitled "NEXT GENERATION PACKAGING FOR EMI CONTAINMENT, POWER DELIVERY, AND THERMAL DISSIPATION USING INTER-CIRCUIT ENCAPSULATED PACKAGING TECHNOLOGY," by Joseph T. DiBene II and David H. Hartke, filed Mar. 8, 2000;

Application Ser. No. 60/196,059, entitled "EMI FRAME WITH POWER FEED-THROUGH AND THERMAL INTERFACE MATERIAL IN AN AGGREGATE DIAMOND MIXTURE," by Joseph T. DiBene and David H. Hartke, filed Apr. 10, 2000;

Application Ser. No. 60/219,506, entitled "HIGH PERFORMANCE THERMAL MECHANICAL INTERFACE," by Wendell C. Johnson, David H. Hartke and Joseph T. DiBene II, filed Jul. 20, 2000;

Application Ser. No. 60/219,813, entitled "HIGH-CURRENT MICROPROCESSOR POWER DELIVERY SYSTEMS," by Joseph T. DiBene II, filed Jul. 21, 2000;

Application Ser. No. 60/222,386, entitled "HIGH DENSITY CIRCULAR 'PIN' CONNECTOR FOR HIGH SPEED SIGNAL INTERCONNECT," by David H. Hartke and Joseph T. DiBene II, filed Aug. 2, 2000;

Application Ser. No. 60/222,407, entitled "VAPOR HEAT SINK COMBINATION FOR HIGH EFFICIENCY THERMAL MANAGEMENT," by David H. Hartke and Joseph T. DiBene II, filed Aug. 2, 2000; and Application Ser. No. 60/232,971, entitled "INTEGRATED POWER DISTRIBUTION AND SEMICONDUCTOR PACKAGE," by Josep T. DiBene II, James J. Hjerpe, , filed Sep. 14, 2000;

Application Ser. No. 60/251,222, entitled "INTEGRATED POWER DELIVERY WITH FLEX CIRCUIT INTERCONNECTION FOR HIGH DENSITY POWER CIRCUITS FOR INTEGRATED CIRCUITS AND SYSTEMS," by Joseph T. DiBene II and David H. Hartke, filed Dec. 4, 2000;

Application Ser. No. 60/251,223, entitled "MICRO I-PAK FOR POWER DELIVERY TO MICROELECTRONICS," by Joseph T. DiBene II a Carl E. Hoge, flied Dec. 4, 2000;

Application Ser. No. 60/251,184, entitled "MICROPROCESSOR INTEGRATED PACKAGING," by Joseph T. DiBene II, filed Dec. 4, 2000; and Application Ser. No. 60/266,941, entitled "MECHANICAL INTERCONNECTION TECHNOLOGIES USING FLEX CABLE INTERCONNECT FOR DELIVERY IN 'INCEP' INTEGRATED ARCHITECTURE," by David H. Hartke, James M. Broder, Joseph T. DiBene II, filed Feb. 6, 2001; and Application Ser. No. 09/798,541, entitled "THERMAL/MECHANIC SPRINGBEAM MECHANISM FOR HEAT TRANSFER FROM HEAT SOURCE TO HEAT DISSIPATING DEVICE," by Joseph T. DiBene II, David H. Hartke, Wendell C. Johnson, and Edward J. Derian, flIed Mar. 2, 2001, now abandoned, which is a continuation-in-part of application Ser. No. 09/727,016, entitled "EMI CONTAINMENT USING INTER-CIRCUIT ENCAPSULATED PACKAGING TECHNOLOGY," by Joseph T. DiBene II and David H. Hartke, filed Nov. 28, 2000, now abandoned, and a continuation-in-part of application Ser. No. 09/785,892, entitled "METHOD AND APPARATUS FOR PROVIDING POWER TO A MICROPROCESSOR WITH INTEGRATED THERMAL AND EMI MANAGEMENT," by Joseph T. DiBene II and David H. Hartke, filed Feb. 16, 2001, now U.S. Pat. No. 6,452,113, and a continuation in part of application Ser. No. 09/432,878, entitled "INTER-CIRCUIT ENCAPSULATED PACKAGING FOR POWER DELIVERY", by Joseph T. DiBene II and David H. Hartke, filed Nov. 2, 1999, now U.S. Pat. No. 6,356,448, which is a continuation in part of application Ser. No. 09/353,428, entitled "INTER-CIRCUIT ENCAPSULATED PACKAGING," by Joseph T. DiBene II and David H. Hartke, filed Jul. 15, 1999 and now issued as U.S. Pat. No. 6,304,450, and which claims priority to the following U.S. Provisional Patent Applications:

Application Ser. No. 60/183,474, entitled "DIRECT ATTACH POWER/THERMAL WITH INCEP," by Joseph T. DiBene II and David H. Hartke, filed Feb. 18, 2000;

Application Ser. No. 60/186,769, entitled "THERMACEP SPRING BEAM," by Joseph T. DiBene II and David H. Hartke, filed Mar. 3, 2000;

Application Ser. No. 60/187,777, entitled "NEXT GENERATION PACKAGING FOR EMI CONTAINMENT, POWER DELIVERY, AND THERMAL DISSIPATION USING INTER-CIRCUIT ENCAPSULATED PACKAGING TECHNOLOGY," by Joseph T. DiBene II and David H. Hartke, filed Mar. 8, 2000;

Application Ser. No. 60/196,059, entitled "EMI FRAME WITH POWER FEED-THROUGH AND THERMAL INTERFACE MATERIAL IN AN AGGREGATE DIAMOND MIXTURE," by Joseph T. DiBene and David H. Hartke, filed Apr. 10, 2000;

Application Ser. No. 60/219,506, entitled "HIGH PERFORMANCE THERMAL MECHANICAL INTERFACE," by Wendell C. Johnson, David H. Hartke and Joseph T. DiBene II, filed Jul. 20, 2000;

Application Ser. No. 60/219,813, entitled "HIGH-CURRENT MICROPROCESSOR POWER DELIVERY SYSTEMS," by Joseph T. DiBene II, filed Jul. 21, 2000;

Application Ser. No. 60/222,386, entitled "HIGH DENSITY CIRCULAR 'PIN' CONNECTOR FOR HIGH SPEED SIGNAL INTERCONNECT," by David H. Hartke and Joseph T. DiBene II, filed Aug. 2, 2000;

Application Ser. No. 60/222,407, entitled "VAPOR HEATSINK COMBINATION FOR HIGH EFFICIENCY THERMAL MANAGEMENT," by David H. Hartke and Joseph T. DiBene II, filed Aug. 2, 2000; and Application Ser. No. 60/232,971, entitled "INTEGRATED POWER DISTRIBUTION AND SEMICONDUCTOR PACKAGE," by Joseph T. DiBene II, James J. Hjerpe, filed Sep. 14, 2000;

Application Ser. No. 60/251,222, entitled "INTEGRATED POWER DELIVERY WITH FLEX CIRCUIT INTERCONNECTION FOR HIGH DENSITY POWER CIRCUITS FOR INTEGRATED CIRCUITS SYSTEMS," by Joseph T. DiBene II and David H. Hartke, filed Dec. 4, 2000;

Application Ser. No. 60/251,223, entitled "MICRO I-PAK FOR POWER DELIVERY TO MICROELECTRONICS," by Joseph T. DiBene II and Carl E. Hoge, filed Dec. 4, 2000;

Application Ser. No. 60/251,184, entitled "MICROPROCESSOR INTEGRATED PACKAGING," by Joseph T. DiBene II, filed Dec. 4, 2000; and Application Ser. No. 60/266,941, entitled "MECHANICAL INTERCONNECTION TECHNOLOGIES USING FLEX CABLE INTERCONNECT FOR POWER DELIVERY IN 'INCEP' INTEGRATED ARCHITECTURE," by David H. Hartke, James M. Broder, Joseph T. DiBene II, filed Feb. 6, 2001; and Application Ser. No. 09/801,437, entitled "METHOD AND APPARATUS FOR DELIVERING POWER TO HIGH PERFORMANCE ELECTRONIC ASSEMBLIES" by Joseph T. DiBene II, David H. Hartke, Carl E. Hoge, James M. Border, Edward J. Derian, Joseph S. Riel, and Jose B. San Andres, filed Mar. 8, 2001, now U.S. Pat. No. 6,618,268, which is a continuation in part of the following patent applications:

Application Ser. No. 09/798,541, entitled "THERMAL/MECHANICAL SPRINGBEAM MECHANISM FOR HEAT TRANSFER FROM HEAT SOURCE TO HEAT DISSIPATING DEVICE," by Joseph T. DiBene II, David H. Hartke, Wendell C. Johnson, and Edward J. Derian, filed Mar. 2, 2001, now abandoned;

Application Ser. No. 09/785,892, entitled "METHOD AND APPARATUS FOR PROVIDING POWER TO A MICROPROCESSOR WITH INTEGRATED THERMAL AND EMI MANAGEMENT," by Joseph T. DiBene II, David H. Hartke James J. Hjerpe Kaskade, and Carl E. Hoge, filed Feb. 16, 2000, now U.S. Pat. No. 6,452,113;

Application Ser. No. 09/727,016, entitled "EMI CONTAINMENT USING INTER-CIRCUIT ENCAPSULATED PACKAGING TECHNOLOGY" by Joseph T. DiBene II and David Hartke, filed Nov. 28, 2000, now abandoned;

Application Ser. No. 09/432,878, entitled "INTER-CIRCUIT ENCAPSULATED PACKAGING FOR POWER DELIVERY," by Joseph T. DiBene II and David H. Hartke, filed Nov. 2, 1999, now U.S. Pat. No. 6,356,448, which is a contiuation-in-part of application Ser. No. 09/353,428, entitled "INTER-CIRCUIT ENCAPSULATED PACKAGING," by Joseph T. DiBene II and David H. Hartke, fried Jul. 15, 1999 and now issued as U.S. Pat. No. 6,304,450; and which claims priority to the following U.S. Provisional Patent Applications:

Application Ser. No. 60/187,777, entitled "NEXT GENERATION PACKAGING FOR EMI CONTAINMENT POWER DELIVERY, AND THERMAL DISSIPATION USING INTER-CIRCUIT ENCAPSULATED PACKAGING TECHNOLOGY," by Joseph T. DiBene II and David H. Hartke, filed Mar. 8, 2000;

Application Ser. No. 60/196,059, entitled "EMI FRAME WITH POWER FEED-THROUGH AND THERMAL INTERFACE MATERIAL IN AN AGGREGATE DIAMOND MIXTURE," by Joseph T. DiBene and David H. Hartke, filed Apr. 10, 2000;

Application Ser. No. 60/219,813, entitled "HIGH-CURRENT MICROPROCESSOR POWER DELIVERY SYSTEMS," by Joseph T. DiBene II, filed Jul. 21, 2000;

Application Ser. No. 60/222,386, entitled "HIGH DENSITY CIRCULAR 'PIN' CONNECTOR FOR HIGH SPEED SIGNAL INTERCONNECT," by David H. Hartke and Joseph T. DiBene II, filed Aug. 2, 2000;

Application Ser. No. 60/222,407, entitled "VAPOR HEATSINK COMBINATION FOR HIGH EFFICIENCY THERMAL MANAGEMENT," by David H. Hartke and Joseph T. DiBene II, filed Aug. 2, 2000; and Application Ser. No. 60/232,971, entitled "INTEGRATED POWER DISTRIBUTION AND SEMICONDUCTOR PACKAGE," by Joseph H. DiBene II, James J. Hjerpe, filed Sep. 14, 2000;

Application Ser. No. 60/251,222, entitled "INTEGRATED POWER DELIVERY WITH FLEX CIRCUIT INTERCONNECTION FOR HIGH DENSITY POWER CIRCUITS FOR INTEGRATED CIRCUITS AND SYSTEMS," by Joseph T. DiBene II and David H. Hartke, filed Dec. 4, 2000;

Application Ser. No. 60/251,223, entitled "MICRO I-PAK FOR POWER DELIVERY TO MICROELECTRONICS," by Joseph T. DiBene II and Carl E. Hoge, filed Dec. 4, 2000;

Application Ser. No. 60/251,184, entitled "MICROPROCESSOR INTEGRATED PACKAGING," by Joseph T. DiBene II, filed Dec. 4, 2000; and Application Ser. No. 60/266,941, entitled "MECHANICAL INTERCONNECTION TECHNOLOGIES USING FLEX CABLE INTERCONNECT FOR POWER DELIVERY IN 'INCEP' INTEGRATED ARCHITECTURE," by David H. Hartke, James M. Broder, Joseph T. DiBene II, filed Feb. 6, 2001; and Application Ser. No. 09/802,329, entitled "METHOD AND APPARATUS FOR THERMAL AND MECHANICAL MANAGEMENT OF A POWER REGULATOR MODULE AND MICROPROCESSOR IN CONTACT WITH A THERMALLY CONDUCTING PLATE" by Joseph T. DiBene II and David H. Hartke, filed Mar. 8, 2001, now U.S. Pat. No. 6,452,804, which is a continuation in part of the following patent applications:

Application Ser. No. 09/798,541, entitled "THERMAL/MECHANICAL SPRINGBEAM MECHANISM FOR HEAT TRANSFER FROM HEAT SOURCE TO HEAT DISSIPATING DEVICE," by Joseph T. DiBene II, David H. Hartke, Wendell C. Johnson, and Edward J. Derian, filed Mar. 2, 2001, now abandoned, which is a continuation-in-part of application Ser. No. 09/727,016, entitled "EMI CONTAINMENT USING INTER-CIRCUIT ENCAPSULATED PACKAGING TECHNOLOGY," by Joseph T. DiBene II and David H. Hartke, filed Nov. 28, 2000, now abandoned, and a continuation-in-part of application Ser. No. 09/785,892, entitled "METHOD AND APPARATUS FOR PROVIDING POWER TO A MICROPROCESSOR WITH INTEGRATED THERMAL AND EMI MANAGEMENT," by Joseph T. DiBene II and David H. Hartke, filed Feb. 16, 2001, now U.S. Pat. No. 6,452,113 and a continuation in part of application Ser. No. 09/432,878, entitled "INTER-CIRCUIT ENCAPSULATED PACKAGING FOR POWER DELIVERY", by Joseph T. DiBene II and David H. Hartke, filed Nov. 2, 1999, now U.S. Pat. No. 6,356,448, which is a continuation in part of application Ser. No. 09/353,428, entitled "INTER-CIRCUIT ENCAPSULATED PACKAGING," by Joseph T. DiBene II and David H. Hartke, filed Jul. 15, 1999 and now issued as U.S. Pat. No. 6,304,450;

Application Ser. No. 09/785,892, entitled "METHOD AND APPARATUS FOR PROVIDING POWER TO A MICROPROCESSOR WITH INTEGRATED THERMAL AND EMI MANAGEMENT," by Joseph T. DiBene II, David H. Hartke, James J. Hjerpe Kaskade, and Carl E. Hoge, filed Feb. 16, 2001, now U.S. Pat. No. 6,452,113;

Application Ser. No. 09/727,016, entitled "EMI CONTAINMENT USING INTER-CIRCUIT ENCAPSULATED PACKAGING TECHNOLOGY" by Joseph T. DiBene II and David Hartke, filed Nov. 28, 2000, now abandoned;

Application Ser. No. 09/432,878, entitled "INTER-CIRCUIT ENCAPSULATED PACKAGING FOR POWER DELIVERY," by Joseph T. DiBene II and David H. Hartke, filed Nov. 2, 1999, now U.S. Pat. No. 6,356,448, which is a contiuation-in-part of application Ser. No. 09/353,428, entitled "INTER-CIRCUIT ENCAPSULATED PACKAGING," by Joseph T. DiBene II and David H. Hartke, filed Jul. 15, 1999 and now issued as U.S. Pat. No. 6,304,450, and which claims priority to the following U.S. Provisional Patent Applications:

Application Ser. No. 60/187,777, entitled "NEXT GENERATION PACKAGING FOR EMI CONTAINMENT, POWER DELIVERY, AND THERMAL DISSIPATION USING INTER-CIRCUIT ENCAPSULATED PACKAGING TECHNOLOGY," by Joseph T. DiBene II and David Hartke, filed Mar. 8, 2000;

Application Ser. No. 60/196,059, entitled "EMI FRAME WITH POWER FEED-THROUGH AND THERMAL INTERFACE MATERIAL IN AN AGGREGATE DIAMOND MIXTURE," by Joseph T. DiBene and David H. Hartke, filed Apr. 10, 2000;

Application Ser. No. 60/219,813, entitled "HIGH-CURRENT MICROPROCESSOR POWER DELIVERY SYSTEMS," by Joseph T. DiBene II, filed Jul. 21, 2000;

Application Ser. No. 60/222,386, entitled "HIGH DENSITY CIRCULAR 'PIN' CONNECTOR FOR HIGH SPEED SIGNAL INTERCONNECT," by David H. Hartke and Joseph T. DiBene II, filed Aug. 2, 2000;

Application Ser. No. 60/222,407, entitled "VAPOR HEAT-SINK COMBINATION FOR HIGH EFFICIENCY THERMAL MANAGEMENT," by David H. Hartke and Joseph T. DiBene II, filed Aug. 2, 2000; and Application Ser. No. 60/232,971, entitled "INTEGRATED POWER DISTRIBUTION AND SEMICONDUCTOR PACKAGE," by Joseph T. DiBene II, James J. Hjerpe, filed Sep. 14, 2000;

Application Ser. No. 60/251,222, entitled "INTEGRATED POWER DELIVERY WITH FLEX CIRCUIT INTERCONNECTION FOR HIGH DENSITY POWER CIRCUITS FOR INTEGRATED CIRCUITS AND SYSTEMS," by Joseph T. DiBene II and David H. Hartke, filed Dec. 4, 2000;

Application Ser. No. 60/251,223, entitled "MICRO I-PAK FOR POWER DELIVERY TO MICROELECTRONICS," by Joseph T. DiBene II and Carl E. Hoge, filed Dec. 4, 2000;

Application Ser. No. 60/251,184, entitled "MICROPROCESSOR INTEGRATED PACKAGING," by Joseph T. DiBene II, filed Dec. 4, 2000; and Application Ser. No. 60/266,941, entitled "MECHANICAL INTERCONNECTION TECHNOLOGIES USING FLEX CABLE INTERCONNECT FOR POWER DELIVERY IN 'INCEP' INTEGRATED ARCHITECTURE," by David H. Hartke, James M. Broder, Joseph T. DiBene II, filed Feb. 6, 2001; and Application Ser. No. 09/910,524, entitled "HIGH PERFORMANCE THERMAL/MECHANICAL INTERFACE FOR FIXED-GAP REFERENCES FOR HIGH HEAT FLUX AND POWER SEMICONDUCTOR APPLICATIONS", by Joseph T. DiBene, II, David H. Hartke, Wendell C. Johnson, Farhad Raiszadeh, Edward J. Darien and Jose B. San Andres, filed Jul. 20, 2001, now abandoned, which is a continuation in part of the following patent applications:

Application Ser. No. 09/801,437, entitled "METHOD AND APPARATUS FOR DELIVERING POWER TO HIGH PERFORMANCE ELECTRONIC ASSEMBLIES" by Joseph T. DiBene II, David H. Hartke, Carl E. Hoge, James M. Broder, Edward J. Derian, Joseph S. Riel, and Jose B. San Andres, filed Mar. 8, 2000, now U.S. Pat. No. 6,618,268;

Application Ser. No. 09/802,329, entitled "METHOD AND APPARATUS FOR THERMAL AND MECHANICAL MANAGEMENT OF A POWER REGULATOR MODULE AND MICROPROCESSOR IN CONTACT WITH A THERMALLY CONDUCTING PLATE" by Joseph T. DiBene II and David H. Hartke, filed Mar. 8, 2000, now U.S. Pat. No. 6,452,804;

Application Ser. No. 09/798,541, entitled "THERMAL/MECHANICAL SPRINGBEAM MECHANISM FOR HEAT TRANSFER FROM HEAT SOURCE TO HEAT DISSIPATING DEVICE," by Joseph T. DiBene II, David H. Hartke, Wendell C. Johnson, and Edward J. Derian, filed Mar. 2, 2001, now abandoned;

Application Ser. No. 09/785,892, entitled "METHOD AND APPARATUS FOR PROVIDING POWER TO A MICROPROCESSOR WITH INTEGRATED THERMAL AND EMI MANAGEMENT," by Josep T. DiBene II, David H Hartke, James J. Hjerpe Kaskade, and Carl E. Hoge, filed Feb. 16, 2001, now U.S. Pat. No. 6,452,113;

Application Ser. No. 09/727,016, entitled "EMI CONTAINMENT USING INTER-CIRCUIT ENCAPSULATED PACKAGING TECHNOLOGY" by Joseph T. DiBene II and David Hartke, filed Nov. 28, 2000, now abandoned, which claims priority to the following U.S. Provisional Patent Applications;

Application Ser. No. 09/432,878, entitled "INTER-CIRCUIT ENCAPSULATED PACKAGING FOR POWER DELIVERY" Joseph T. DiBene II and David H. Hartke, filed Nov. 2, 1999, now U.S. Pat. No. 6,356,448, which is a continuation-in-part of application Ser. No. 09/353,428, entitled "INTER-CIRCUIT ENCAPSULATED PACKAGING," by Joseph T. DiBene II and David H. Hartke, filed Jul. 15, 1999 and now issued as U.S. Pat. No. 6,304,450, and which claims priority to the following U.S. Provisional Patent Applications:

Application Ser. No. 60/187,777, entitled "NEXT GENERATION PACKAGING FOR EMI CONTAINMENT, POWER DELIVERY, AND THERMAL DISSIPATION USING INTER-CIRCUIT ENCAPSULATED PACKAGING TECHNOLOGY," by Joseph T. DiBene II and David H. Hartke, filed Mar. 8, 2000;

Application Ser. No. 60/219,506, entitled "HIGH PERFORMANCE THERMAL MECHANICAL INTERFACE," by Wendell C. Johnson, David H. Hartke and Joseph T. DiBene II, filed Jul. 20, 2000;

Application Ser. No. 60/219,813, entitled "HIGH-CURRENT MICROPROCESSOR POWER DELIVERY SYSTEMS," by Joseph T. DiBene II, filed Jul. 21, 2000;

Application Ser. No. 60/222,386, entitled "HIGH DENSITY CIRCULAR 'PIN' CONNECTOR FOR HIGH SPEED SIGNAL INTERCONNECT," by David H. Hartke and Joseph T. DiBene II, filed Aug. 2, 2000;

Application Ser. No. 60/222,407, entitled "VAPOR HEATSINK COMBINATION FOR HIGH EFFICIENCY THERMAL MANAGEMENT," by David H. Hartke and Joseph T. DiBene II, filed Aug. 2, 2000; and Application Ser. No. 60/232,971, entitled "INTEGRATED POWER DISTRIBUTION AND SEMICONDUCTOR PACKAGE," by Joseph T. DiBene II, James J. Hjerpe, filed Sep. 14, 2000;

Application Ser. No. 60/251,222, entitled "INTEGRATED POWER DELIVERY WITH FLEX CIRCUIT INTERCONNECTION FOR HIGH DENSITY POWER CIRCUITS FOR INTEGRATED CIRCUITS AND SYSTEMS," by Joseph T. DiBene II and David H. Hartke, filed Dec. 4, 2000;

Application Ser. No. 60/251,223, entitled "MICRO I-PAK FOR POWER DELIVERY TO MICROELECTRONICS," by Joseph T. DiBene II an Carl E. Hoge, filed Dec. 4, 2000;

Application Ser. No. 60/251,184, entitled "MICROPROCESSOR INTEGRATED PACKAGING," by Joseph T. DiBene II, filed Dec. 4, 2000; and Application Ser. No. 60/266,941, entitled "MECHANICAL INTERCONNECTION TECHNOLOGIES USING FLEX CABLE INTERCONNECT FOR POWER DELIVERY IN 'INCEP' INTEGRATED ARCHITECTURE," by David H. Hartke, James M. Broder, Joseph T. DiBene II, filed Feb. 6, 2001; and Application Ser. No. 60/277,369, entitled "THERMAL-MECHANICAL MEASUREMENT AND ANALYSIS OF AN ADVANCED THERMAL INTERFACE MATERIAL CONSTRUCTION," by Farhad Raiszadeh and Edward J. Derian, filed Mar. 19, 2001;

Application Ser. No. 60/287,860, entitled "POWER TRANSMISSION DEVICE," by Joseph T. DiBene II, David H. Hartke, Carl E. Hoge, an Edward J. Derian, filed May 1, 2001;

Application Ser. No. 60/291,749, entitled "MICRO I-PAK ARCHITECTURE HAVING A FLEXIBLE CONNECTOR BETWEEN A VOLTAGE REGULATION MODULE AND SUBSTRATE," by Joseph T. DiBene II, filed May 16, 2001;

Application Ser. No. 60/291,772, entitled "I-PAK ARCHITECTURE POWERING MULTIPLE DEVICES," by Joseph T. DiBene II, David H. Hartke, Carl E. Hoge, and Edward J. Derian, filed May 16, 2001;

Application Ser. No. 60/292,125, entitled "VORTEX HEAT SINK FOR LOW PRESSURE DROP HIGH PERFORMANCE THERMAL MANAGEMENT ELECTRONIC ASSEMBLY SOLUTIONS," by Joseph T. DiBene II and Farhad Raiszadeh, filed May 18, 2001;

Application Ser. No. 60/299,573, entitled "MICRO I-PAK STACK UP ARCHITECTURE," by Joseph T. DiBene II, Carl B. Hoge, and David H. Hartke, filed Jun. 19, 2001;

Application Ser. No. 60/301,753, entitled "INTEGRATED POWER DELIVERY USING HIGH PERFORMANCE LINEAR REGULATORS ON PACKAGE WITH A MICROPROCESSOR," by Joseph T. DiBene II, Carl E. Hoge, and David H. Hartke, filed Jun. 27, 2001;

Application Ser. No. 60/304,929, entitled "BORREGO ARCHITECTURE," by David H. Hartke and Joseph T. DiBene II, filed Jul. 11, 2001;

Application Ser. No. 60/304,930, entitled "MICRO I-PAK," by Joseph T. DiBene II, Carl B. Hoge, David H. Hartke, Edward J. Derian, filed Jul. 11, 2001;

Application Ser. No. 09/818,173, entitled "INTER-CIRCUIT ENCAPSULATED PACKAGING," by David H. Hartke and Joseph T. DiBene II, filed Mar. 26, 2001, now abandoned, which is a continuation in part of the following patent applications:

Application Ser. No. 09/801,437, entitled "METHOD AND APPARATUS FOR DELIVERING POWER TO HIGH PERFORMANCE ELECTRONIC ASSEMBLIES" by Joseph T. DiBene II, David H. Hartke, Carl E. Hoge, James M. Broder, Edward J. Derian, Joseph S. Riel, and Jose B. San Andres, filed Mar. 8, 2001, now U.S. Pat. No. 6,618,268;

Application Ser. No. 09/802,329, entitled "METHOD AND APPARATUS FOR THERMAL AND MECHANICAL MANAGEMENT OF A POWER REGULATOR MODULE AND MICROPROCESSOR IN CONTACT WITH A THERMALLY CONDUCTING PLATE" by Joseph T. DiBene II and David H. Hartke, filed Mar. 8, 2001, now U.S. Pat. No. 6,452,804;

Application Ser. No. 09/798,541, entitled "THERMAL/MECHANICAL SPRINGBEAM MECHANISM FOR HEAT TRANSFER FROM HEAT SOURCE TO HEAT DISSIPATING DEVICE," by Joseph T. DiBene II, David H. Hartke, Wendell C. Johnson, and Edward J. Derian, filed Mar. 2, 2001, now abandoned, which is a continuation-in-part of application Ser. No. 09/727,016, entitled "EMI CONTAINMENT USING INTER-CIRCUIT ENCAPSULATED PACKAGING TECHNOLOGY" by Joseph T. DiBene II and David H. Hartke, filed Nov. 28, 2000, now abandoned, and a continuation-in-part of application Ser. No. 09/785,892, entitled "METHOD AND APPARATUS FOR PROVIDING POWER TO A MICROPROCESSOR WITH INTEGRATED THERMAL AND EMI MANAGEMENT," by Joseph T. DiBene II and David H. Hartke, filed Feb. 16, 2001, now U.S. Pat. No. 6,452,113, and a continuation in part of application Ser. No. 09/432,878, entitled "INTER-CIRCUIT ENCAPSULATED PACKAGING FOR POWER DELIVERY" by Joseph T. DiBene II and David H. Hartke, filed Nov. 2, 1999, now U.S. Pat. No. 6,356,448, which is a continuation in part of application Ser. No. 09/353,428, entitled "INTER-CIRCUIT ENCAPSULATED PACKAGING," by Joseph T. DiBene II and David H. Hartke, filed Jul. 15, 1999 and now issued as U.S. Patent No. 6,304,450;

Application Ser. No. 09/785,892, entited "METHOD AND APPARATUS FOR PROVIDING POWER TO A MICROPROCESSOR WITH INTEGRATED THERMAL AND EMI MANAGEMENT," by Joseph T. DiBene II, David H. Hartke, James J. Hjerpe Kaskade, and Carl E. Hoge, filed Feb. 16, 2001, now U.S. Pat. No. 6,452,113;

Application Ser. No. 09/727,016, entitled "EMI CONTAIMENT USING INTER-CIRCUIT ENCAPSULATED PACKAGING TECHNOLOGY" by Joseph T. DiBene II and David Hartke, filed Nov. 28, 2000, now abandoned;

Application Ser. No. 09/432,878, entitled "INTER-CIRCUIT ENCAPSULATED PACKAGING FOR POWER DELIVERY" by Joseph T. DiBene II and David H. Hartke, filed Nov. 2, 1999, now U.S. Pat. No. 6,356,448, which is a continuation-in-part of application Ser. No. 09/353,428, entitled "INTER-CIRCUIT ENCAPSULATED PACKAGING," by Joseph T. DiBene II and David H. Hartke, filed Jul. 15, 1999 and now issued as U.S. Pat. No. 6,304,450, and which claims priority to the following U.S. Provisional Patent Applications:

Application Ser. No. 60/187,777, entitled "NEXT GENERATION PACKAGING FOR EMI CONTAINMENT, POWER DELIVERY, AND THERMAL DISSIPATION USING INTER-CIRCUIT ENCAPSULATED PACKAGING TECHNOLOGY," by Joseph T. DiBene II and David H. Hartke, filed Mar. 8, 2000;

Application Ser. No. 60/196,059, entitled "EMI FRAME WITH POWER FEED-THROUGH AND THERMAL INTERFACE MATERIAL IN AN AGGREGATE DIAMOND MIXTURE," by Joseph T. DiBene and David H. Hartke, filed Apr. 10, 2000;

Application Ser. No. 60/219,813, entitled "HIGH-CURRENT MICROPROCESSOR POWER DELIVERY SYSTEMS," by Joseph T. DiBene II, filed Jul. 21, 2000;

Application Ser. No. 60/222,386, entitled "HIGH DENSITY CIRCULAR 'PIN' CONNECTOR FOR HIGH SPEED SIGNAL INTERCONNECT," by David H. Hartke and Joseph T. DiBene II, filed Aug. 2, 2000;

Application Ser. No. 60/222,407, entitled "VAPOR HEATSINK COMBINATION FOR HIGH EFFICIENCY THERMAL MANAGEMENT," by David H. Hartke and Joseph T. DiBene II, filed Aug. 2, 2000; and Application Ser. No. 60/232,971, entitled "INTEGRATED POWER DISTRIBUTION AND SEMICONDUCTOR PACKAGE," by Joseph T. DiBene II, James J. Hjerpe, filed Sep. 14, 2000;

Application Ser. No. 60/251,222, entitled "INTEGRATED POWER DELIVERY WITH FLEX CIRCUIT INTERCONNECTION FOR HIGH DENSITY POWER CIRCUITS FOR INTEGRATED CIRCUITS AND SYSTEMS," by Joseph T. DiBene II and David H. Hartke, filed Dec. 4, 2000;

Application Ser. No. 60/251,223, entitled "MICRO I-PAK FOR POWER DELIVERY TO MICROELECTRONICS," by Joseph T. DiBene II and Carl E. Hoge, filed Dec. 4, 2000;

Application Ser. No. 60/251,184, entitled "MICROPROCESSOR INTEGRATED PACKAGING," by Joseph T. DiBene II, filed Dec. 4, 2000; and Application Ser. No. 60/266,941, entitled "MECHANICAL INTERCONNECTION TECHNOLOGIES USING FLEX CABLE INTERCONNECT FOR POWER DELIVERY IN 'INCEP' INTEGRATED ARCHITECTURE," by David H. Hartke, James M. Broder, Joseph T. DiBene II, filed Feb. 6, 2001; and Application Ser. No. 60/277,369, entitled "THERMAL-MECHANICAL MEASUREMENT AND ANALYSIS OF AN ADVANCED THERMAL INTERFACE MATERIAL CONSTRUCTION," by Farhad Raiszadeh and Edward J. Derian, filed Mar. 19, 2001;

Application Ser. No. 60/287,860, entitled "POWER TRANSMISSION DEVICE," by Joseph T. DiBene II, David H. Hartke, Carl E. Hoge, and Edward J. Derian, filed May 1, 2001;

Application Ser. No. 60/291,749, entitled "MICRO I-PAK ARCHITECTURE HAVING A FLEXIBLE CONNECTOR BETWEEN A VOLTAGE REGULATION MODULE AND A SUBSTRATE," by Joseph T. DiBene II, filed May 16, 2001;

Application Ser. No. 60/291,772, entitled "I-PAK ARCHITECTURE POWERING MULTIPLE DEVICES," by Joseph T. DiBene II, David H. Hartke, Carl E. Hoge, and Edward J. Derian, filed May 16, 2001;

Application Ser. No. 60/292,125, entitled "VORTEX HEATSINK FOR LOW PRESSURE DROP HIGH PERFORMANCE THERMAL MANAGEMENT ELECTRONIC ASSEMBLY SOLUTIONS," by Joseph T. DiBene II and Farhad Raiszadeh, filed May 18, 2001;

Application Ser. No. 60/299,573, entitled "MICRO I-PAK STACK UP ARCHITECTURE," by Joseph T. DiBene II, Carl E. Hoge, and David H. Hartke,, filed Jun. 19, 2001;

Application Ser. No. 60/301,753, entitled "INTEGRATED POWER DELIVERY USING HIGH PERFORMANCE UNEAR REGULATORS ON PACKAGE WITH A MICROPROCESSOR," by Joseph T. DiBene II, Carl E. Hoge, and David H. Hartke, filed Jun. 27, 2001;

Application Ser. No. 60/304,929, entitled "BORREGO ARCHITECTURE," by David H. Haztke and Joseph T. DiBene II, filed Jul. 11, 2001;

Application Ser. No. 60/304,930, entitled "MICRO I-PAK," by Joseph T. DiBene II, Carl E. Hoge, David H. Hartke, Edward J. Derian, filed Jul. 11, 2001;

Application Ser. No. 09/921,153 entitled "VAPOR CHAMBER WITH INTEGRATED PIN ARRAY", by Joseph T. DiBene, II and Farhad Raiszadeh, filed on Aug. 2, 2001, now U.S. Pat. No. 6,490,160, which is a continuation in part of the following patent applications:

Application Ser. No. 09/921,152, entitled "HIGH SPEED HIGH DENSITY CIRCULAR CONNECTOR FOR BOARD-TO-BOARD INTERCONNECT SYSTEM," by David H. Hartke and Joseph T. DiBene II, filed Aug. 2, 2001, now U.S. Pat. No. 6,609,914;

Application Ser. No. 09/910,524, entitled "HIGH PERFORMANCE THERMAL/MECHANICAL INTERFACE FOR FIXED-GAP REFERENCES FOR HIGH HEAT FLUX AND POWER SEMICONDUCTOR APPLICATIONS", by Joseph T. DiBene, II, David H. Hartke, Wendell C. Johnson, Farhad Raiszadeh, Edward J. Darien and Jose B. San Andres, filed Jul. 20, 2001, now abandoned;

Application Ser. No. 09/801,437, entitled "METHOD AND APPARATUS FOR DELIVERING POWER TO HIGH PERFORMANCE ELECTRONIC ASSEMBLIES" by Joseph T. DiBene II, David H. Hartke, Carl E. Hoge, James M. Broder, Derian, Joseph S. Riel, and Jose B. San Andres, filed Mar. 8, 2001, now U.S. Pat. No. 6,618,268;

Application Ser. No. 09/802,329, entitled "METHOD AND APPARATUS FOR THERMAL AND MECHANICAL MANAGEMENT OF A POWER REGULATOR MODULE AND MICROPROCESSOR IN CONTACT WITH A THERMALLY CONDUCTING PLATE" by Joseph T. DiBene II and David H. Hartke, filed Mar. 8, 2001, now U.S. Pat. No. 6,452,804;

Application Ser. No. 09/798,541, entitled "THERMAL/MECHANICAL SPRINGBEAM MECHANISM FOR HEAT TRANSFER FROM HEAT SOURCE TO HEAT DISSIPATING DEVICE," by Joseph T. DiBene II, David H. Hartke, Wendell C. Johnson, and Edward J. Derian, filed Mar. 2, 2001, now abandoned, which is a continuation-in-part of application Ser. No. 09/727,016, entitled "EMI CONTAINMENT USING INTER-CIRCUIT ENCAPSULATED PACKAGING TECHNOLOGY" by T. DiBene II and David H. Hartke, filed Nov. 28, 2000, now abandoned, and a continuation-in-part of application Ser. No. 09/785,892, entitled "METHOD AND APPARATUS FOR PROVIDING POWER TO A MICROPROCESSOR WITH INTEGRATED THERMAL AND EMI MANAGEMENT" by Joseph T. DiBene II and David H. Hartke, filed Feb. 16, 2001, now U.S. Pat. No. 6,452,113, and a continuation in part of application Ser. No. 09/432,878, entitled "INTER-CIRCUIT ENCAPSULATED PACKAGING FOR POWER DELIVERY", by Joseph T. DiBene II and David H. Hartke, filed Nov. 2, 1999, now U.S. Pat. No. 6,356,448, which is a continuation in part of application Ser. No. 09/353,428, entitled "INTER-CIRCUIT ENCAPSULATED PACKAGING," by Joseph T. DiBene II and David H. Hartke, filed Jul. 15, 1999 and now issued as U.S. Pat. No. 6,304,450;

Application Ser. No. 09/785,892, entitled "METHOD AND APPARATUS FOR PROVIDING POWER TO A MICROPROCESS WITH INTEGRATED THERMAL AND EMI MANAGEMENT," by Joseph T. DiBene II, David H. Hartke, James J. Hjerpe Kaskade, and Carl E. Hoge, filed Feb. 16, 2001, now U.S. Pat. No. 6,452,113;

Application Ser. No. 09/727,016, entitled "EMI CONTAINMENT USING INTER-CIRCUIT ENCAPSULATED PACKAGING TECHNOLOGY" by Joseph T. DiBene II and David Hartke, filed Nov. 28, 2000, now abandoned;

Application Ser. No. 09/432,878, entitled "INTER-CIRCUIT ENCAPSULATED PACKAGING FOR POWER DELIVERY" by Joseph T. DiBene II and David H. Hartke, filed Nov. 2, 1999, now U.S. Pat. No. 6,356,448, which is a continuation-in-part of application Ser. No. 09/353,428, entitled "INTER-CIRCUIT ENCAPSULATED PACKAGING," by Joseph T. DiBene II and David H. Hartke, filed Jul. 15, 1999 and now issued as U.S. Pat. No. 6,304,450, and which claims priority to the following U.S. Provisional Patent Applications:

Application Ser. No. 60/187,777, entitled "NEXT GENERATION PACKAGING FOR EMI CONTAINMENT, POWER DELIVERY, AND THERMAL DISSIPATION USING INTER-CIRCUIT ENCAPSULATED PACKAGING TECHNOLOGY," by Joseph T. DiBene II and David Hartke, filed Mar. 8, 2000;

Application Ser. No. 60/196,059, entitled "EMI FRAME POWER FEED-THROUGH AND THERMAL INTERFACE MATERIAL IN AN AGGREGATE DIAMOND MIXTURE," by Joseph T. DiBene and David H. Hartke, filed Apr. 10, 2000;

Application Ser. No. 60/219,813, entitled "HIGH-CURRENT MICROPROCESSOR POWER DELIVERY SYSTEMS," by Joseph T. DiBene II, filed Jul. 21, 2000;

Application Ser. No. 60/222,386, entitled "HIGH DENSITY CIRCULAR 'PIN' CONNECTOR FOR HIGH SPEED SIGNAL INTERCONNECT," by David H. Hartke and Joseph T. DiBene II, filed Aug. 2, 2000;

Application Ser. No. 60/222,407, entitled "VAPOR HEAT-SINK COMBINATION FOR HIGH EFFICIENCY THERMAL MANAGEMENT," by David H. Hartke and Joseph T. DiBene II, filed Aug. 2, 2000; and Application Ser. No. 60/232,971, entitled "INTEGRATED POWER DISTRIBUTION AND SEMICONDUCTOR PACKAGE," by Joseph T. DiBene II, James J. Hjerpe, filed Sep. 14, 2000;

Application Ser. No. 60/251,222, entitled "INTEGRATED POWER DELIVERY WITH FLEX CIRCUIT INTERCONNECTION FOR HIGH DENSITY POWER CIRCUITS FOR INTEGRATED CIRCUITS AND SYSTEMS," by Joseph T. DiBene II and David H. Hartke, filed Dec. 4, 2000;

Application Ser. No. 60/251,223, entitled "MICRO I-PAK FOR POWER DELIVERY TO MICROELECTRONICS," by Joseph T. DiBene II an Carl E. Hoge, filed Dec. 4, 2000;

Application Ser. No. 60/251,184, entitled "MICROPROCESSOR INTEGRATED PACKAGING," by Joseph T. DiBene II, filed Dec. 4, 2000; and Application Ser. No. 60/266,941, entitled "MECHANICAL INTERCONNECTION TECHNOLOGIES USING FLEX CABLE INTERCONNECT FOR POWER DELIVERY IN 'INCEP' INTEGRATED ARCHITECTURE," by David H. Hartke, James M. Broder, Joseph T. DiBene II, filed Feb. 6, 2001; and Application Ser. No. 60/277,369, entitled "THERMAL-MECHANICAL MEASUREMENT AND ANALYSIS OF AN ADVANCED THERMAL INTERFACE MATERIAL CONSTRUCTION," by Farhad Raiszadeh and Edward J. Derian, filed Mar. 19, 2001;

Application Ser. No. 60/287,860, entitled "POWER TRANSMISSION DEVICE," by Joseph T. DiBene II, David H. Hartke, Carl E. Hoge, and Edward J. Derian, filed May 1, 2001;

Application Ser. No. 60/291,749, entitled "MICRO I-PAK ARCHITECTURE HAVING A FLEXIBLE CONNECTOR BETWEEN A VOLTAGE REGULATION MODULE AND SUBSTRATE," by Joseph T. DiBene II, filed May 16, 2001;

Application Ser. No. 60/291,772, entitled "I-PAK ARCHITECTURE POWERING MULTIPLE DEVICES," by Joseph T. DiBene II, David H. Hartke, Carl E. Hoge, and Edward J. Derian, filed May 16, 2001;

Application Ser. No. 60/292,125, entitled "VORTEX HEAT SINK FOR LOW PRESSURE DROP HIGH PERFORMANCE THERMAL MANAGEMENT ELECTRONIC ASSEMBLY SOLUTIONS," by Joseph T. DiBene II and Farbad Raiszadeh, filed May 18, 2001;

Application Ser. No. 60/299,573, entitled "MICRO I-PAK STACK UP ARCHITECTURE," by Joseph T. DiBene II, Carl E. Hoge, and David H. Hartke, filed Jun. 19, 2001;

Application Ser. No. 60/301,753, entitled "INTEGRATED POWER DELIVERY USING HIGH PERFORMANCE LINEAR REGULATORS ON PACKAGE WITH A MICROPROCESSOR," by Joseph T. DiBene II, Carl E. Hoge, and David H. Hartke, filed Jun. 27, 2001;

Application Ser. No. 60/304,929, entitled "BORREGO ARCHITECTURE," by David H. Hartke and Joseph T. DiBene II, filed Jul. 11, 2001;

Application Ser. No. 60/304,930, entitled "MICRO I-PAK," by Joseph T. DiBene II, Carl E. Hoge, David H. Hartke, Edward J. Derian, filed Jul. 1, 2001;

Application Ser. No. 09/921,152, entitled "HIGH SPEED AND DENSITY CIRCULAR CONNECTOR FOR BOARD-TO-BOARD INTERCONNECTION SYSTEMS," by David H. Hartke and Joseph T. DiBene II, filed on Aug. 2, 2001, now U.S. Pat. No. 6,609,914, which is a continuation in part of the following patent applications:

Application Ser. No. 09/921,153 entitled "VAPOR CHAMBER WITH INTEGRATED PIN ARRAY", by Joseph T. DiBene, II and Farhad Raiszadeh, filed on Aug. 2, 2001, now U.S. Pat. No. 6,490,160;

Application Ser. No. 09/910,524, entitled "HIGH PERFORMANCE THERMAL/MECHANICAL INTERFACE FOR FIXED-GAP REFERENCES FOR HIGH HEAT FLUX AND POWER SEMICONDUCTOR APPLICATIONS", by Joseph T. DiBene, II, David H. Hartke, Wendell C. Johnson, Farhad Raiszadeh, Edward J. Darien and Jose B. San Andres, filed Jul. 20, 2001, now abandoned;

Application Ser. No. 09/801,437, entitled "METHOD AND APPARATUS FOR DELIVERING POWER TO HIGH PERFORMANCE ELECTRONIC ASSEMBLIES" by Joseph T. DiBene II, David H. Hartke, Carl E. Hoge, James M. Broder, Edward J. Derian Joseph S. Riel, and Jose B. San Andres, filed Mar. 8, 2001, now U.S. Pat. No. 6,618,268;

Application Ser. No. 09/802,329, entitled "METHOD AND APPARATUS FOR THERMAL AND MECHANICAL MANAGEMENT OF A POWER REGULATOR MODULE AND MICROPROCESSOR IN CONTACT WITH A THERMALLY CONDUCTING PLATE" by Joseph T. DiBene II and David H. Hartke, filed Mar. 8, 2001, now U.S. Pat. No. 6,452,804;

Application Ser. No. 09/798,541, entitled "THERMAL/MECHANICAL SPRINGBEAM MECHANISM FOR HEAT TRANSFER FROM HEAT SOURCE TO HEAT DISSIPATING DEVICE," by Joseph T. DiBene II, David H. Hartke, Wendell C. Johnson, and Edward J. Derian, filed Mar. 2, 2001, now abandoned, which is a continuation-in-part of application Ser. No. 09/727,016, entitled "EMI CONTAINMENT USING INTER-CIRCUIT ENCAPSULATED PACKAGING TECHNOLOGY" by Joseph T. DiBene II and David H. Hartke, filed Nov. 28, 2000, now abandoned, and a continuation-in-part of application Ser. No. 09/785,892, entitled "METHOD AND APPARATUS FOR PROVIDING POWER TO A MICROPROCESSOR WITH INTEGRATED THERMAL AND EMI MANAGEMENT," Joseph T. DiBene II and David H. Hartke, filed Feb. 16, 2001, now U.S. Pat. No. 6,452,113, and a continuation in part of application Ser. No. 09/432,878, entitled "INTER-CIRCUIT ENCAPSULATED PACKAGING FOR POWER DELIVEIRY", by Joseph T. DiBene II and David H. Hartke, filed Nov. 2, 1999, now U.S. Pat. No. 6,356,448, which is a continuation in part of application Ser. No. 09/353,428, entitled "INTER-CIRCUIT ENCAPSULATED PACKAGING," by Joseph T. DiBene II and David H. Hartke, filed Jul. 15, 1999 and now issued as U.S. Pat. No. 6,304,450;

Application Ser. No. 09/785,892, entitled "METHOD AND APPARATUS FOR PROVIDING POWER TO A MICROPROCESSOR WITH INTEGRATED THERMAL AND EMI MANAGEMENT," by Joseph T. DiBene II, David H, Hartke, James J. Hjerpe Kaskade, and Carl E. Hoge, filed Feb. 16, 2001, now U.S. Pat. No. 6,452,113;

Application Ser. No. 09/727,016, entitled "EMI CONTAINMENT USING INTER-CIRCUIT ENCAPSULATED PACKAGING TECHNOLOGY" by Joseph T. DiBene II and David Hartke, filed Nov. 28, 2000, now abandoned;

Application Ser. No. 09/432,878, entitled "INTER-CIRCUIT ENCAPSULATED PACKAGING FOR POWER DELIVERY," by Joseph T. DiBene II and David H. Hartke, filed Nov. 2, 1999, now U.S. Pat. No. 6,356,448, which is a continuation-in-part of application Ser. No. 09/353,428, entitled "INTER-CIRCUIT ENCAPSULATED PACKAGING," by Joseph T. DiBene II and David H. Hartke, filed Jul. 15, 1999 and now issued as U.S. Pat. No. 6,304,450; and which claims priority to the following U.S. Provisional Patent Applications:

Application Ser. No. 60/187,777, entitled "NEXT GENERATION PACKAGING FOR EMI CONTAINMENT, POWER DELIVERY, AND THERMAL DISSIPATION USING INTER-CIRCUIT ENCAPSULATED PACKAGING TECHNOLOGY," by Joseph T. DiBene II and David H. Hartke, filed Mar. 8, 2000;

Application Ser. No. 60/196,059, entitled "EMI FRAME POWER FEED-THROUGH AND THERMAL INTERFACE MATERIAL IN AN AGGREGATE DIAMOND MIXTURE," by Joseph T. DiBene and David H. Hartke, filed Apr. 10, 2000;

Application Ser. No. 60/219,813, entitled "HIGH-CURRENT MICROPROCESSOR POWER DELIVERY SYSTEMS," by Joseph T. DiBene II, filed Jul. 21, 2000;

Application Ser. No. 60/222,386, entitled "HIGH DENSITY CIRCULAR 'PIN' CONNECTOR FOR HIGH SPEED SIGNAL INTERCONNECT," by David H. Hartke and Joseph T. DiBene II, filed Aug. 2, 2000;

Application Ser. No. 60/222,407, entitled "VAPOR HEATSINK COMBINATION FOR HIGH EFFICIENCY THERMAL MANAGEMENT," by David H. Hartke and Joseph T. DiBene II, filed Aug. 2, 2000; and Application Ser. No. 60/232,971, entitled "INTEGRATED POWER DISTRIBUTION AND SEMICONDUCTOR PACKAGE," by Joseph T. DiBene II, James J. Hjerpe, filed Sep. 14, 2000;

Application Ser. No. 60/251,222, entitled "INTEGRATED POWER DELIVERY WITH FLEX CIRCUIT INTERCONNECTION FOR HIGH DENSITY POWER CIRCUITS FOR INTEGRATED CIRCUITS AND SYSTEMS," by Joseph T. DiBene II and David H. Hartke, filed Dec. 4, 2000;

Application Ser. No. 60/251,223, entitled "MICRO I-PAK FOR POWER DELIVERY TO MICROELECTRONICS," by Joseph T. DiBene II and Carl E. Hoge, filed Dec. 4, 2000;

Application Ser. No. 60/251,184, entitled "MICROPROCESSOR INTEGRATED PACKAGING," by Joseph T. DiBene II, filed Dec. 4, 2000; and Application Ser. No. 60/266,941, entitled "MECHANICAL INTERCONNECTION TECHNOLOGIES USING FLEX CABLE INTERCONNECT FOR POWER DELIVERY IN 'INCEP' INTEGRATED ARCHITECTURE," by David H. Hartke, James M. Broder, Joseph T. DiBene II, filed Feb. 6, 2001; and Application Ser. No. 60/277,369, entitled "THERMAL-MECHANICAL MEASUREMENT AND ANALYSIS OF AN ADVANCED THERMAL INTERFACE MATERIAL CONSTRUCTION," by Farhad Raiszadeh and Edward J. Derian, filed Mar. 19, 2001;

Application Ser. No. 60/287,860, entitled "POWER TRANSMISSION DEVICE," by Joseph T. DiBene II, David H. Hartke, Carl E. Hoge, and Edward J. Derian, filed May 1, 2001;

Application Ser. No. 60/291,749, entitled "MICRO I-PAK ARCHITECTURE HAVING A FLEXIBLE CONNECTOR BETWEEN A VOLTAGE REGULATION MODULE AND SUBSTRATE," by Joseph T. DiBene II, filed May 16, 2001;

Application Ser. No. 60/291,772, entitled "I-PAK ARCHITECTURE POWERING MULTIPLE DEVICES," by Joseph T. DiBene II, David H. Hartke, Carl E. Hoge, and Edward J. Derian, filed May 16, 2001;

Application Ser. No. 60/292,125, entitled "VORTEX HEAT SINK FOR LOW PRESSURE DROP HIGH PERFORMANCE THERMAL MANAGEMENT ELECTRONIC ASSEMBLY SOLUTIONS," by Joseph T. DiBene II and Farhad Raiszadeh, filed May 18, 2001;

Application Ser. No. 60/299,573, entitled "MICRO I-PAK STACK UP ARCHITECTURE," by Joseph T. DiBene II, Carl E. Hoge, and David H. Hartke, filed Jun. 19, 2001;

Application Ser. No. 60/301,753, entitled "INTEGRATED POWER DELIVERY USING HIGH PERFORMANCE UNBAR REGULATORS ON PACKAGE WITH A MICROPROCESSOR," by Joseph T. DiBene II, Carl E. Hoge, and David H. Hartke, filed Jun. 27, 2001;

Application Ser. No. 60/304,929, entitled "BORREGO ARCHITECTURE," by David H. Hartke and Joseph T. DiBene II, filed Jul. 11, 2001;

Application Ser. No. 60/304,930, entitled "MICRO I-PAK," by Joseph T. DiBene II, Carl E. Hoge, David H. Hartke, Edward J. Derian, filed Jul. 1, 2001; and Application Ser. No. 10/022,454, entitled "ULTRA LOW IMPEDANCE POWER INTERCONNECTION SYSTEM FOR ELECTRONIC PACKAGING," by Joseph T. DiBene II, David H. Hartke, Carl E. Hoge, and Edward J. Derian, filed Oct. 30, 2001, and now issued as U.S. Pat. No. 6,556,455, which is a continuation in part of the following U.S. Patent Application:

Application Ser. No. 09/818,173, entitled "INTER-CIRCUIT ENCAPSULATED PACKAGING," by Joseph T. DiBene, II and David H. Hartke, filed Mar. 26, 2001;

Application Ser. No. 09/921,152, entitled "HIGH SPEED AND DENSITY CIRCULAR CONNECTOR FOR BOARD-TO-BOARD INTERCONNECTION SYSTEMS," by David H. Hartke and Joseph T. DiBene II, filed on Aug. 2, 2001;

Application Ser. No. 09/921,153 entitled "VAPOR CHAMBER WITH INTEGRATED PIN ARRAY", by Joseph T. DiBene, II and Farhad Raiszadeh, filed on Aug. 2, 2001;

Application Ser. No. 09/910,524, entitled "HIGH PERFORMANCE THERMAL/MECHANICAL INTERFACE FOR FIXED-GAP REFERENCES FOR HIGH HEAT FLUX AND POWER SEMICONDUCTOR APPLICATIONS", by Joseph T. DiBene, II, David H. Hartke, Wendell C. Johnson, Farhad Raiszadeh, Edward J. Darien and Jose B. San Andres, filed Jul. 20, 2001;

Application Ser. No. 09/885,780, entitled "INTER-CIRCUIT ENCAPSULATED PACKAGING," by Joseph T. DiBene II and David H. Hartke, filed Jun. 19, 2001, which is a continuation of application Ser. No. 09/353,428, entitled "INTER-CIRCUIT ENCAPSULATED PACKAGING," by Joseph T. DiBene II and David H. Hartke, filed Jul. 15, 1999 and now issued as U.S. Pat. No. 6,304,450;

Application Ser. No. 09/801,437, entitled "METHOD AND APPARATUS FOR DELIVERING POWER TO HIGH PERFORMANCE ELECTRONIC ASSEMBLIES" by Joseph T. DiBene II, David H. Hartke, Carl E. Hoge, James M. Broder, Edward J. Denan, Joseph S. Riel, and Jose B. San Andres, filed Mar. 8, 2001;

Application Ser. No. 09/802,329, entitled "METHOD AND APPARATUS FOR THERMAL AND MECHANICAL MANAGEMENT OF A POWER REGULATOR MODULE AND MICROPROCESSOR IN CONTACT WITH A THERMALLY CONDUCTING PLATE," by Joseph T. DiBene II and David H. Hartke, filed Mar. 8, 2001;

Application Ser. No. 09/798,541, entitled "THERMAL/MECHANICAL SPRINGBEAM MECHANISM FOR HEAT TRANSFER FROM HEAT SOURCE TO HEAT DISSIPATING DEVICE," by Joseph T. DiBene II, David H. Hartke, Wendell C. Johnson, and Edward J. Derian, filed Mar. 2, 2001, which is a continuation-in-part of application Ser. No. 09/727,016, entitled "EMI CONTAINMENT USING INTER-CIRCUIT ENCAPSULATED PACKAGING TECHNOLOGY," by Joseph T. DiBene II and David H. Hartke, filed Nov. 28, 2000, and a continuation-in-part of application Ser. No. 09/785,892, entitled "METHOD AND APPARATUS FOR PROVIDING POWER TO A MICROPROCESSOR WITH INTEGRATED THERMAL AND EMI MANAGEMENT," by Joseph T. DiBene II and David H. Hartke, filed Feb. 16, 2001, and a continuation in part of application Ser. No. 09/432,878, entitled "INTER-CIRCUIT ENCAPSULATED PACKAGING FOR POWER DELIVERY", by Joseph T. DiBene II and David H. Hartke, filed Nov. 2, 1999, which is a continuation in part of application Ser. No. 09/353,428, entitled "INTER-CIRCUIT ENCAPSULATED PACKAGING," by Joseph T. DiBene II and David H. Hartke, filed Jul. 15, 1999 and now issued as U.S. Pat. No. 6,304,450;

Application Ser. No. 09/785,892, entitled "METHOD AND APPARATUS FOR PROVIDING POWER TO A MICROPROCESSOR WITH INTEGRATED THERMAL AND EMI MANAGEMENT," by Joseph T. DiBene II, David H. Harrke, James J. Hjerpe Kaskade, and Carl E. Hog, filed Feb. 16, 2001;

Application Ser. No. 09/727,016, entitled "EMI CONTAINMENT USING INTER-CIRCUIT ENCAPSULATED PACKAGING TECHNOLOGY" by Joseph T. DiBene II and David Hartke, filed Nov. 28, 2000;

Application Ser. No. 09/432,878, entitled "INTER-CIRCUIT ENCAPSULATED PACKAGING FOR POWER DELIVERY," by Joseph T. DiBene II and David H. Hartke, filed Nov. 2, 1999, which is a continuation-in-part of application Ser. No. 09/353,428, entitled "INTER-CIRCUIT ENCAPSULATED PACKAGING," by Joseph T. DiBene II and David H. Hartke, filed Jul. 15, 1999 and now issued as U.S. Pat. No. 6,304,450; and which claims priority to the following U.S. Provisional Patent Applications:

Application Ser. No. 60/187,777, entitled "NEXT GENERATION PACKAGING FOR EMI CONTAINMENT, POWER DELIVERY, AND THERMAL DISSIPATION USING INTER-CIRCUIT ENCAPSULA AND PACKAGING TECHNOLOGY," by Joseph T. DiBene II and David H. Hartke, filed Mar. 8, 2000;

Application Ser. No. 60/196,059, entitled "EMI FRAME WITH POWER FEED-THROUGH AND THERMAL INTERFACE MATERIAL IN AN AGGREGATE DIAMOND MIXTURE," by Joseph T. DiBene and David H. Harrke, filed Apr. 10, 2000;

Application Ser. No. 60/219,813, entitled "HIGH-CURRENT MICROPROCESSOR POWER DELIVERY SYSTEMS," by Joseph T. DiBene II, filed Jul. 21, 2000;

Application Ser. No. 60/222,386, entitled "HIGH DENSITY CIRCULAR 'PIN' CONNECTOR FOR HIGH SPEED SIGNAL INTERCONNECT," by David H. Hartke and Joseph T. DiBene II, filed Aug. 2, 2000;

Application Ser. No. 60/222,407, entitled "VAPOR HEATSINK COMBINATION FOR HIGH EFFICIENCY THERMAL MANAGEMENT," by David H. Hartke and Joseph T. DiBene II, filed Aug. 2, 2000; and Application Ser. No. 60/232,971, entitled "INTEGRATED POWER DISTRIBUTION AND SEMICONDUCTOR PACKAGE," by Joseph T. DiBene II, James J. Hjerpe, filed Sep. 14, 2000;

Application Ser. No. 60/251,222, entitled "INTEGRATED POWER DELIVERY WITH FLEX CIRCUIT INTERCONNECTION FOR HIGH DENSITY POWER CIRCUITS FOR INTEGRATED CIRCUITS AND SYSTEMS," by Joseph T. DiBene II and David H. Hartke, filed Dec. 4, 2000;

Application Ser. No. 60/251,223, entitled "MICRO I-PAK FOR POWER DELIVERY TO MICROELECTRONICS," by Joseph T. DiBene II and Carl E. Hoge, filed Dec. 4, 2000;

Application Ser. No. 60/251,134, entitled "MICROPROCESSOR INTEGRATED PACKAGING," by Joseph T. DiBene II, filed Dec. 4, 2000; and Application Ser. No. 60/266,941, entitled "MECHANICAL INTERCONNECTION TECHNOLOGIES USING FLEX CABLE INTERCONNECT FOR DELIVERY IN 'INCEP' INTEGRATED ARCHITECTURE," by David H. Hartke, James M. Broder, Joseph T. DiBene II, filed Feb. 6, 2001; and Application Ser. No. 60/277,369, entitled "THERMAL-MECHANICAL MEASUREMENT AND ANALYSIS OF ADVANCED THERMAL INTERFACE MATERIAL CONSTRUCTION," by Farhad Raiszadeh and Edward J. Derian, filed Mar. 19, 2001;

Application Ser. No. 60/287,860, entitled "POWER TRANSMISSION DEVICE," by Joseph T. DiBene II, David H. Hartke, Carl B. Hoge, and Edward J. Derian, filed May 1, 2001;

Application Ser. No. 60/291,749, entitled "MICRO I-PAK ARCHITECTURE HAVING A FLEXIBLE CONNECTOR BETWEEN A VOLTAGE REGULATION MODULE AND SUBSTRATE," by Joseph T. DiBene II, filed May 16, 2001;

Application Ser. No. 60/291,772, entitled "I-PAK ARCHITECTURE POWERING MULTIPLE DEVICES," by Joseph T. DiBene II, David Hartke, Carl E. Hoge, and Edward J. Derian, filed May 16, 2001;

Application Ser. No. 60/292,125, entitled "VORTEX HEATSINK FOR LOW PRESSURE DROP HIGH PERFORMANCE THERMAL MANAGEMENT ELECTRONIC ASSEMBLY SOLUTIONS," by Joseph T. DiBene II and Farhad Raiszadeh, filed May 18, 2001;

Application Ser. No. 60/299,573, entitled "MICRO I-PAK STACK UP ARCHITECTURE," by Joseph T. DiBene II, Carl E. Hoge, and David H. Hartke, filed Jun. 19, 2001;

Application Ser. No. 60/301,753, entitled "INTEGRATED POWER DELIVERY USING HIGH PERFORMANCE LINEAR REGULATORS ON PACKAGE WITH A MICROPROCESSOR," by Joseph T. DiBene II, Carl E. Hoge, and David H. Hartke, filed Jun. 27, 2001;

Application Ser. No. 60/304,929, entitled "BORREGO ARCHITECTURE," by David H. Hartke and Joseph T. DiBene II, filed Jul. 11, 2001;

Application Ser. No. 60/304,930, entitled "MICRO I-PAK," by Joseph T. Diflene II, Carl E. Hoge, David H. Hartke, Edward J. Derian, filed Jul. 1, 2001; and Application Ser. No. 60/310,038, entitled "TOOL-LESS CONCEPTS FOR BORREGO," by Edward J. Derian and Joseph T. DiBene II, filed Aug. 3, 2001;

Application Ser. No. 60/313,338, entitled "TOOL-LESS PRISM IPA ASSEMBLY TO SUPPORT IA64 MCKINLEY MICROPROCESSOR," by David H. Hartke and Edward J. Derian, filed Aug. 17, 2001;

Application Ser. No. 60/338,004, entitled "MICRO-SPRING CONFIGURATIONS FOR POWER DELIVERY FROM VOLTAGE REGULATOR MODULES TO INTEGRATED CIRCUITS AND MICROPROCESSORS," by Joseph T. DiBene II, David H. Hartke, Carl E. Hoge, and Edward J. Derian, filed Nov. 8, 2001.

BACKGROUND OF THE INVENTION

1. Field of the Invention

The present invention relates generally to systems and methods for interconnecting electronic packages and in particular to a power interconnection system mating between substrates to enable a low impedance disconnectable power delivery path between the power source and the load of an electronic package.

2. Description of the Related Art

High-speed microprocessor packaging must be designed to provide increasingly small form-factors. Meeting end user performance requirements with minimal form-factors while increasing reliability and manufacturability presents significant challenges in the areas of power distribution, thermal management, and electromagnetic interference (EMI) containment.

To increase reliability and reduce thermal dissipation requirements, newer generation processors are designed to operate with reduced voltage and higher current. Unfortunately, this creates a number of design problems.

First, the lowered operating voltage of the processor places greater demands on the power regulating circuitry and the conductive paths providing power to the processor. Typically, processors require supply voltage regulation to within 10% of nominal. In order to account for impedance variations in the path from the power supply to the processor itself, this places greater demands on the power regulating circuitry, which must then typically regulate power supply voltages to within 5% of nominal.

Lower operating voltages have also lead engineers away from centralized power supply designs to distributed power supply architectures in which power is bused where required at high voltages and low current, where it is converted to the low-voltage, high-current power required by the processor from nearby power conditioning circuitry.

While it is possible to place power conditioning circuitry on the processor package itself, this design is difficult to implement because of the unmanageable physical size of the components in the power conditioning circuitry (e.g. capacitors and inductors), and because the addition of such components can have a deleterious effect on processor reliability. Such designs also place additional demands on the assembly and testing of the processor packages as well.

Further exacerbating the problem are the transient currents that result from varying demands on the processor itself. Processor computing demands vary widely over time, and higher clock speeds and power conservation techniques such as clock gating and sleep mode operation give rise to transient currents in the power supply. Such power fluctuations can require changes of thousands of amps within a few microseconds. The resulting current surge between the processor and tie power regulation circuitry can create unacceptable spikes in the power supply voltage $$\left(\text{e.g.} \quad dv = IR + L\frac{di}{dt}\right).$$

The package on which the device (die) typically resides must be connected to other circuitry in order for it to communicate and get power into and out of the device. Because the current slew-rates may be very high, a low impedance interconnection system is often needed to reduce voltage excursions between the power source and load which, if left unchecked, may cause false switching due to the reduced voltage seen at the load from a large voltage drop across the interconnect.

The technology of vertically stacking electronic substrates has been utilized for a number of years. As one example, U.S. Pat. No. 5,734,555, issued to McMahon (which is hereby incorporated by reference herein) discloses a method by which a circuit board containing power conversion elements is coplanar located over a circuit board containing an integrated circuit. The interconnect between the power conversion substrate and the integrated circuit substrate utilizes pins which do not provide a low impedance power path to the integrated circuit. Further, the McMahon device cannot be easily disassembled because the pins ate permanently connected to the substrates. As another example, U.S. Pat. No. 5,619,339, (which is hereby incorporated by reference herein) issued to Mok discloses a printed circuit board (PCB) is vertically displaced over a multi-chip module (MCM) with electrical communication between the two substrates (the PCB and the MCM) established by a compliant interposer which contains "fuzz buttons" which communicate with pads located on each substrate. Although such an approach does provide for disassembly of the two substrates, e.g., the MCM and the PCB, the approach does not provide for large 'Z' axis compliance to accommodate manufacturing tolerances, and does not teach the use of a contact design that is capable of handling large amounts of DC current. Further, this design requires the use of a compliant interposer. In order to handle such large amounts of current, the number of contacts would have to be increased dramatically, which would increase the inductance between the source and the load device. Furthermore, such a large array of such contacts would require a large amount of force to be applied to maintain contact and will not result in a space-efficient design.

From the foregoing, it can be seen that there is a need for a low impedance power interconnect between the power dissipating device and the power source. It can also be seen that this impedance must be low in inductance and resistance throughout a wide frequency band in order to ensure that the voltage drops across the interconnect are mitigated across it during dynamic switching of power. It can also be seen that the interconnect should provide large 'z' axis compliance and permit separation of the assembly without desoldering or similar measures.

SUMMARY OF THE INVENTION

To address the requirements described above, the present invention discloses an apparatus for providing power to a power dissipating device. The apparatus comprises a first circuit board and a second circuit board, and a plurality of compliant conductors disposed between first circuit board and the second circuit board.

The first circuit board includes a power conditioner circuit, and a first side and a second side having a plurality of first circuit board contacts thereon. The first circuit board contacts include a first set of first circuit board contacts communicatively coupled to a first power conditioner circuit connector and a second set of first circuit board contacts communicatively coupled to a second power conditioning circuit connector.

The second circuit board includes the power dissipating device mounted thereto and a plurality of second circuit board contacts disposed on a first side of the second circuit board facing the second side of the first circuit board. The second circuit board also includes a first set of second circuit board contacts communicatively coupled to a power dissipating device first connector and a second set of second circuit board contacts communicatively coupled to a second connector of the power dissipating device.

The plurality of z-axis compliant conductors includes a first set of z-axis compliant conductors disposed between the first set of first circuit board contacts and the first set of second circuit board contacts and a second set of z-axis compliant conductors disposed between the second set of first circuit board contacts and the second set of second circuit board contacts.

The first set of first circuit board contacts, the first set of z-axis compliant conductors, and the first set of second circuit board contacts define a plurality of first paths from the first circuit board to the second circuit board and wherein the second set of circuit board contacts, the second set of z-axis compliant conductors, and the second set of second circuit board contacts define a plurality of second paths from the first circuit board to the second circuit board.

The present invention provides a spring-like structure which disconnectably connects between two or more substrates (such as a printed circuit board or IC package) whereby the connection is disconnectable at least on one of the two sides. The interconnection system provides for an extremely low impedance through a broad range of frequencies and allows for large amounts of current to pass from one substrate to the next either statically or dynamically. The interconnection system may be located close to the die or may be further away depending upon the system requirements. The interconnection may also be used to take up mechanical tolerances between the two substrates while providing a low impedance interconnect. Due to the low impedance connection, the design permits the displacement of bypass capacitors on the circuit board having the power dissipating device, and placement of these capacitors on the circuit board having the power conditioning circuitry, resulting in ease of manufacturing and improved reliability of the power dissipating device assembly.

The present invention reduces or eliminates the need for supporting electronic components for the power dissipating device on the substrate, since the interconnect impedance between the power source and the electronic device is sufficiently low so that all or most of the supporting electronics can be located on the substrate containing the power source. Since the present invention does not use any socket connectors to supply power to the device, such socket connectors are freed to provide additional signals.

BRIEF DESCRIPTION OF THE DRAWINGS

Referring now to the drawings in which like reference numbers represent corresponding parts throughout:

FIGS. 1C–1E are diagrams showing different electrical arrangements of the contacts;

FIGS. 3A–3C are diagrams showing a simple stackup cross-section of the interconnection system as placed between two substrates;

DETAILED DESCRIPTION OF PREFERRED EMBODIMENTS

In the following description, reference is made to the accompanying drawings which form a part hereof, and which is shown, by way of illustration, several embodiments of the present invention. It is understood that other embodiments may be utilized and structural changes may be made without departing from the scope of the present invention.

The present invention describes a low impedance interconnection system operably placed between the two substrates whereby the interconnect is either placed to one side of the device or devices or the interconnect system circumferentially surrounds these elements.

When a load change occurs in operation on one of these devices, a voltage will occur across the interconnect that can be described as shown below:

$$\Delta V = L \frac{\partial I_{Step}}{\partial t} + R I_{Step}$$

wherein $\Delta V$ is the voltage across the interconnection system, L is the series loop inductance of the interconnect, R is the interconnect resistance, and $I_{step}$ is the step-change in load current.

As shown above, the output voltage change $\Delta V$ increases linearly with the loop inductance L. Further, where rapidly changing currents are involved (as is the case with step changes in current, it is critically important that the interconnect system provides for a low inductance between the two substrates. During such a current step, reducing the loop inductance L reduces the $\Delta V$ that results from current changes, thus allowing power to be efficiently delivered from the current source to the load.

Figure 1A:
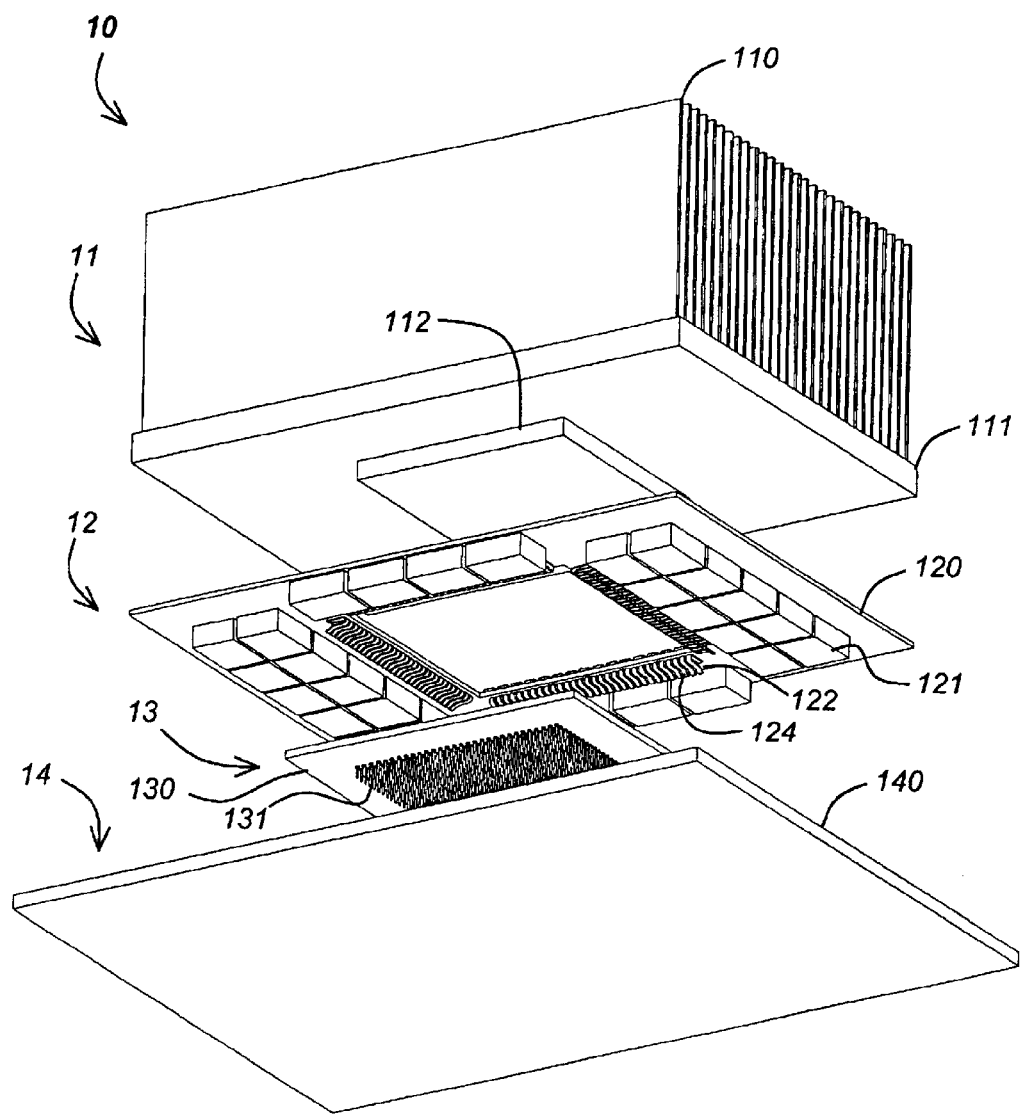
FIGS. 1A and 1B are diagrams showing exploded views of the interconnection system as placed between two substrates, e.g., a voltage regulator module (VRM mounted over a power dissipating device.
Figure 1B:
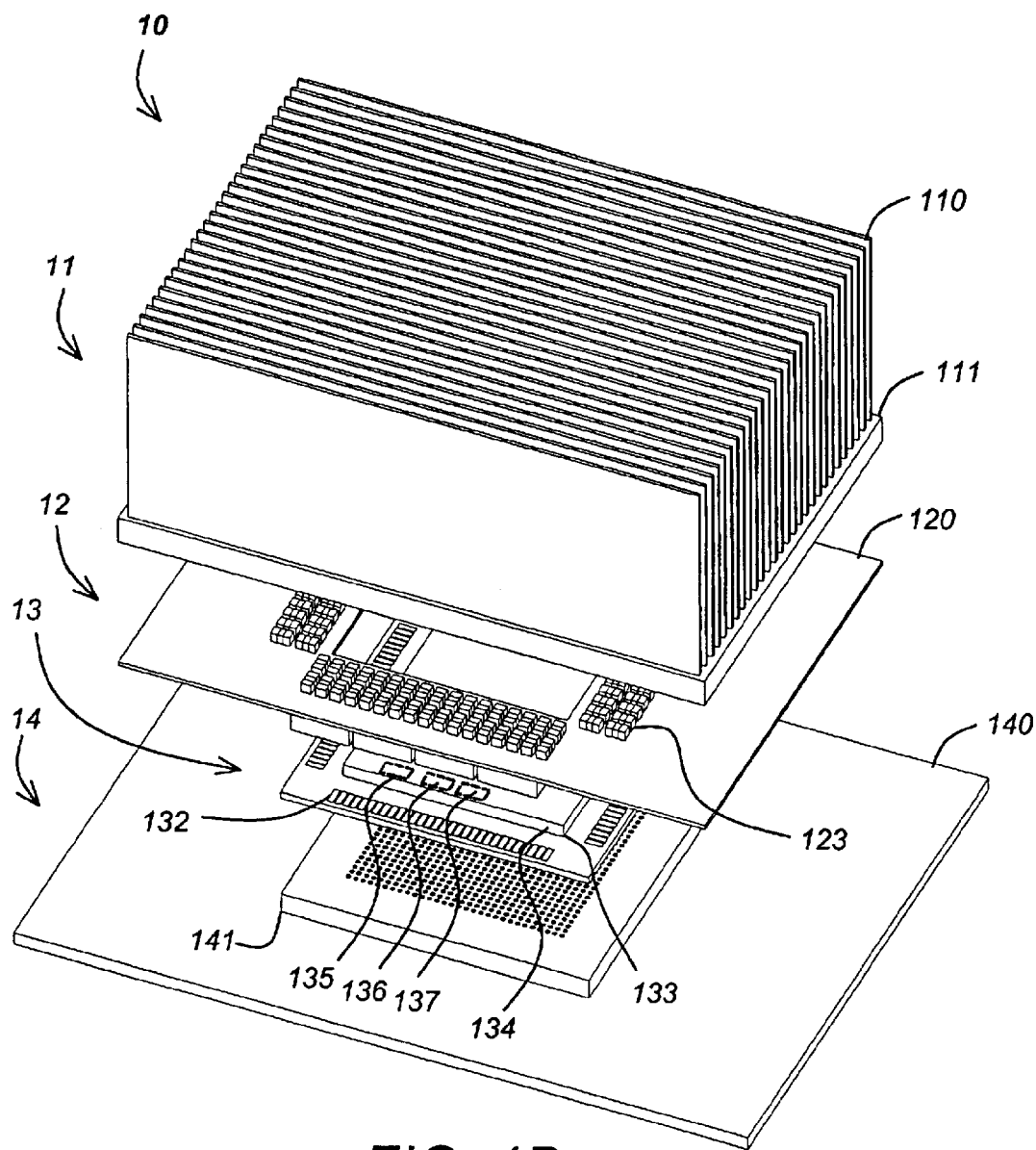

FIGS. 1A and 1B are diagrams illustrating a structure 10 which provides a power path from a power conditioning circuit to a high performance electronic power dissipating device via a plurality of paths, thus yielding very low impedance. The structure 10 comprises a main board assembly 14, an electronic assembly 13 having a high performance electronic power dissipating device, a power conversion assembly 12 and a heat dissipating assembly 11.

The electronic assembly 13 comprises a power dissipating device such as a microprocessor 134 assembled onto printed circuit board (PCB) or substrate 130 (hereinafter, the terms "printed circuit board", "circuit board" and "substrate" are used interchangeably). The circuit board 130 includes one or more circuit traces which deliver power to the die of the microprocessor 134. The circuit board 130 also includes circuit traces which route signals to a matrix of pins 131 communicatively coupled to microprocessor 134 I/O connectors. The microprocessor 134 is typically provided with a thermally conductive lid 133 in which the inside surface of the lid is in close thermal contact with the top of the die of the electronic device and the perimeter of the lid is sealed and attached to the surface of the substrate 130. Although the package described herein is provided with a lid the present invention does not preclude the use of unlidded package construction methods.

The signal pins 131 engage with a socket 141 which is mounted to a main board 140 both of which are a part of main board assembly 14. Signals from the main board assembly 14 are dispersed to other electronic devices to form a complete operating unit such as a computer. Other methods may be employed to route the signals from the substrate 130 to the main board 140 which may not utilize either pins or sockets.

The circuit board 130 includes a plurality of contacts 132. The contacts 132 can include power contacts and/or ground contacts. The power and ground contacts are communicatively coupled to power connectors or pads 135–137 of the power dissipating device 134, respectively.

FIGS. 1C–1E disclose several embodiments of the present invention showing different electrical arrangements of the contacts 132. In one embodiment, the power contacts include positive polarity power contacts 132A that are communicatively coupled to a positive polarity power connector or pad 135 on the power dissipating device 134 and negative polarity power contacts 132B that are communicatively coupled to a negative polarity power connector or pad 136 on the power dissipating device 134. The ground contacts 132C are communicatively coupled to a ground connector or pad 137 of the power dissipating device 134.

In one embodiment of the present invention (illustrated in FIGS. 1D and 1E), the power contacts 132A and/or 132B are interleaved with the ground contacts 132C. In FIG. 1D, each power contact 132A and/or 132B is adjacent a ground contact 132C, and each ground contact 132C is adjacent a power contact 132A and/or 132C. In another embodiment of the present invention, the positive polarity power contacts 132A are interleaved with negative polarity power contacts 132B in the same way. The foregoing interleaved or alternating design substantially reduces undesirable electrical impedance of the power path.

In the embodiments shown in FIGS. 1A and B, the contacts 132 are disposed around the perimeter of the electronic device and are a part of the substrate structure 130.

The substrate 130 generally comprises a number of conductive layers that are used to route both signals and power and ground. When routing power, layer pairs adjacent to each other form a very low electrical interconnect impedance between the power pads 132 and the die power and/or ground connectors (e.g. pads) of the electronic device 134. These layer pairs are connected to the power pads 132 in a closely coupled arrangement to the planes. A further description of the conductive layers and their arrangement with respect to the z-axis compliant conductors 124 is presented in conjunction with FIGS. 3A–3C below.

A power conversion assembly 12 is disposed directly above (along the z-axis) the electronic assembly 13. This assembly 12 comprises an interconnect substrate commonly referred to as a printed circuit board PCB) 120, a power conversion circuit having components 121 such as switching transistors, transformers, inductors, capacitors, and control electronics; output capacitors 123 and a compliant conductor assembly 122 having a plurality of z-axis compliant conductors 124. These power conversion components can be segmented according to the VRM circuit topology to optimize the impedance and power flow through the power conditioning circuitry. For example, in the case of a multiphase VRM, the topology of the VRM can be designed to provide one or more of the phases, each at the appropriate connector, thus minimizing the interconnect impedance and the required circuit board real estate. The plurality of z-axis compliant conductors 124 circumscribe and interface with the contacts 132 on the electronic assembly 13 to provide a conductive path between the power conversion assembly 12 and the electronic assembly 13 having very low inductance. Further, the conductor assembly 122 permits the power conversion assembly 12 and the electronic assembly 13 to be disassembled and separated without desoldering.

A significant advantage to injecting power to the power dissipating device in a circumferential manner is that the current in any portion of the power planes of the substrate used to deliver power to the power dissipating device can be reduced significantly. As an example, if four compliant contact assemblies are located on each of the four sides adjacent to the power dissipating device, then, the maximum plane current is one-quarter the total current of the device assuming that the current in the device has a uniform current density at its interface to the substrate. Furthermore, the path length is significantly lower than other methods to deliver power to the substrate further reducing the voltage drop in the power delivery planes of the substrate (see, for example, U.S. Pat. No. 5,980,267, which is hereby incorporated by reference herein). Generally, the power delivery regulation budget is fixed and the power planes of the power dissipating device substrate are adjusted to maintain the desired budget either by increasing the number of planes or increasing the thickness of the planes as the current is increased or the budget is decreased. Circumscribed power delivery provides for significant reductions in both plane thickness and/or total number of planes.

In the illustrated embodiment, the conductors 124 of the conductor assembly 122 are attached (e.g. soldered or bonded) to the substrate 120. Further, the conductors 124 of the conductor assembly 122 are electrically coupled to the contacts 132 of substrate 130 through mechanical pressure applied to urge the substrate 120 towards the substrate 130.

Other variations of this structure are possible. As an example, the compliant conductor assembly 122 could be permanently attached to substrate 130 with contact pads on substrate 120 or, contact pads could be place on both substrates 120 and 130 and the compliant contact could provide pressure contacts to both substrates. Note that some of the interconnect compliant contacts may be used for control and sense interfaces between the power circuitry in assembly 12 and the electronic assembly 13. Finally, note that substrate 120 has an aperture to allow for the lid 133 to pass through and thermally couple to the heatsink assembly 11.

In the past, it has been necessary to position bypass capacitors on substrate 130 to provide for the transient current demands of the electronic device on the substrate. This has reduced the reliability of the electronic assembly 12 which is relatively much more expensive than the other assemblies. Thus, it is desirable to increase the reliability of this assembly to the highest degree possible. Because the interconnect inductance of the compliant contacts 122 is extremely low it is possible to position the necessary bypass capacitors 123 on the power conversion substrate 120. Further, note that these capacitors 123 are located directly above the conductor assembly 122 reducing the interconnect path length between the connector and the capacitors 123 (thus decreasing the impedance) to approximately the thickness of the substrate 120.

Heatsink assembly 11 is used to remove heat from both the electronic assembly 13 and the power conversion assembly 12. Heatsink assembly 11 comprises a finned structure 100, which is attached or is a part of base 111. Heat slug or mesa 112 is attached to or is a part of base 111 and is used to both disperse heat from the lid 122 and to mechanically conform to the proper vertical displacement between the lid of the microprocessor 134 and the heat sink base 111. Thermal interface materials may be used to thermally couple the lid 133 and the mesa 112 to the heatsink base 111 and the substrate 120/power components 121. The heatsink base 111 may also comprise cavities to accommodate any components on the top side of substrate 120 such as capacitors 123.

Figure 2A:
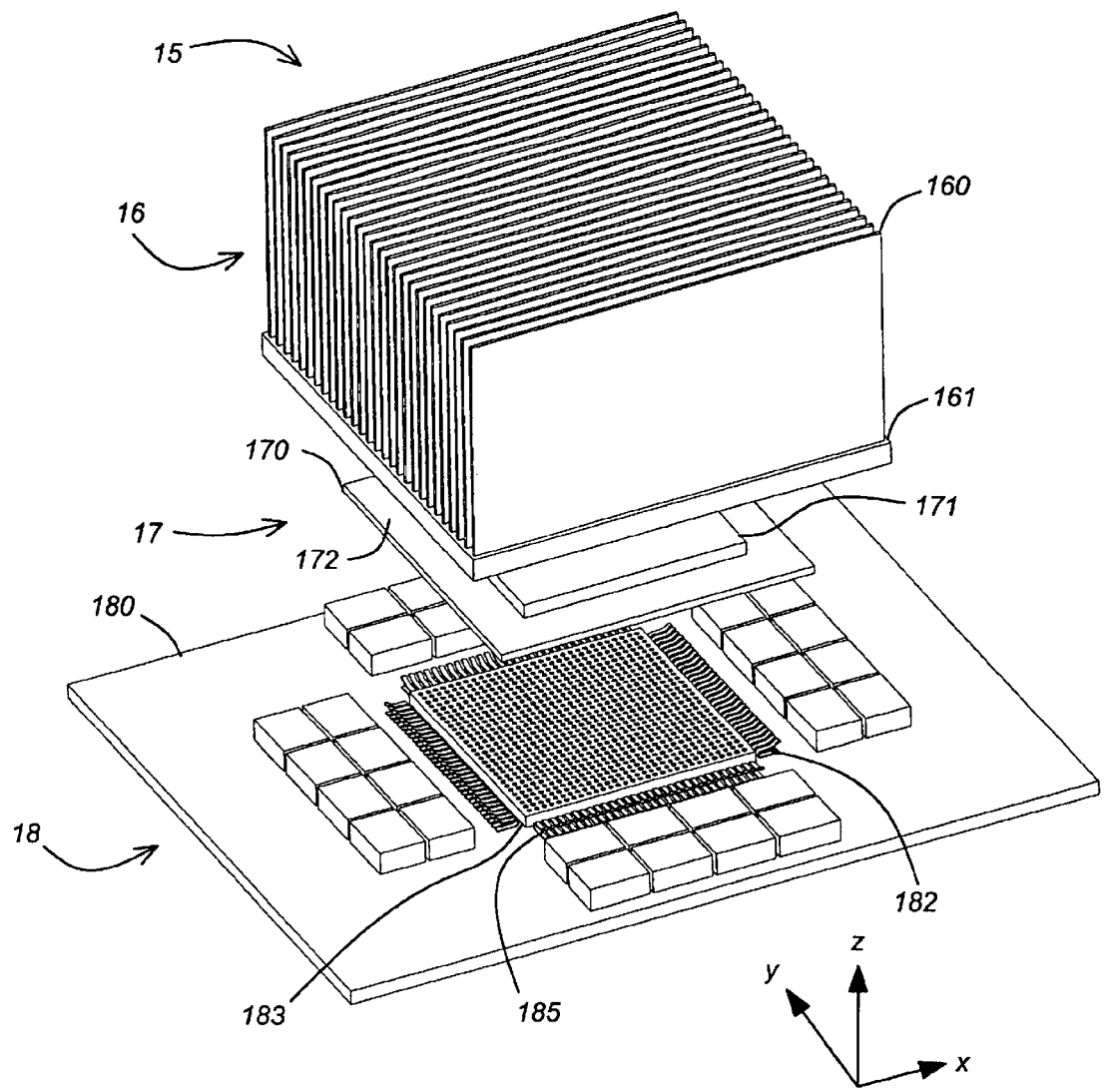
FIGS. 2A–2C are diagrams showing exploded views of the interconnection system as placed between a processor substrate and a motherboard, the interconnection system occurring on the sides of the processor substrate.
Figure 2B:
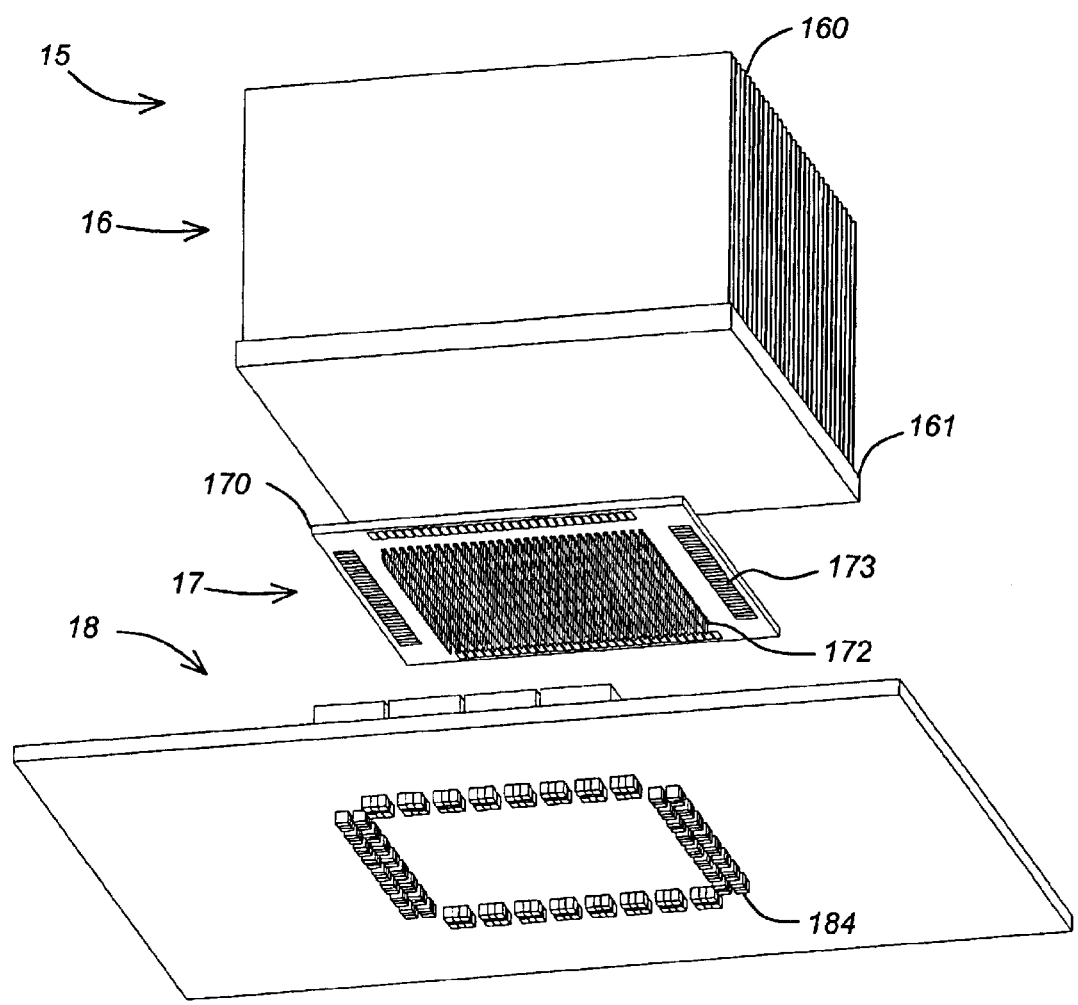

FIGS. 2A and 2B illustrate a structure 15 which is similar to structure 10 except the power conversion circuit components are located directly on the main board assembly 18. The structure comprises the main board assembly 18, a high performance electronic assembly 17 and a heat dissipating assembly 16.

Electronic assembly 17 is similar to electronic assembly 13 with substrate 170, lid 171 and pin matrix 172. However, contacts 173, which can be used as power pads, are located on the bottom side of substrate 170. In the illustrated embodiment, the contacts are disposed around the perimeter of the electronic device 172.

Main board assembly 18 comprises a main board 180 with power conversion components 181 making up a power conditioner circuit and compliant conductor assembly 182 having a plurality of z-axis compliant conductors 185 circumscribing a socket 183. As was the case with assembly 13, bypass capacitors 184 are placed on main board 180 directly under and in electrical communication with the z-axis compliant conductors 185. Heat sink assembly 16 is disposed above and is thermally coupled to the electronic assembly 17. The heat sink assembly 16, which removes heat from the electronic assembly 17, comprises a finned structure 160 and base 161.

Thermal interface material can be used between the base 161 and the lid 171 to thermally couple the base 161 and the lid 171. Thermal energy may also be removed from the power conversion components 181. This can be accomplished by providing a thermal conduction path from the bottom of the main board to an adjacent chassis surface. This can also be accomplished by simply providing sufficient airflow around these components so as to directly cool them. It is also noted that as was the case with the embodiments illustrated in FIGS. 1A and 1B, where ultimate electrical performance is not needed, compliant conductor assembly 182 and power components 181 may not need to circumscribe socket 183 and may be located on less than all four sides of socket 183.

Figure 2C:
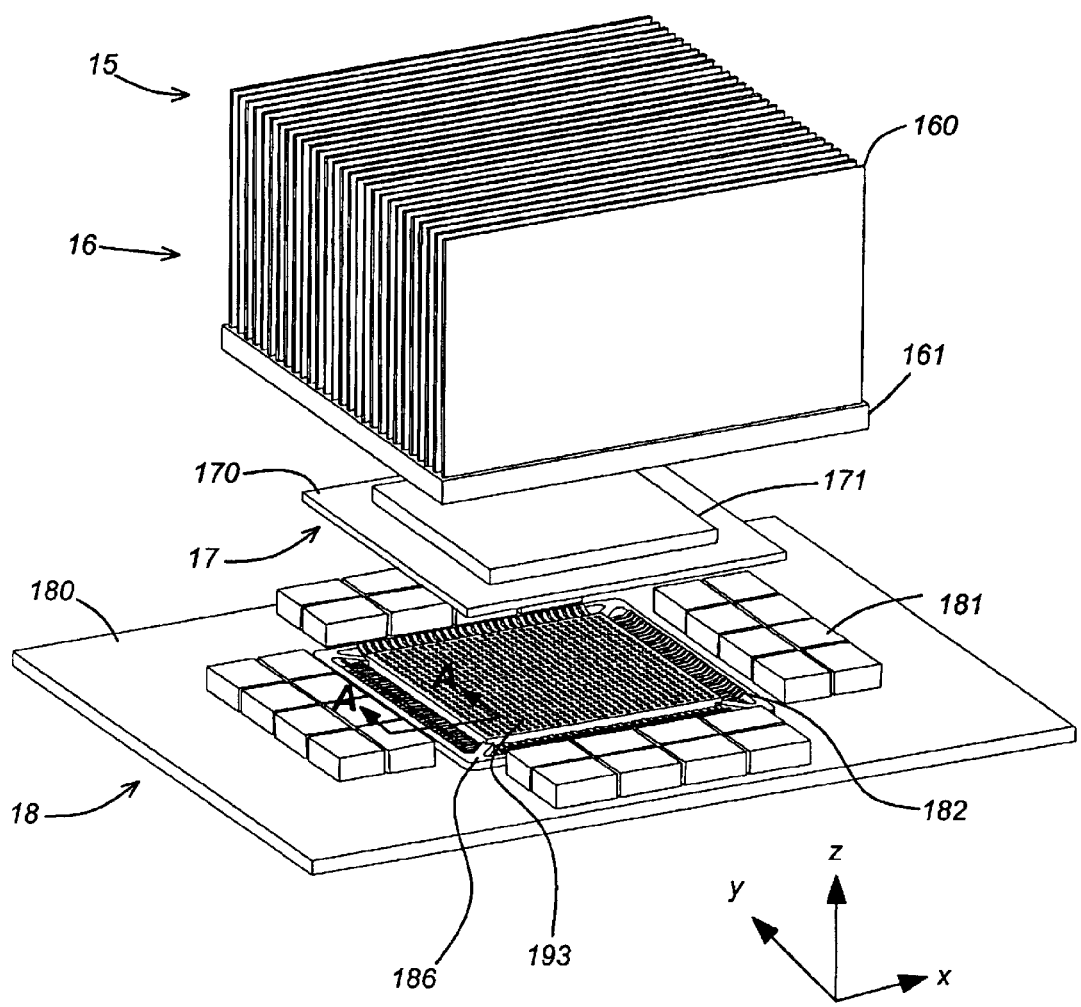

FIG. 2C is a diagram of a structure 15 that is similar to that shown in FIG. 2A except that compliant conductor assembly 182 are at least partially enclosed and contained within the socket 186 which mounts to the main board 180. This facilitates the assembly of main board assembly 18.

Figure 2D:
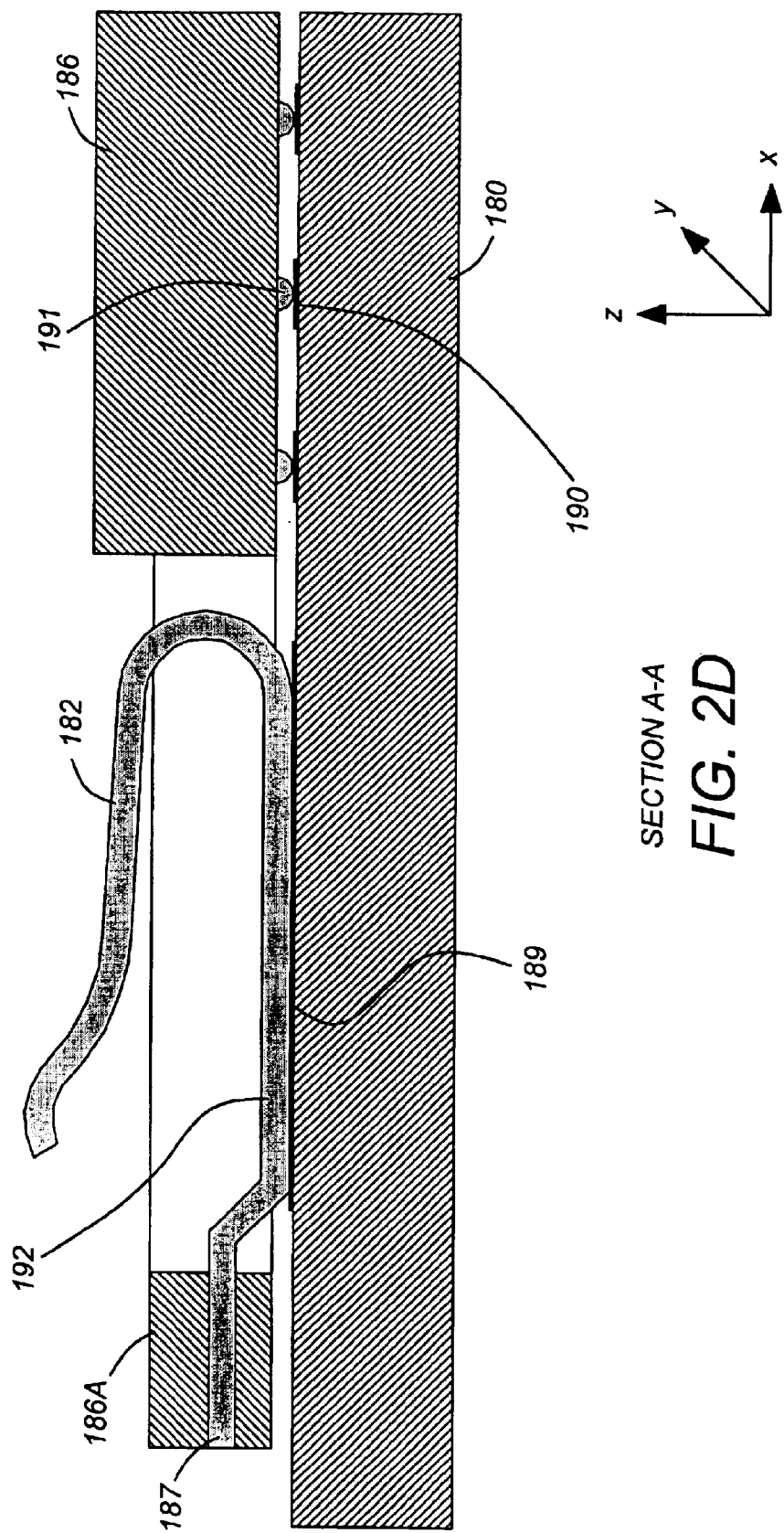
FIG. 2D are diagrams depicting a view of section A—A of FIG. 2C.

FIG. 2D is a diagram presenting a section view (A—A) along one side of socket 186 showing the socket 186 and the compliant conductor 182. The socket 186 includes a section 186A that secures individual z-compliant conductors 182 in place by overmolding a base extension 187 of the conductors 182. Socket 186 includes a plurality female connectors 193 which accept pins that are communicatively coupled to the power dissipating device. Each female connector is also communicatively coupled to solder balls, which are reflow soldered to circuit pads 190 on main board 180. The power dissipating device is thus electrically connected to the main board 180, which, as shown in FIG. 2C, includes power components 181 for power conditioning.

The base 192 of compliant contact 182 is soldered to power contact pad 189. This is preferably accomplished during the same reflow solder step used to couple the solder balls 191 to the circuit pads 190 on the main board 180. Not shown are power connection paths to internal layers of main board 193 from surface contact 189.

Figure 3A:
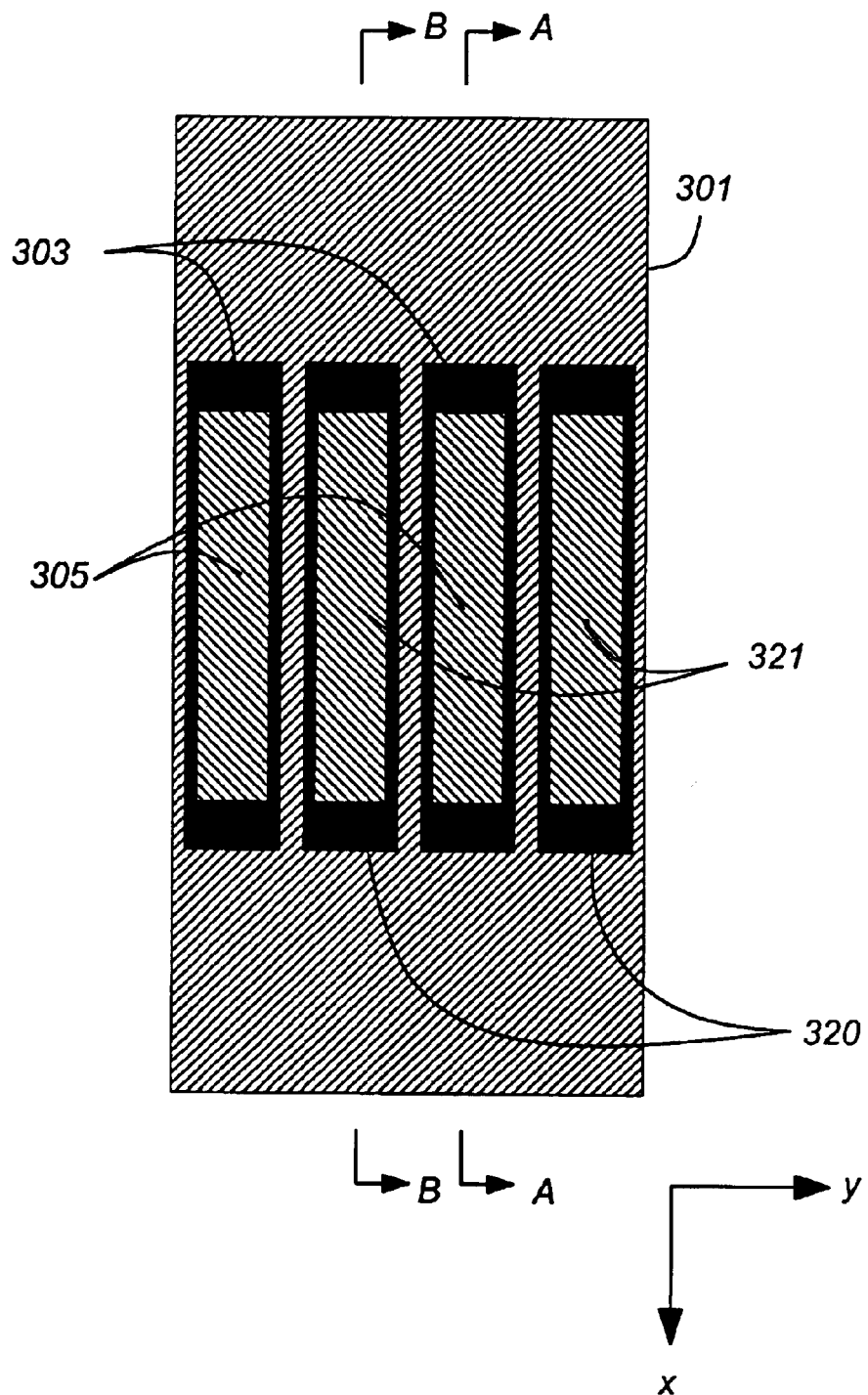
Figure 3B:
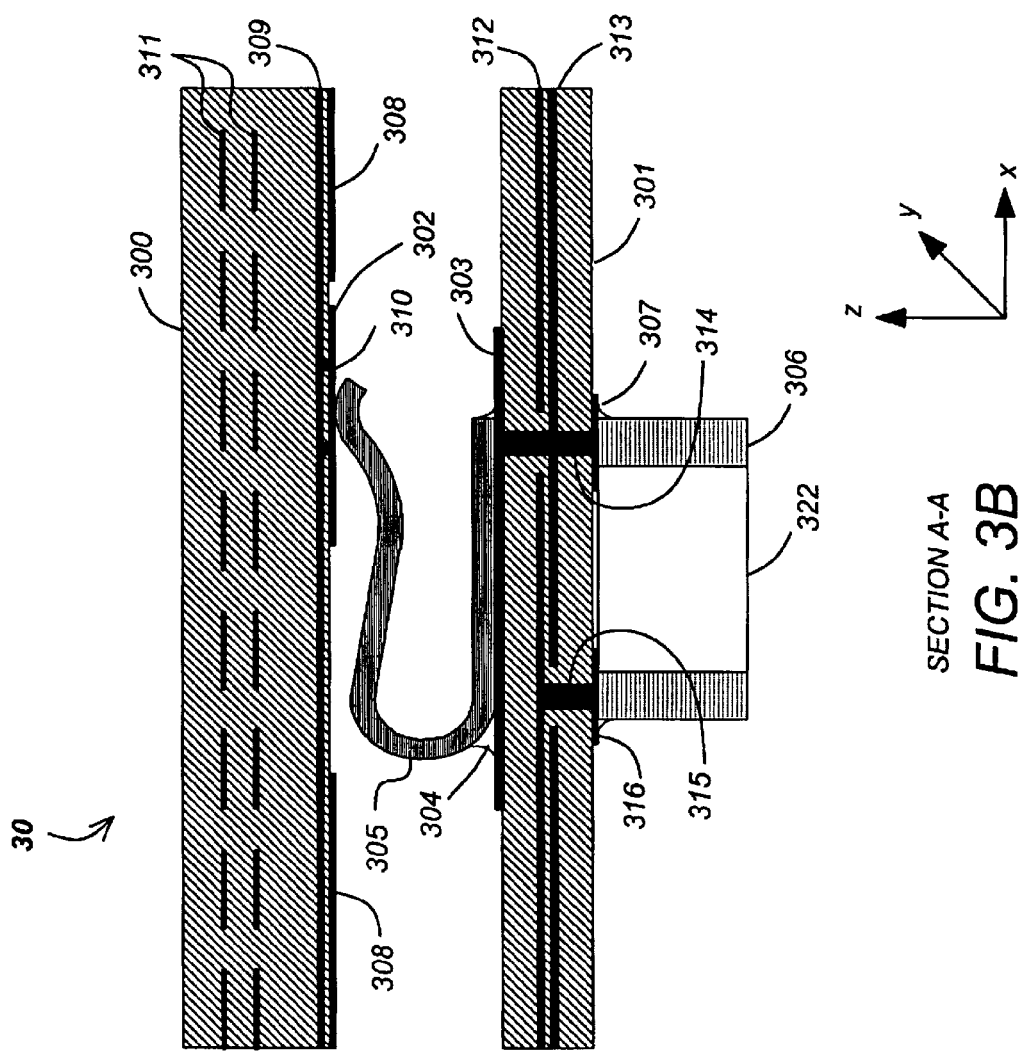

FIGS. 3A–3C illustrate an embodiment of a stackup 30 configured to deliver power from a power conversion PCB 301 to a processor substrate 300. It will be recalled that a preferred embodiment of power delivery is to deliver power through alternating or interleaved contacts so as to reduce the interconnect impedance.

FIG. 3A is a diagram showing a plan view of the stackup 30 with the upper PCB 300 removed, showing the arrangement of adjacent z-axis compliant conductors 305 and 321 in the x-y plane. In one embodiment illustrated, the conductors are spaced approximately 50 mils apart, to decrease impedance. Further, the illustrated z-axis compliant (or, equivalently, compliant) conductors 305 and 321 are cantilevered beams having bases that are soldered or other wise affixed to contacts (or circuit pads) 303 and 320, respectively. The other end of the compliant contact is pressed against the contact (or circuit pad) of the upper circuit board 300.

FIG. 3B is a diagram illustrating a cross section (A—A) of one polarity of power delivery, e.g., the positive polarity, while FIG. 3C illustrates a cross section (B—B) of the negative polarity, the two sections adjacent to one another forming the preferred interleave pattern.

Referring to FIG. 3B, power conversion PCB 301 contains power layers 312 and 313 wherein layer 312 represents the negative power layer, and layer 313 represents the positive power layer the two of which are in close proximity to one another to effect a low impedance power interconnect. A plated through hole (PTH) 314 or similar conductor connects the positive power layer 313 to a surface pad 303. Z-axis compliant contact 305 is shown as a cantilever beam having a base that is soldered 304 to surface pad 303. The other end of the compliant contact 305 is pressed against circuit pad 302 on the surface of the substrate 300. A bypass capacitor 322 is located below the compliant contact 305 and on the side of the first circuit board 301 opposite contact 303. The bypass capacitor 322 includes first and second connectors such as conductive end metalization features 306 and 317, which are surface mounted and electrically coupled to pads 307 and 316, respectively on PCB 301. Circuit pad 307 is connected to layer 313 through an extension of PTH 314. Circuit pad 316 is connected to layer 312 through an inter-connector such as the illustrated blind via 315. Preferably, the bypass capacitor 322 is disposed directly below the compliant contact and associated structure (e.g. displaced from the structure in substantially only the z-axis), as this offers lower inductance than embodiments where the bypass capacitor 322 is displaced laterally (in the x and/or y axes as well).

In the illustrated embodiment, layer 308 of substrate 300 is assigned a negative power polarity while layer 309 of substrate 300 is assigned a positive power polarity. Like layers 312 and 313, in the PCB 301, layers 308 and 309 are in close proximity to one another to achieve a low impedance power interconnect. A power dissipating device located on substrate 300 can therefore receive power through layers 308 and 309 of the substrate 300. Circuit pad 302 is electrically connected to layer 309 through one or more blind vias 310 thus forming a low impedance interconnect from layer 313 through PTH 314 to pad 303 then through compliant contact 305 to pad 310 and then through blind vias 310 to layer 309. Note that layers 308 and 309 are located on or near the surface of substrate 300. This frees the substrate 300 to use the other layers (represented as layers 311) for signal interconnect for the power dissipating device without topological complications that arise from designs in which the power and ground layers are disposed away from the bottom surface of the substrate.

Referring again to FIG. 3C, (which illustrates a cross section (B—B) of the negative polarity, thus forming the preferred interleave pattern with the cross section A—A in FIG. 3B) the negative polarity power interconnect is achieved by PTH 319 connecting layer 312 to surface contact (e.g. pad) 320 adjacent the positive polarity surface contact or pad 303 on the inner side of PCB 301. Compliant contact 321 is soldered 304 or otherwise coupled to surface pad 320 while the other end of the compliant contact 321 is pressed against (surface) layer 308 of substrate 300. Note that contact point for compliant contact 321 is shown as a point (or more specifically, a line segment along the y-axis) on layer 308 however, this contact area may be a unique area of layer 308 in which the surface is locally processed to provide special characteristics for this contact point such as gold plating over a nickel undercoat to improve the contact characteristics of the contact. Surface pad 310 may be processed in a similar manner.

Finally, capacitor 322 may be the same bypass capacitor as shown in FIG. 3B or an additional bypass capacitor connected to planes 312 and 313 through an extension of PTH 319 to surface pad 316 and blind via 318 to surface pad 307. The result of the above is to provide a very low compact and low inductance compliant connection between PCB 301 and substrate 300 with the two substrates being separable. Furthermore, because the interconnection method provides for a very low inductance connection it is possible to either eliminate or considerably reduce bypass capacitors on the substrate 300 containing the power dissipating device.

Because such substrates are constructed such that the interconnects between layers 308 and 309 are blind vias 310 which pass only between layer to layer and not through the entire substrate, signal layers 311 and additional power/ ground layers (if any) will not be permeated with large numbers of via interconnects (such as 310) as would be if power entered from the top side of substrate 300. This has the benefit of freeing up signal routing space in these layers (such as 311) where the number of via interconnects are substantially reduced due to the entrance of power to the bottom side of substrate 300. The embodiment shown in FIGS. 3A–3C is superior to other interconnect designs wherein the capacitor is not placed below the z-axis compliant conductors and on the opposing side of the circuit board with the power conditioning circuitry. For example, if the capacitive element were placed on the second side of the first circuit board (the same side as the z-axis compliant conductor) and adjacent to the spring members, the length of the conductive path and hence the impedance of the interconnect would include not only the vias or PTHs traversing in the z-axis, but also traces or planes in the x-y plane. By placing the capacitive element 322 on the side of the circuit board opposing the z-axis compliant conductor and directly over (or under) the z-axis compliant conductor, the length of the conductive path (and hence the impedance) is substantially reduced. The conductive path length (and hence, the impedance) is further reduced by selecting the span of the capacitive element 322 and related structures (e.g. pads 307 and 316) to be substantially the same as the span (the length in the longitudinal, or x-axis, direction) of the z-axis compliant conductor. With the length of the conductive path minimized capacitive elements on the second circuit board (or substrate) can be removed, which improves manufacturability and reliability as well.

Figure 4A:
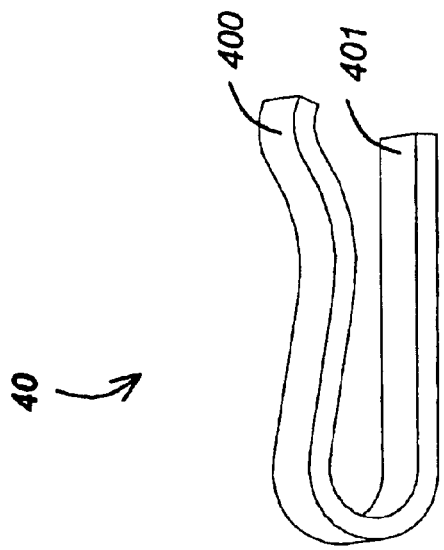
FIGS. 4A and 4B are diagrams showing an embodiment of a cantilever beam that may be used to implement the z-axis compliant contacts.
Figure 4B:
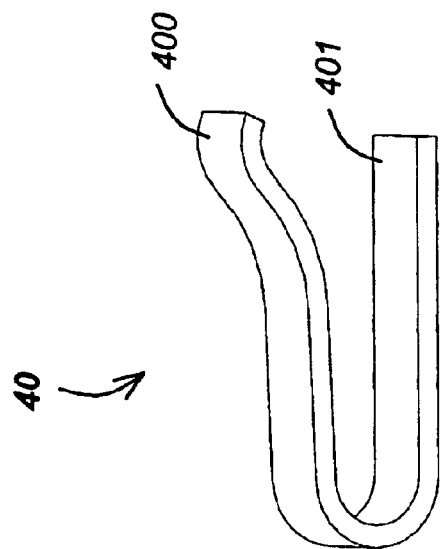

FIGS. 4A and 4B illustrate an isometric view of one embodiment of a U-shaped z-axis compliant conductor 40. The conductor 40 comprises a base 401 which can be soldered or otherwise bonded to a substrate while contact surface 400 is pressed against a pad on an opposite substrate. FIG. 4A shows the conductor 40 in the uncompressed state while FIG. 4B shows the conductor in the compressed state. In the illustrated embodiment, the contact surface 400 is formed by an S-shaped portion having a curved surface. The curved surface assures that the conductor 40 presents a surface parallel to the circuit board above the contact 40.

Figure 5A:
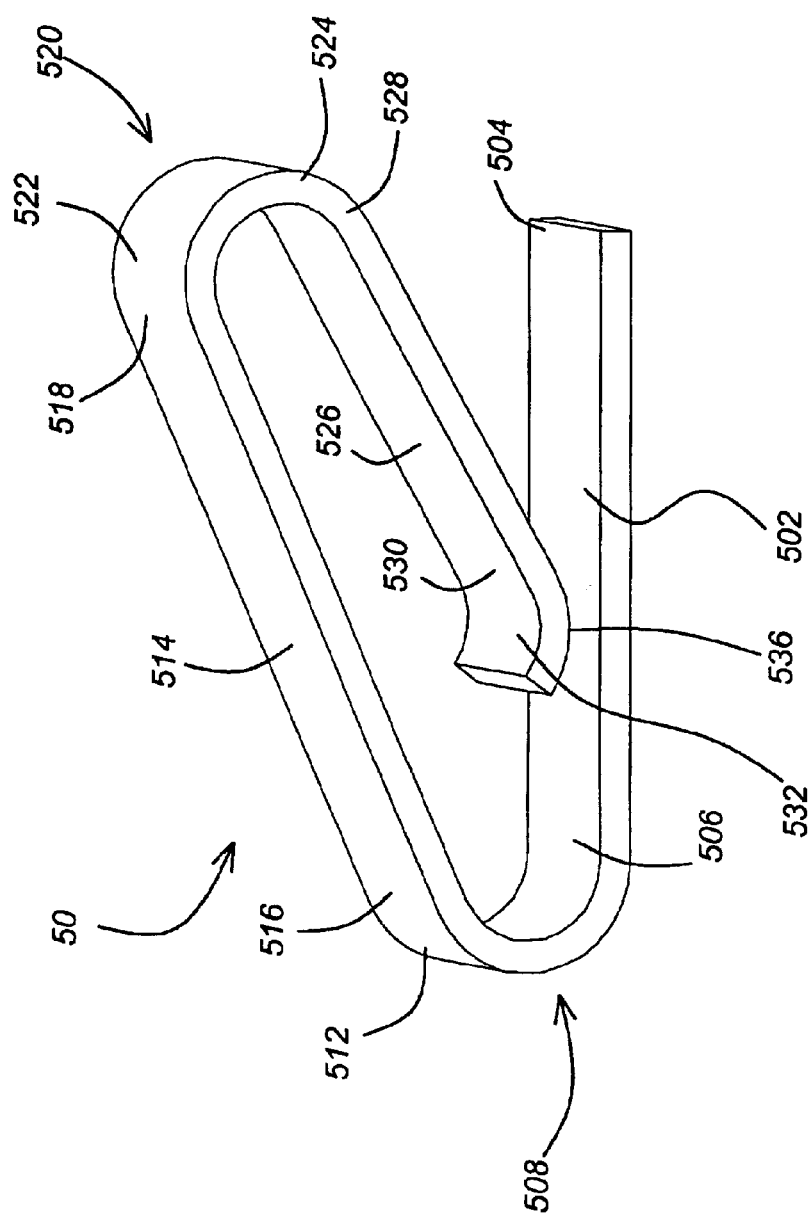
FIGS. 5A–5D ate diagrams showing further embodiments of a cantilevered beam in which the different features of the beam construction are utilized to reduce the connection inductance of the compliant contacts.
Figure 5B:
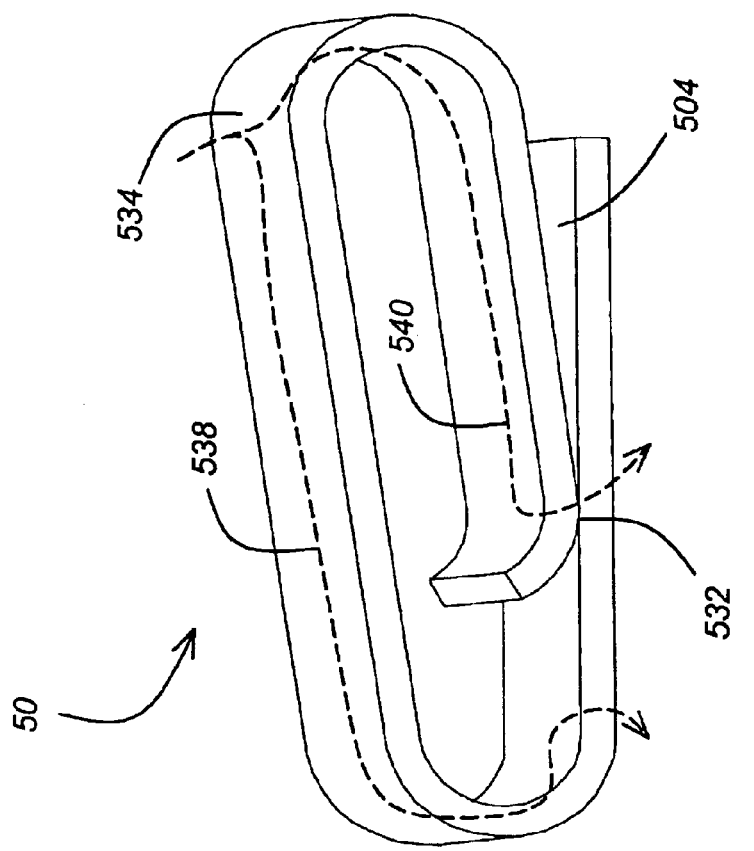

FIGS. 5A and 5B illustrate an isometric view of another embodiment of the z-axis compliant conductor 50. The conductor has a base or first shaft portion 502 having a first end 504 and a second end 506 distal from the first end 504. The base 502 is generally soldered to a substrate contact. A U-shaped bend portion 508 is coupled to the first shaft portion 502. The U-shaped bend portion 508 includes a first end 510 adjacent and coupled to the first shaft portion second end 506 and a second end 512. A second shaft portion 514 is coupled to the U-shaped bend portion 508. The second shaft portion includes a first end 516 adjacent and coupled to the U-shaped portion second end 512. Second shaft portion is adjacent and coupled to a second U-shaped bend portion 520. The second U-shaped bend portion comprises a first end 522 adjacent and coupled to the second end 518 of the second shaft portion 514 and a second end 524. The second U-shaped bend portion is adjacent and coupled to a third shaft portion 526 disposed between the first shaft portion 502 and the second shaft portion 514. The third shaft portion 526 includes a first end 528 adjacent and coupled to the second end of the second U-shaped bend portion 520 and a second end 530 distal from the first end 528. Bend portion 532 is disposed at the second end 530.

The conductor contact surface 534 is pressed against a pad on an opposite substrate. The contact beam is then wrapped around and returns to the upper surface of base 502 forming a secondary contact 536 to the base 502. This embodiment has improved (reduced) connection inductance compared to the embodiment illustrated in FIGS. 4A and 4B because the mutual coupling between path 538 and path 540 is relatively low which establishes semi-independent and parallel connection paths between contact surface 534 and the base 502.

Figure 5C:
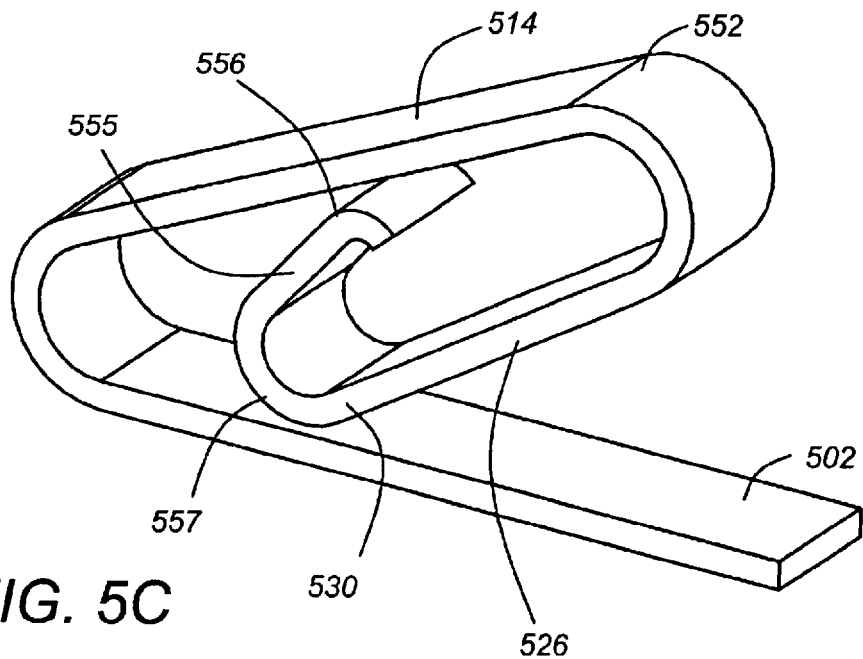
Figure 5D:
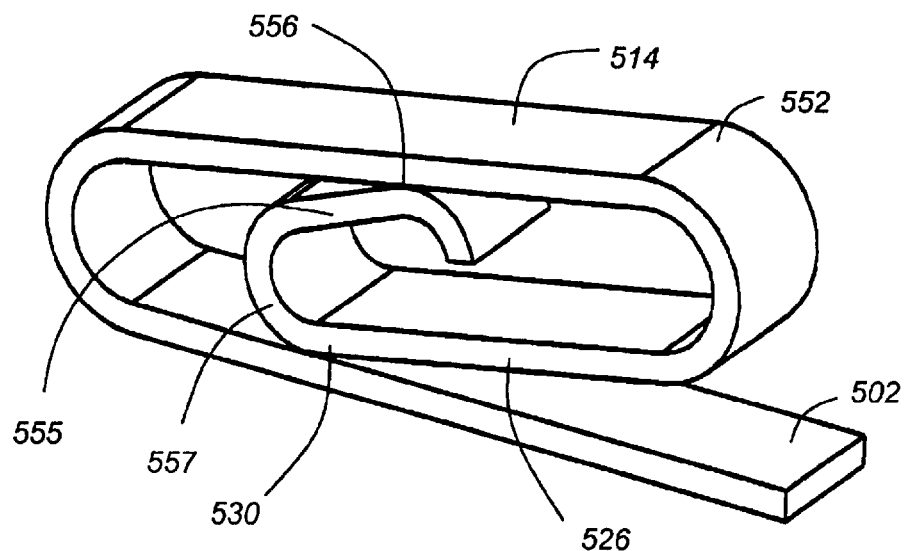

FIGS. 5C and 5D illustrate an isometric view of still another embodiment which is similar to that described in FIGS. 5A and 5B. FIG. 5C illustrates this embodiment in the uncompressed state whereas FIG. 5D illustrates the embodiment in the compressed state. This embodiment further comprises a third u-shaped bend portion 557 coupled to the distal end 530 of the third shaft portion 526, a fourth shaft portion 555 coupled to the third u-shaped bend portion 557. The fourth shaft portion 555 includes a contact portion 556 distal from the third u-shaped bend portion 557. When compressed, the contact portion 556 establishes an additional third path between the contact point 552 and the base 502 that passes through the fourth shaft portion 555, the third unshaped bend portion 557 and to the base 502. This embodiment has still further reduced inductance over the embodiment in FIGS. 5A and 5B because there are now three semi-independent paths 551, 553 and 555 between the contact surface 552 and the base 550.

Individual conductors can be grouped so as to ease assembly of the conductor onto a PCB or substrate using soldering or other joining processes. One method is to extend a surface feature (such as 401) of the conductor to an area outside of the active portion of the conductor which is joined to a common bar during the stamping and forming fabrication process and then to overmold this extended feature with an insulating plastic resin up to the common bar but not including the bar. The bar is then cut off leaving a set of individual isolated contacts that are mechanically joined and can be handled during assembly as one unit.

Figure 6A:
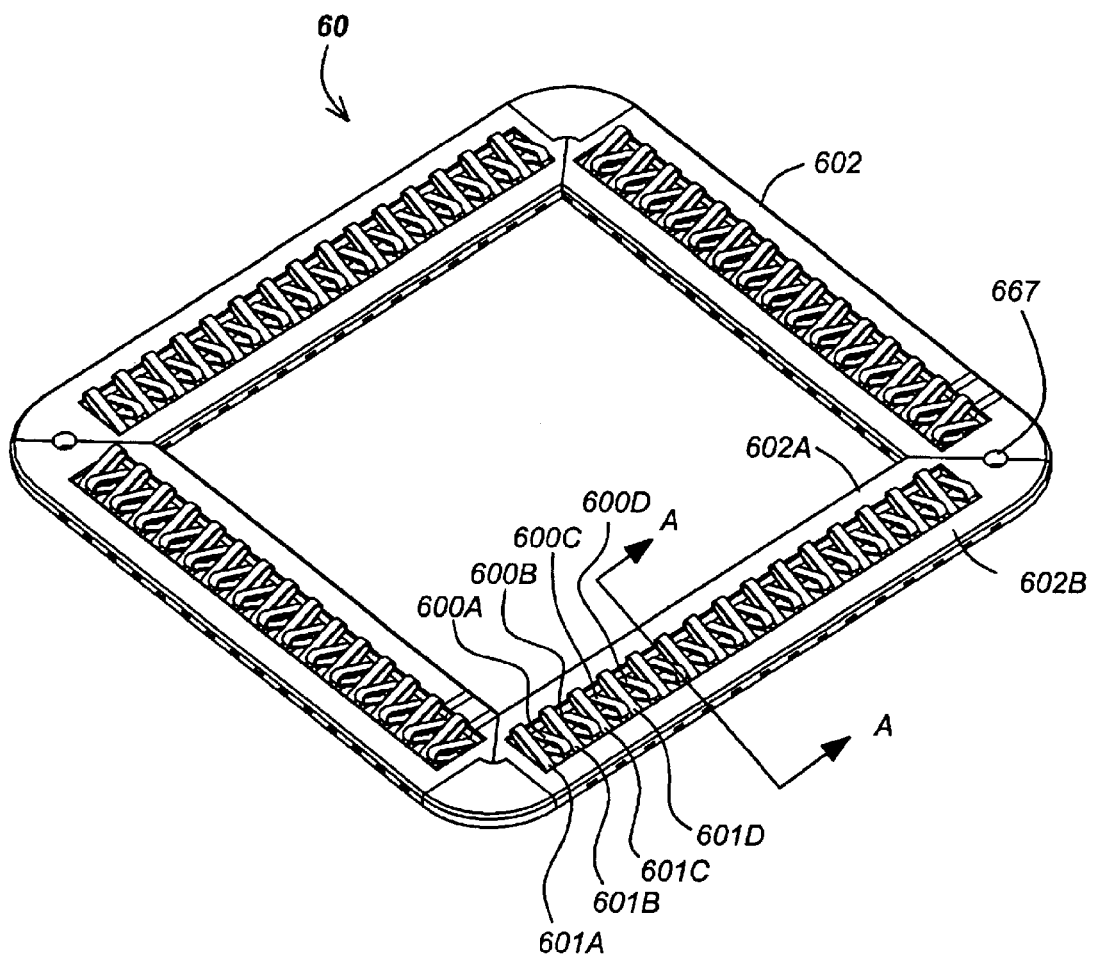
FIG. 6A is an isometric view of an assembly showing muliple pairs of z-axis compliant conductors arranged in two rows within an insulating frame structure.
Figure 6B:
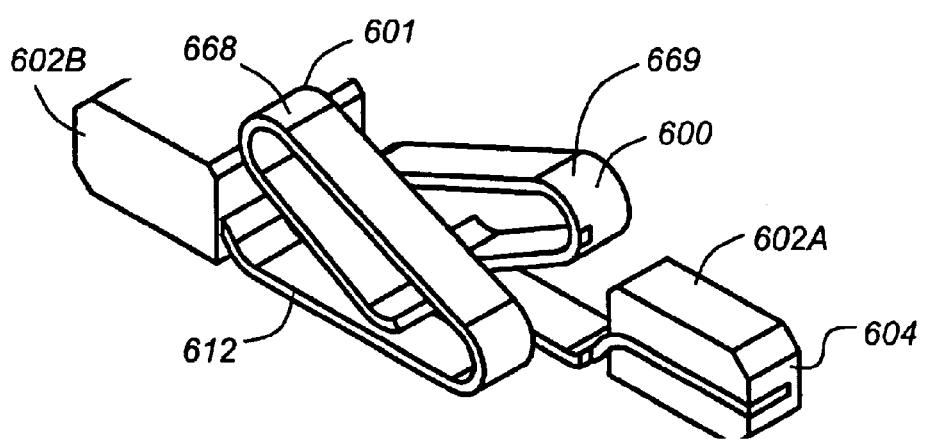
FIG. 6B is an isometric view of a pair of spring contacts in a scissor configuration.
Figure 6B:
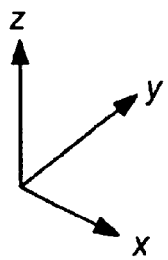
Figure 6C:
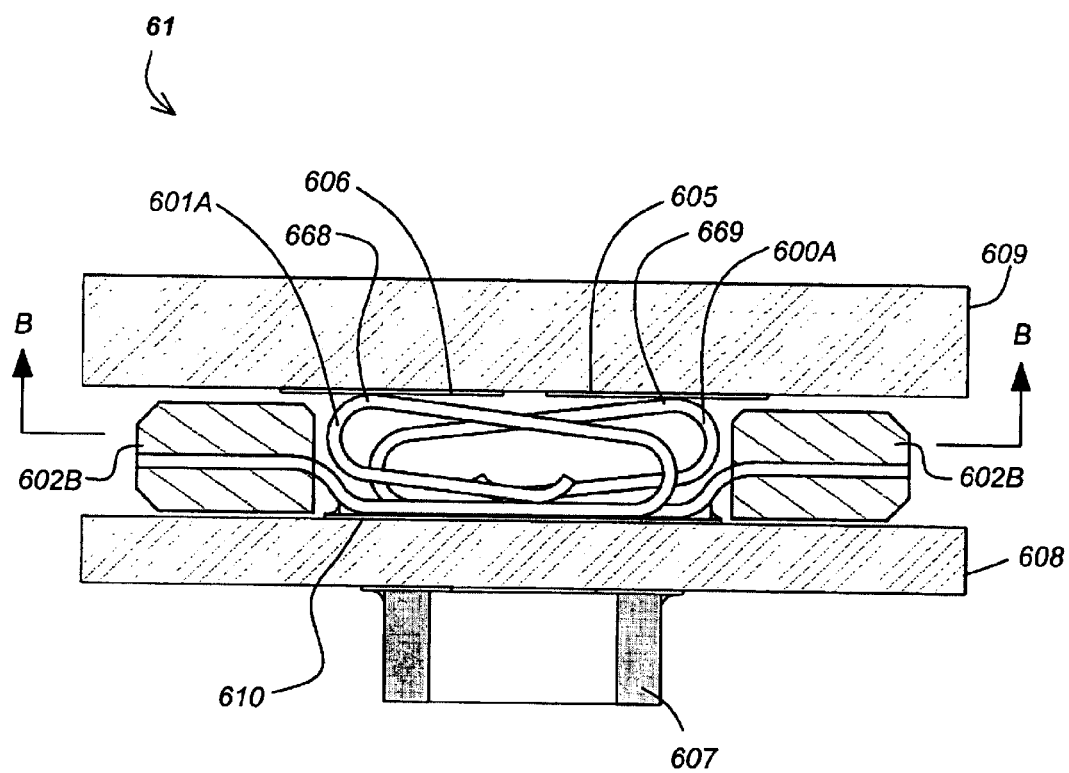
FIG. 6C is a section view showing how spring contacts arranged in a scissor configuration can be used to interconnect the first and second circuit boards.

FIGS. 6A–6C illustrate another embodiment of the invention in which z-axis compliant conductors similar to those shown in FIGS. 5A and 5B are arranged in a scissor configuration.

FIGS. 6A and 6C illustrate an isometric view of the assembly 60 showing pairs of z-axis compliant conductors 600A, 600B, 600C, 600D (hereinafter alternatively referred to as first set or row of z-axis compliant conductors 600) and 601A, 601B, 601C, 601D (hereinafter alternatively referred to as second set or row of z-axis compliant conductors 601). Each of the conductors in each row 600, 601 of the assembly 60 comprises an interface portion 668 and 669 disposed away from the base of the conductor that is urged against the contact on the second circuit board. Further, each row 600, 601 of assembly 60 is preferably assigned a separate power polarity, e.g., row 601 might be assigned negative power polarity and row 600 might be assigned a positive power polarity. The conductors of the first row 600 and the second row 601 are thereby interleaved to form conductor pairs resulting in a low inductance power path.

Each of the conductors 600, 601 are held in place by an assembly such as overmold frame assembly 602 having an outer portion 602A and an inner portion 602B. In the illustrated embodiment, the assembly holds the z-axis compliant conductors in place about at least a portion of the periphery of the power dissipating device. Hole 667 is an alignment feature that may be desirably placed in the molded assembly 60 to align the assembly 60 to the PCB (e.g. PCB 120) during soldering.

FIG. 6B illustrates an isometric view of a pair of spring contacts 600A, 601A in the scissor configuration. The base 612 of each contact in the tow of contacts is extended to overmold 602 as described in the preceding paragraph to simplify assembly. In this arrangement, overmold outer portion 602A and overmold inner portion 602B are desirably joined at their respective ends to form the overmold assembly. An advantage of this configuration is that there is no resulting net torsional force about the y or z axes.

FIG. 6C is a section view (section A—A illustrated in FIG. 6A) presenting an example where the scissor contacts described above are arranged in a stackup 61 to deliver power from a power conversion PCB 608 to a processor substrate 609. The circuit pads 610 on PCB 608 require isolation between adjacent pads in the y-direction, because they will have alternating positive and negative power polarities. However, of significant importance is that contacting pads 605 and 606 on the processor substrate 609 can be arranged to be a continuous linear pad in the y-direction. This provides for relaxed tolerances in the alignment of the processor substrate 609 to the power conversion substrate 608 or PCB, and reduces the net torsional force on the two substrates. Note that bypass capacitor 607 may be installed beneath the contact arrangement 61 in a manner similar to that as described in FIG. 3.

One technique of reducing the effective inductance of a multi-conductor connector is to assign adjacent conductors opposing current polarities. The magnetic fields of the opposing currents partially cancel each other, thus reducing the effective inductance of the overall connection. However, the effectiveness of this configuration is strongly dependent upon the configuration of the multiple conductors. In a simple configuration wherein the opposing faces of adjacent conductors are relatively narrow compared to their separation, the magnetic coupling between the conductors does not provide a substantial amount of magnetic field cancellation. However, if the separation distance between the substrates in a parallel plane connection scheme such as illustrated in FIG. 6C is small relative to the width of the conductors, then the magnetic field coupling between the planes becomes more significant, thus resulting in a lower inductance. This effect can be enhanced by arranging the conductors in each row 600, 601 of the connector in an opposing configuration as shown in FIG. 6B. Then, the current from one pair of conductors (e.g. 600A and 601A) now flows across each end of the connector bases and in internal planes of the substrates 608 and 609. This current magnetically couples with the current flowing in the non-base portions of the scissored conductors (600A and 601A), reducing the overall inductance of the connection between substrates 609 and 608. For the effective inductance of this scissored arrangement to be less than the effective inductance of a non-scissored arrangement, the angle that the conductors make with the PCB/substrate plane must be less than a particular value $\theta = f(t, w, s)$ wherein t is the conductor thickness (here, assumed uniform), w is the width (also assumed uniform) and s is the separation between adjacent conductors.

Figure 6D:
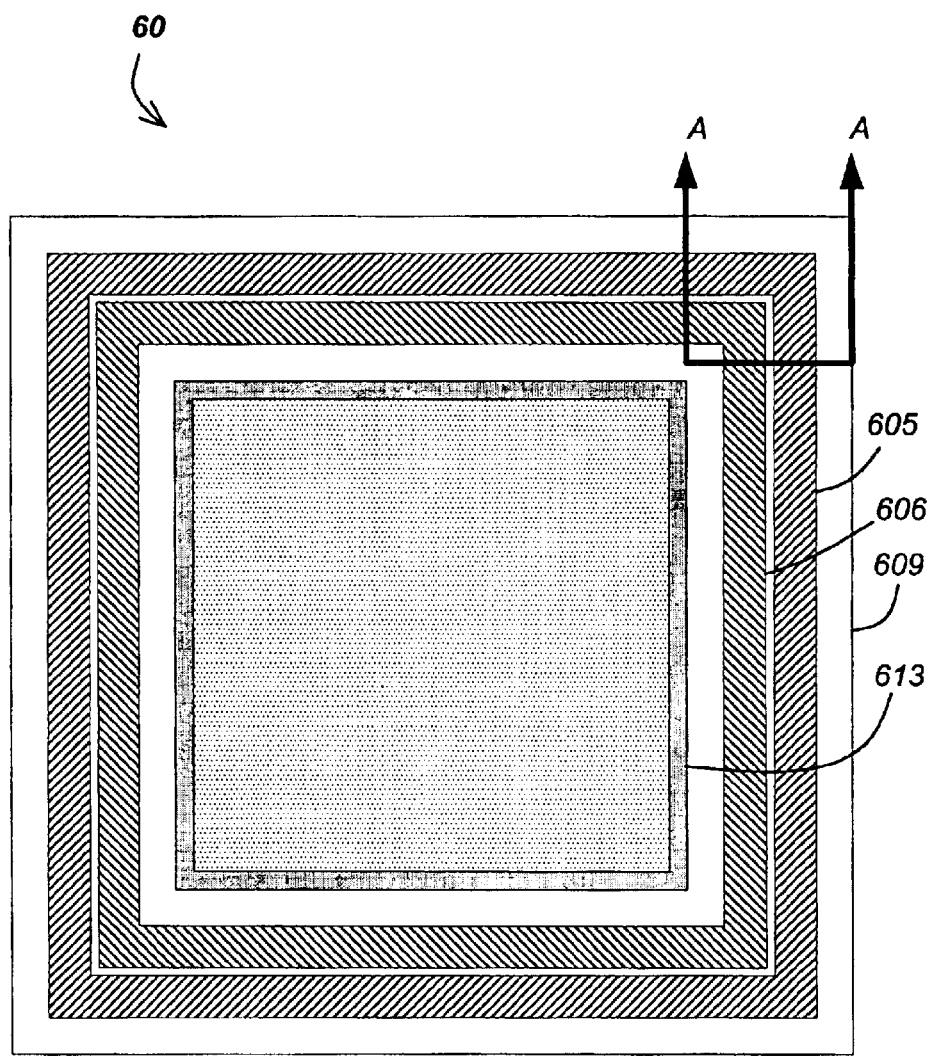
FIG. 6D is a plan view of the substrate in the embodiments illustrated in FIGS. 6A–6C.

FIG. 6D is a plan view of substrate 609 further illustrating the concept of the continuous pads 605 and 606 that surround power dissipating device 613. In the illustrated embodiment, the pads 605 and 606 are formed into a continuous rings, one inside the other.

Figure 6E:
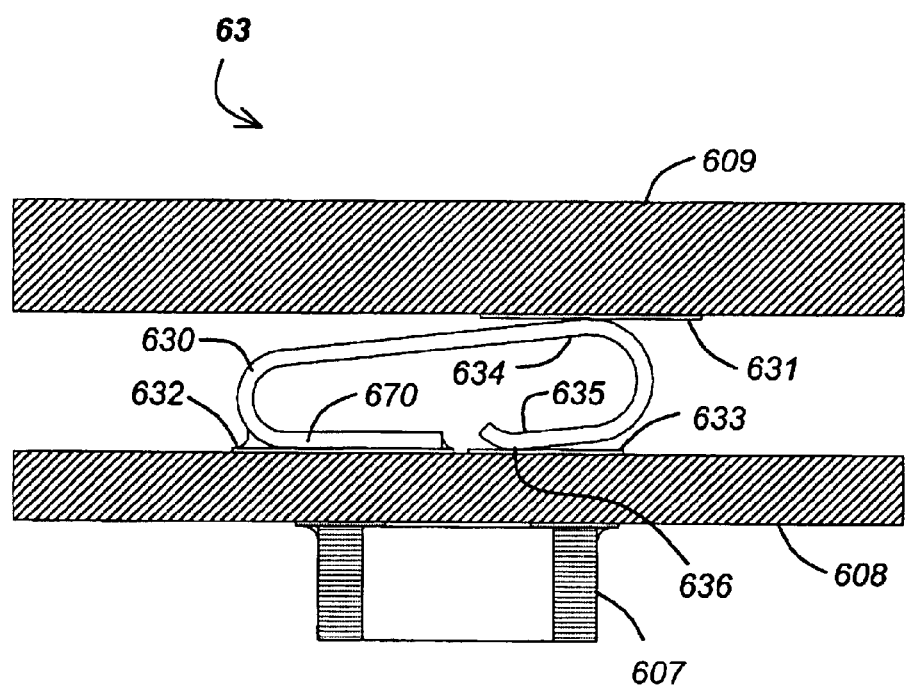
FIG. 6E is a diagram illustrating an another embodiment of the z-axis compliant conductors and contact pads on the first circuit board.

FIG. 6E illustrates a variation on the scissor contact design described in FIGS. 6A–6C. A base portion 670 of an elongated z-axis compliant conductor 630 (of a scissor pair) is soldered to pad 632 on PCB 608. The upper cantilevered beam portion 634 of compliant conductor 630 is pressed against contact pad 631 of substrate 609 as previously described. However, in this configuration, rather than the secondary contact wrapping around and returning to the top surface of the base 502, the contact 630 wraps around portion 635 of compliant conductor 630 returning to a separate contact pad 633 on PCB 608. Although both contact pads 632 and 633 are in electrical communication with the same power conditioning circuit, (e.g. through vias and conductive layers in the substrate 609) the advantage of this configuration is that the mating surfaces 636 of contact pad 633 and contact portion 635 are not involved in the soldering process and as a consequence there is no risk that solder used to couple the base 670 of the conductor 630 to the pad 632 may flow into the contact region of the secondary contact 633. Additionally, because the secondary contact is further removed from the initial contact path there is less mutual coupling between the two contact paths which results in a lower overall connection inductance.

Figure 6F:
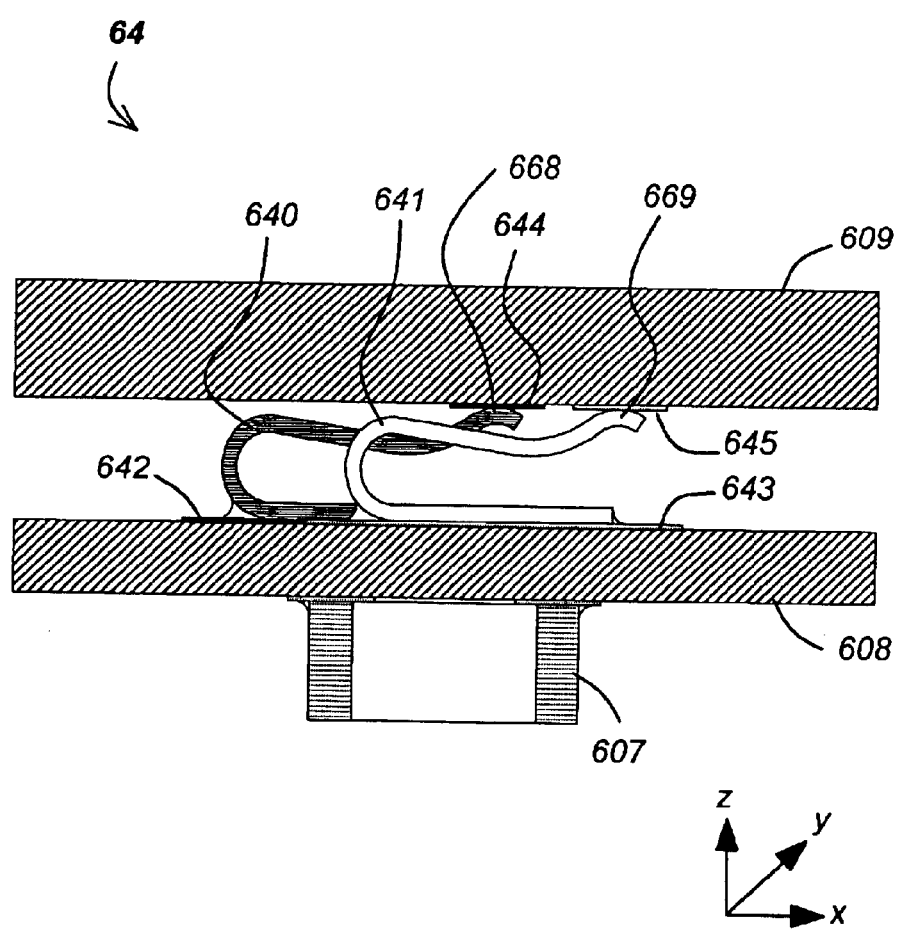
FIG. 6F is a diagram illustrating another embodiment of the invention in which a continuous linear contact pads on the second circuit board are used without opposing scissor configuration z-compliant conductors.

FIG. 6F illustrates another embodiment of the present invention. In this embodiment, the stackup configuration 64 includes a first and second set of U-shaped z-axis compliant conductors (640 and 641, respectively) that are displaced from one another along the x-axis. The x-axis displacement allows contact pads 644 and 645 to be constructed in a continuous linear fashion on substrate 609 similar to the embodiment shown in FIGS. 6A, 6B and 6C, without requiring that the first and second set of conductors 640, 641 be oriented 180 degrees from each other. Z-axis compliant conductor 640 is soldered or otherwise connected to contact pad 642 on PCB 608 which is connected to one polarity of a power circuit (e.g., as shown in FIGS. 3A–3C) while z-axis compliant conductor 641 forward of conductor 640 and displaced from conductor 640 in the x-axis is also soldered or otherwise electrically coupled to contact pad 643 of a second polarity of a power circuit (also as shown in FIGS. 3A–3C).

The embodiments illustrated in FIGS. 6A–6F have numerous advantages. First, as described above, they permit substantial misalignment between the z-axis compliant conductors and the contacts on the opposing circuit boards in the direction of the adjacent conductors (e.g. in the y-axis direction in FIGS. 6B–F). Second, a nearly contiguous line of vias disposed through the pad region can be used for connecting the contacts to conductive planes within the circuit board, thus allowing a lower interconnect impedance in the substrate 609. Third, as described further below with respect to FIGS. 6I and 6J, the arrangement shown in FIGS. 6A–6C allows for improved electromagnetic coupling between each spring over arrangements where each of the z-axis compliant conductors are arranged in a single row.

Figure 6G:
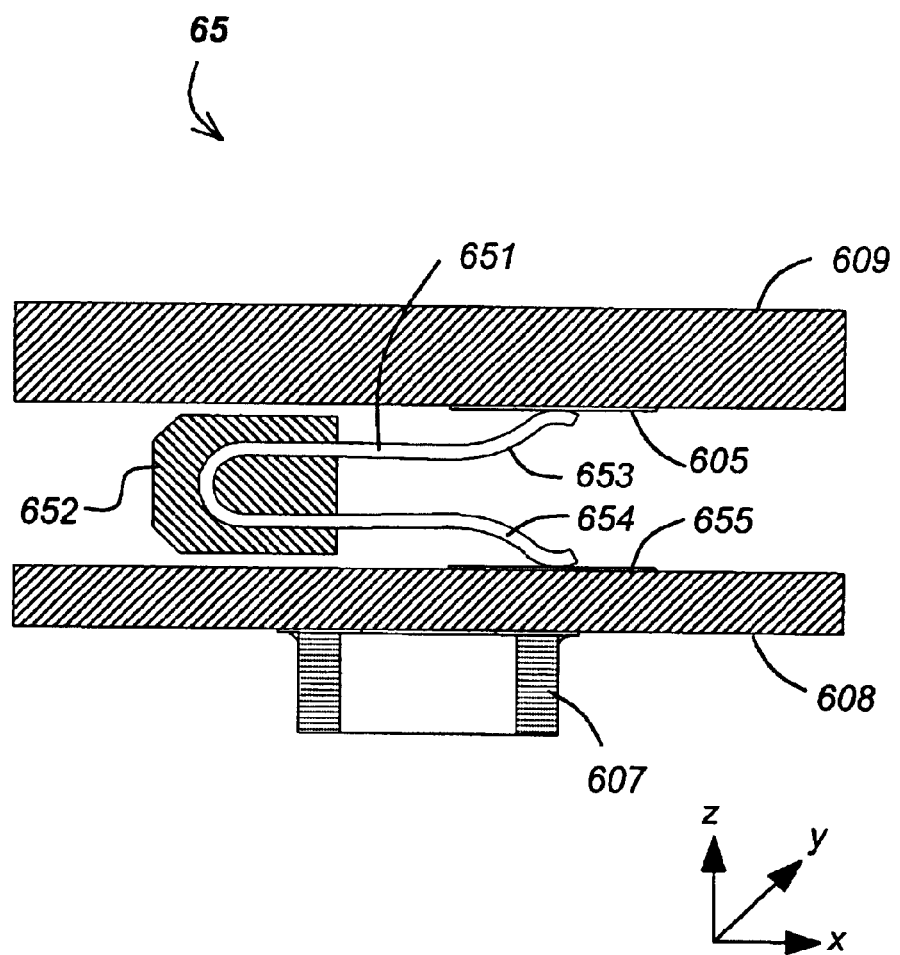
FIG. 6G illustrates an embodiment of the present invention wherein the z-axis compliant conductors are not permanently affixed to any contacts on either the first circuit board or the second circuit board, thus permitting easy disassembly.

FIG. 6G illustrates a stackup configuration 65 in which the z-axis compliant conductor is removably attached (e.g. not soldered, bonded, or otherwise permanently attached) to either substrate 609 or PCB 608. In this configuration insulating (plastic, for example) overmold element 652 retains compliant conductor 651. Additional conductors (disposed in the y direction) are also retained by plastic element 652, forming a contact assembly that can be installed at the time of assembly of substrate 609 and PCB 608. As before, section 653 of compliant conductor 651 is pressed against contact pad 605 on substrate 609 and section 654 is pressed against contact pad 655 of PCB 608 completing one half of a power circuit between PCB 608 and substrate 609. The other half of the power circuit is completed by the adjacent conductor (displaced from conductor 651 in the y-axis). It is also recognized that an arrangement such as that which is shown in FIGS. 6F and 6G may also be applied in a similar manner as to the arrangement in FIG. 6C, with opposing or staggered conductors, using a multiple-part or shaped overmold.

Figure 6H:
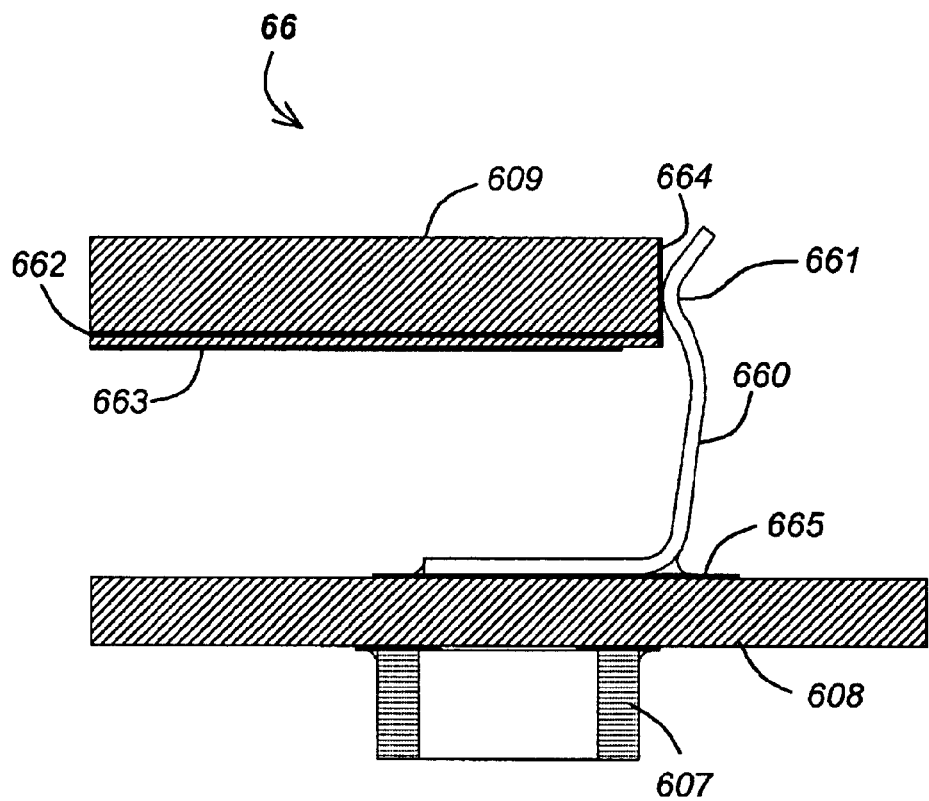
FIG. 6H is a diagram presenting another embodiment of the present invention in which an x-axis compliant conductor interfaces with edge contacts on the second circuit board.

FIG. 6H illustrates still another arrangement wherein a compliant conductor may be used to provide power to a power dissipating device. In this arrangement, the plurality of first circuit board contacts 664 are disposed on the edge of the first circuit board. While only a single contact 664 is shown, a plurality of contacts, electrically isolated from one another and distributed in the y-axis, are disposed on the edge of the first circuit board 609. Section 661 of each of the x-axis compliant conductors 660 is urged against an adjacent side contact 664 which is electrically connected to internal conductive plane 662 of substrate 664. The internal conductive plane 662 is electrically coupled to the power dissipating device (via conductive planes, vias, and the like) to feed power to a power dissipating device disposed on the substrate 664. The other end of conductor 660 is soldered or otherwise electrically connected to contact pad 665 of PCB 608. Electrical connection between the contact pad 665 and to power layers of the PCB 608 can be made by a combination of plated through holes, vias and interconnecting conductive layers in the PCB 608.

Only one contact is shown in the section view of FIG. 6H. However, it will be understood that a multiplicity of compliant contacts 660 can be arranged along the y-axis and the multiple compliant contacts 660 can interface with a corresponding multiple of edge contacts 664, each electrically isolated from the others, to form multiple power connections between PCB 608 and substrate 664, wherein alternating contacts 664 connect to alternate polarity power plane 663. In a preferred embodiment, the contacts 660 and related structures circumscribe all sides of substrate 664 to form a very low impedance power interconnect path between PCB 608 and substrate 664. The conductor 660 can also be designed with a bend to restrain the first circuit board 609 in place, if desired.

Figure 6I:
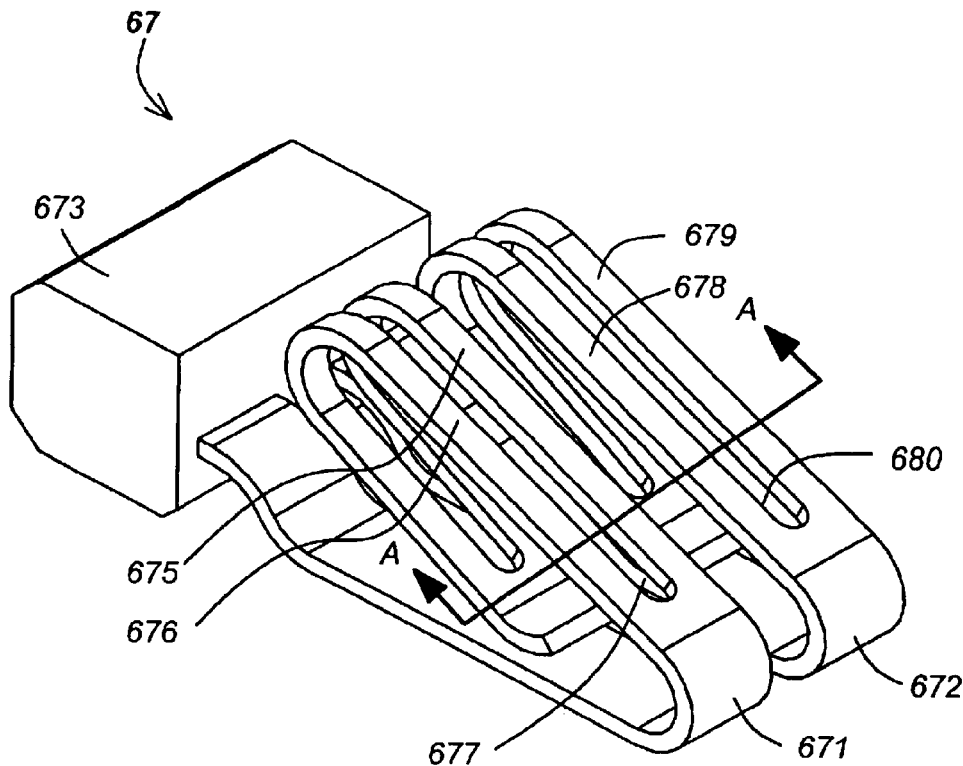
FIG. 6I is a diagram presenting another embodiment of the z-axis compliant conductors having reduced impedance.

FIG. 6I illustrates one embodiment of the z-axis compliant conductor design. The illustrated z-axis compliant conductor pair which form a part of a larger array of conductors. Conductor 671 carries current in of one polarity while adjacent conductor 672 carries current in an opposite polarity. As before, a practical method of assembling such an array is to join the individual conductors with an overmolded plastic resin 673 that supports the conductors 671 and 672. Of note is that each of the conductors 671 and 672 are provided with a slit 677 and 680 which creates two separate current paths in conductors 671 and 672 over a substantial portion of the length of the conductors. These separate current paths are identified as 675, 676 for conductor 671 and 678 and 679 for conductor 672. The result of this arrangement is to reduce the overall connection inductance between a PCB and a substrate.

Figure 6J:
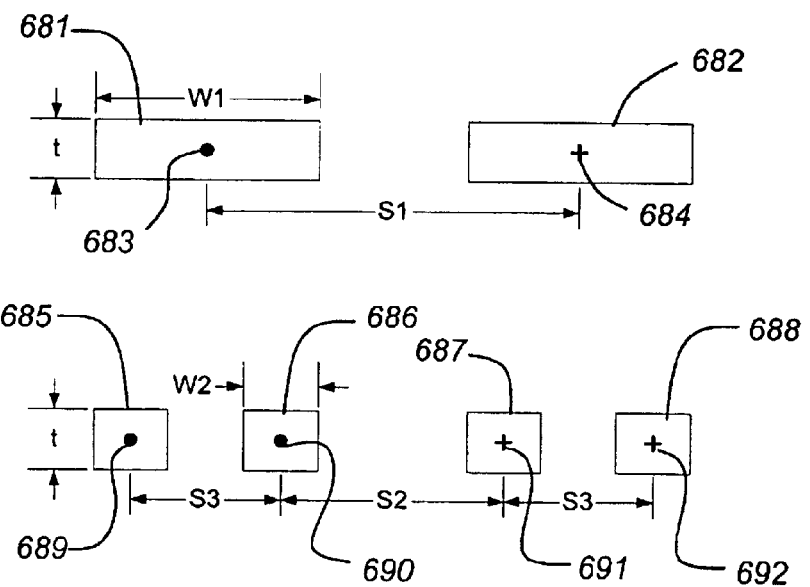
FIG. 6J is a diagram presenting a cross section of the embodiment illustrated in FIG. 6I.

The reduced connection inductance of FIG. 6I can be explained by referring to FIG. 6J which illustrates a section view through the conductor sections as indicated by A—A. The top portion of FIG. 6J illustrates the arrangement where there is no slit, forming conductors 681 and 682, whereas the bottom portion illustrates the arrangement where the slits 677 and 680 form conductors 685, 686, 687 and 688. The inductance of each conductor, 681 or 682, in the configuration without the slit is:

$$L_{681,682} = 2 \cdot \ln \frac{S1}{0.2235 \cdot (t + W1)}$$

For the configuration with the slit 677, 680, the inductance of the pair of conductors 685 and 686 or 687 and 688 can be determined by calculating the inductance of each conductor and then noting that the conductor pair are in parallel with one another. The general equation for the inductance of a multi-conductor configuration where the current in all conductors is equal (this is the case since, by symmetry, a continuous set of paired contacts as shown in FIG. 6I must have the same current in each path) is:

$$l = 2 \cdot \ln \frac{GMD}{GMR} 10^{-7}$$

where GMD is the geometric mean distance from the first group of conductors to the second group of conductors and GMR designates the geometric mean of the individual geometric mean radii of the group together with the wire-to-wire distances among the conductors of that group. Applying the forgoing relationships yields an expression for the inductance of the conductors 685, 688, 686, 687 is as follows:

$$L_{685,688} = 2 \cdot \ln \frac{\sqrt{(S2+S3)(S2+2 \cdot S3)}}{\sqrt{.2235 \cdot (t+W2) \cdot S3}} 10^{-7}$$

$$L_{686,687} = 2 \cdot \ln \frac{\sqrt{S2 \cdot (S2+S3)}}{\sqrt{.2235 \cdot (t+W2) \cdot S3}} 10^{-7}$$

The pair inductance then is simply $L_{685,688}$ in parallel with $L_{686,687}$:

$$L_{pair} = \frac{L_{685,688} \cdot L_{686,687}}{L_{685,688} + L_{686,687}}$$

When the above equations are applied to practical conductor geometries, substantial reductions in inductance can be achieved by providing a slot in the contact arrangement as shown in FIG. 6I.

It is understood that in all of the previously described conductor embodiments, it is important to design the contact arrangement such as to avoid rotational forces that may be imparted to the base of the contact wherein the base is soldered to one of the substrates. The reason for this is to eliminate normal forces that are not in compression (along the z-axis) which apply a torsional force to the base portion of the conductor, and which may result in solder creepage, and ultimately the failure of the solder joint between the base of the conductor and the substrate pad. This can be accomplished by designing the conductor so that the interface portion that contacts the second circuit board contact and the base portion that contacts the first circuit board contacts are disposed substantially only along the z-axis from one another (e.g. either above or below each other, but not displaced in the x-y plane). This can be achieved, for example as demonstrated in the foregoing description where the compliant conductor beam is folded over the base of the conductor.

It is also desirable to design the conductor and contacts to cooperatively interact with each other to minimize contact resistance and insure good electrical connection. This can be accomplished, for example, with the S-shaped conductor portions (such as that which is illustrated in FIGS. 4A and 4B, or other electrical contact-enhancing designs).

Figure 7:
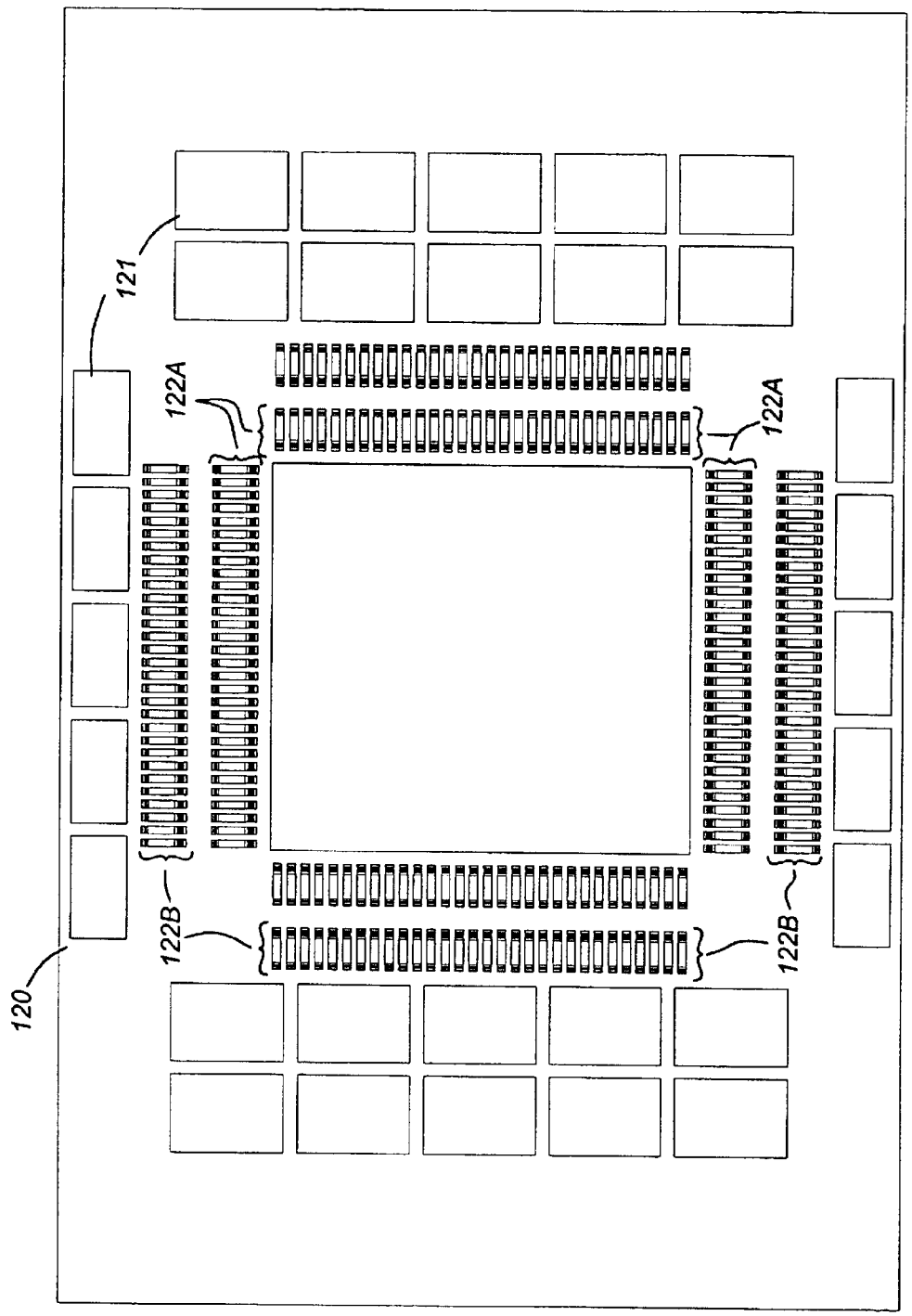
FIG. 7 is a plan view illustrating another embodiment of the present invention utilizing multiple rows of z-axis compliant conductors.

FIG. 7 is a diagram illustrating a plan view (looking up into PCB 120) of another embodiment of the present invention. As in previous embodiments, the z-axis compliant conductors, as well as the contacts on the PCB and substrate that interface with the z-axis compliant conductors are disposed about the periphery of the power dissipating device. Further, the power and ground (or positive and negative power) conductive paths formed by the conductors and contacts were interleaved to reduce inductance. In the embodiment illustrated in FIG. 7, the set contacts on the first circuit board and the set of contacts on the second circuit board are separated into two subsets of contacts, and the z-axis compliant conductors are separated into two subsets of conductors as well. As was the case in the embodiments discussed previously, the first subsets of the contacts on the first and second circuit boards and the z-axis compliant conductors are disposed circumferentially around the power dissipating device. However, in this embodiment, the second set of contacts on the first and second circuit boards and the z-axis compliant conductors are disposed circumferentially around the first subset of contacts on the first and second circuit boards and the z-axis compliant conductors. The result is two "rings" of circuit paths from the first circuit board, through the first subset 122A and the second subset 122B of z-axis compliant conductors, to the second circuit board, wherein each ring includes a plurality of interleaved ground and power paths. The multiple "rings" of contacts 122A and 122B, one behind and disposed circumferentially about the other, are used to achieve even lower interconnect impedance between the PCB 120 and the substrate 130. This is accomplished at least in part because each of the multiple rows of contacts 122A and 122B effectively couple in parallel.

Figure 8:
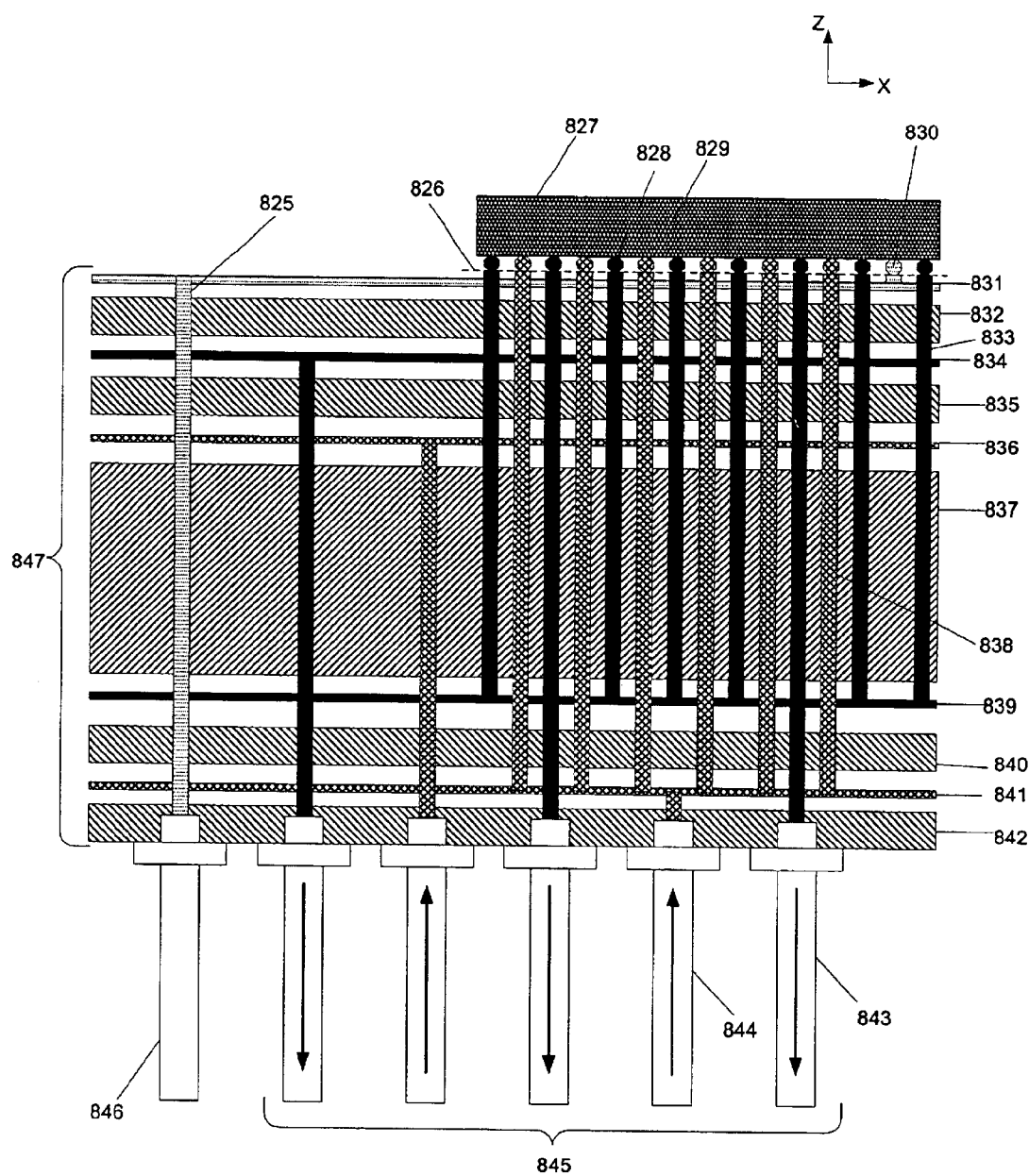
FIG. 8 is a diagram presenting a prior art stack up arrangement of a microprocessor substrate.

One of the advantages of the present invention is that it permits simplification of the power/ground/signal interconnect between related printed circuit boards. FIG. 8 is a diagram illustrating a typical stackup arrangement 5 having power/ground/signal interconnect contention problems. The substrate 847 of the stackup 5 includes conductive circuit layers 831, 834, 836, 839, and 841, and insulating layers (832, 835, 837, 840, and 842) reside between the circuit layers 831, 834, 836, 839, and 841. A surface layer 826 typically is used for making contact through bumps to power dissipating device 827. The number of insulating and conducting layers may be increased or decreased depending upon the signal and power demands of the power dissipating device.

In most integrated circuit packages, power enters from pins 845 disposed on the opposite side of the power dissipating device 827 and is distributed through power vias 833, 838 in the substrate 847. The power dissipating device 827 has connectors for power and ground (828, 829 shown) which connect to a surface layer 826 of substrate 847. To ensure a low impedance DC power distribution path, multiple power vias 838 and ground vias 833 must pass through substrate 847 to connect with multiple power and ground pins (e.g. 844 and 843 respectively). Power and ground is distributed from contacts 845 including lower contacts 844 and 843 (which may be a large numbers of pin connections in a socket).

Power contacts 844 are coupled to one or more power planes 841 and 836 by one or more power vias 838, 848, and thence to power bumps 829. Similarly, ground contacts 843 are coupled to one or more ground planes 839, 834 by one or more ground vias 849 and thence to ground bumps 828. Signal contacts, e.g., 830, connect to conductive signal layers 831 and then typically distribute signals to the periphery of the device through signal vias, e.g., 825, and then down into a signal contact, e.g., 846, for distribution to other components communicatively coupled to the contact 846 (for example, a motherboard).

Figure 9:
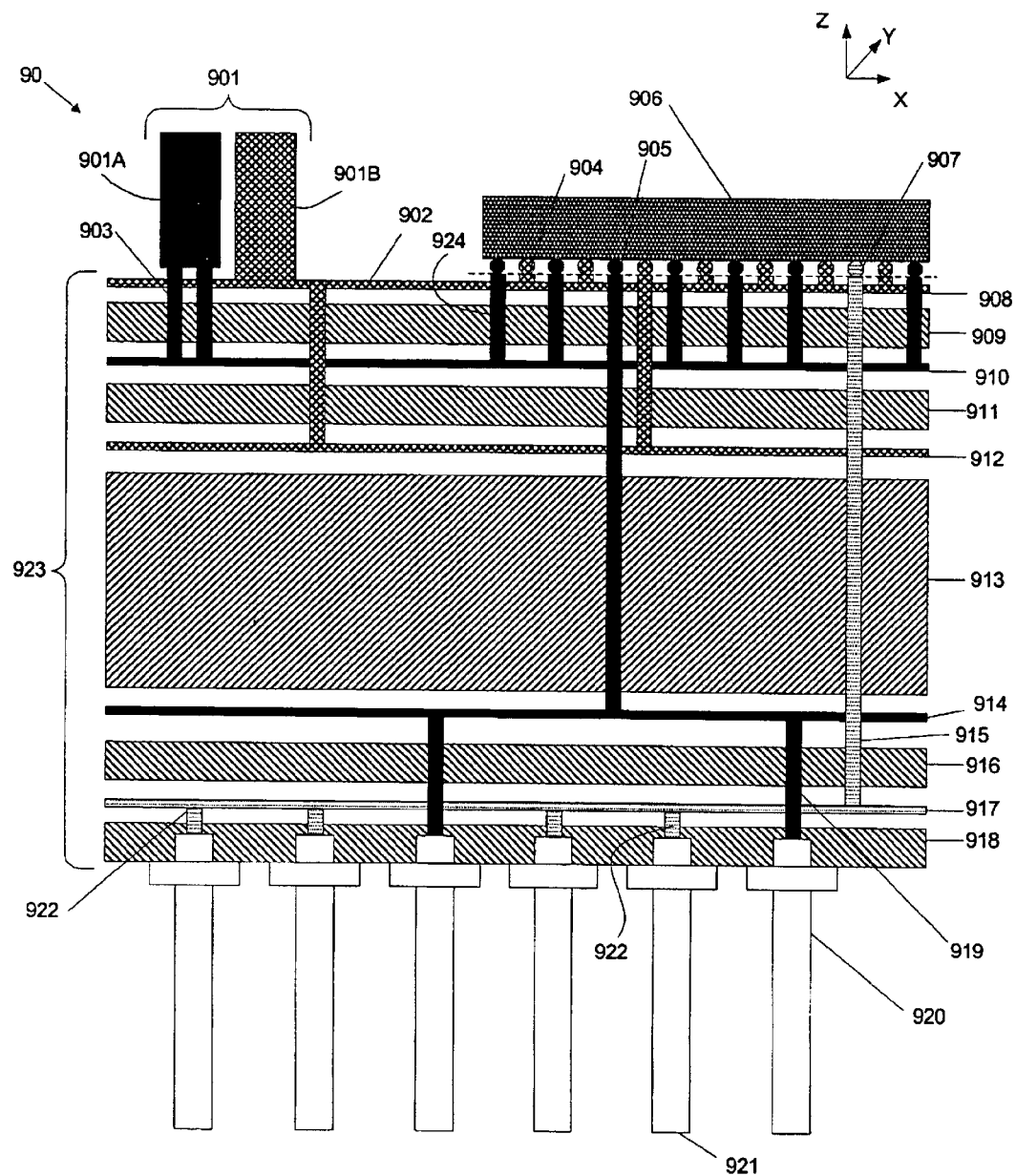
FIG. 9 is a diagram presenting an improved power distribution system made possible by the present invention.

FIG. 9 is a diagram of an improved power distribution system configuration 90 in which power taps 901 are provided through the top side of substrate 923 instead of through the bottom. Power taps 901 represent where the compliant conductors make contact to the pads on the top surface of the substrate to distribute power from a power source to the power dissipating device 906 on substrate 923. Power dissipating device 906 on substrate 923 is connected as described in FIG. 8, except that that power layer 908 does not require substantial via distributions to lower layers such as layers 912 and 914. Power enters power taps 901 whereby the power layer 902 connects to the right power tap 901B and the ground plane 910 connects to left power tap 901A through via 903. Ground plane 910 then connects to vias 924, which in turn connect to ground bumps 905 on power dissipating device 906. Additionally, power is routed from power plane 902 to power bumps 904 on power dissipating device 906. This completes the power distribution path for the substrate stackup 923 from the source to the load, e.g., the power dissipating device 906. Note that for illustrative purposes, the bumps 904, 905 on power dissipating device 906 are raised slightly off of the power plane 902.

Signal connections from power dissipating device 906 may now be routed to one or more bumps 907, which connect to one or more vias 915 which route to one or mote signal planes 917. Other signals may now be distributed to pin connections (or alternatively other bump interconnects such as in an interposer to substrate connection) for connection to pins (such as 921 through vias similar to 922) which connect to a socket-like interconnect or PCB. Ground connections 920 through vias 919 and ground plane 914 may now be used for signal reference only rather than for power distribution as well. As in FIG. 8, insulation layers 909, 911, 913, 916, and 918 make up the rest of the substrate 923 construction.

This embodiment allows for a reduction in the number of layers because that power distribution is facilitated predominately through the top two layers 908, 910 of substrate 923. Additionally, since the power and ground conductive layers are disposed on a power dissipating device side of substantially all of the conductive signal layers, the passage of power through the planes of the conductive signal layers is minimized. The distribution of signals the x-y planes is also improved. This is due to elimination or reduction of the number of vias for power and ground distribution in substrate 923 that would normally have been used to connect to pins 845 as described in FIG. 8. Through elimination of the power and ground vias in these lower layers (utilizing the top two layers), x-y plane real estate is henceforth available for additional signal routing in the lower layer(s), e.g., 917.

Figure 10:
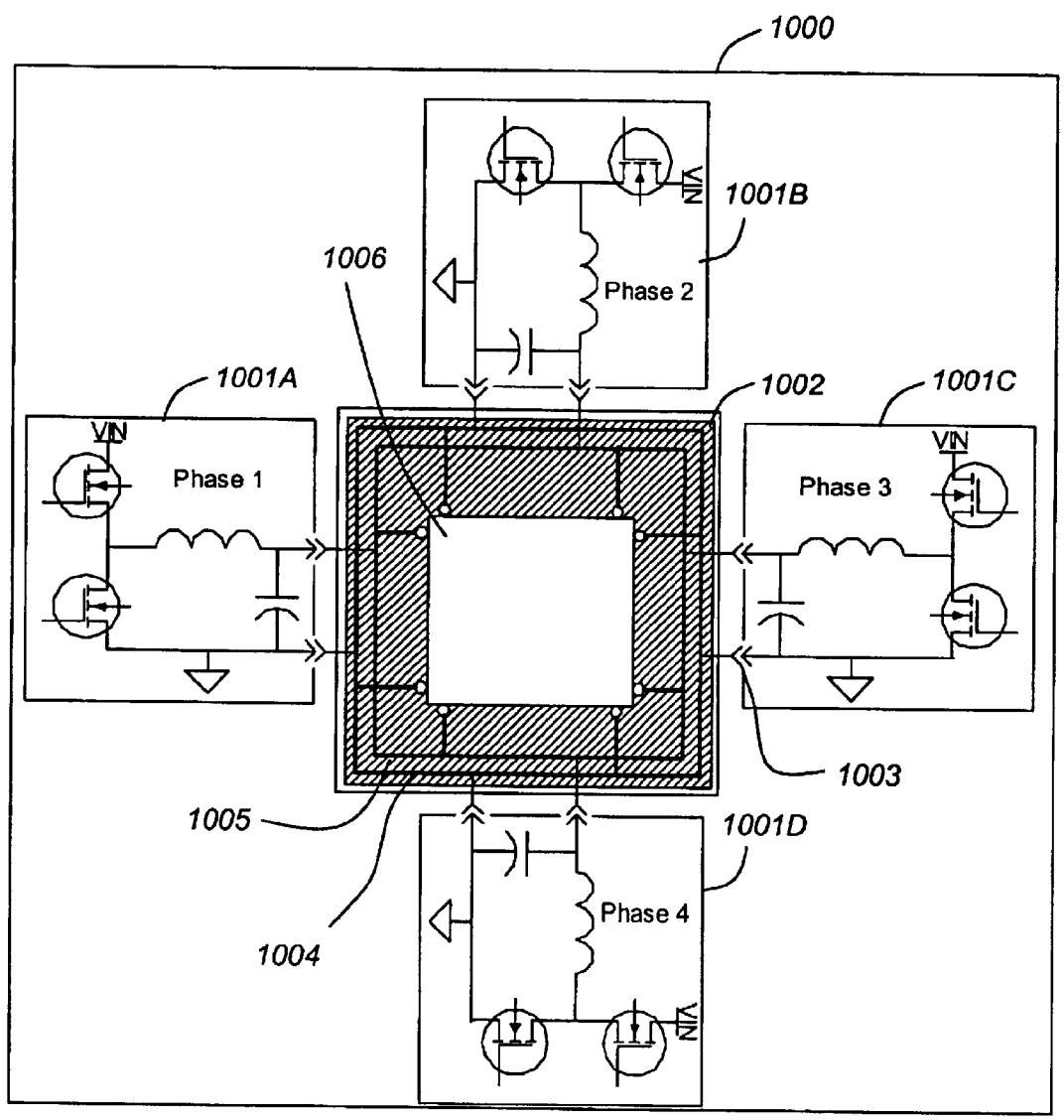
FIG. 10 is a diagram illustrating an embodiment of the present invention wherein the power conditioning unit is partitioned to provide multiple power signals, each differing in phase, and each being distributed to different sides of the power dissipating device.

FIG. 10 illustrates an embodiment of the present invention wherein the power conditioning circuit or module 1000 includes a plurality of power conditioning submodules 1001A–1001D, which together provide a power signal having a plurality of phases. In this embodiment, the topology of the power conditioning circuit 1000 delivers power to a plurality of compliant conductors 1003 advantageously arranged to apply different phases of the power signal to different sides of the power dissipation device 1006. The power dissipation device 1006 is shown connected to power and ground planes 1005 and 1004 located on substrate 1002. It is understood that the power dissipation device/substrate 1006/1002 resides at a level either above or below the voltage regulation module 1000. Power and ground planes 1005 and 1004 then connect to VRM 1000 through compliant conductors 1003 which circumscribe power dissipating device 1006 wherein the ground of each phase connects to ground plane 1004 and the voltage out of each phase connects to the power plane 1005.

Topologically, each phase is represented by an input voltage (VIN) to two FET switches and an L-C output circuit. In the illustrated embodiment, each phase operates 90 degrees out of phase with the other adjacent to it. Because of the organization of the phases and due to the placement of the compliant conductors 1003 one may lay out the PCB of VRM 1000 in this topological fashion which improves routing and interconnect impedance due to the partitioning of each phase about the periphery of the power dissipating device. This allows the inductors, capacitors, and electronic drive circuitry (FETs, etc.) of each phase to be logically placed adjacent to a linear compliant conductor 1003 resulting in a superior layout and interconnect scheme which is synergistic with the topology of the VRM itself.

While the foregoing embodiment is described with respect to a four phase power signal applied to each of a four-sided power dissipating device, the principles described above can be applied to embodiments with fewer or more than four sides and power signal phases, or to embodiments with non-polygonal configurations (e.g. circular, for example).

In summary, the forgoing discussion discloses a low impedance power interconnect between the power dissipating device and the power source. The impedance of the power interconnect is low in inductance and resistance throughout a wide frequency band in order to ensure that the voltage drops across the interconnect are mitigated across it during dynamic switching of power. It can also be seen that the interconnect should provide large 'z' axis compliance. The arrangement also reduces or eliminates the need for supporting electronic components on the device substrate because the interconnect impedance between the power conditioning circuit and the device can be reduced to the point where all or most of the support electronics can be located on the substrate having the power conditioning circuit itself.

The present invention also significantly reduces contentious routing of power to the power dissipating device because the power interconnect impedance is significantly lowered and can be touted to one or more sides of the power dissipating device.

Further, since the upper layers of the power dissipating device substrate are used primarily for power distribution, the area on additional layers beneath the upper layers are free for use with for signal and other conductive interconnects. These other conductive interconnects can connect other interconnects or substrates beneath or above the stackup.

Conclusion

The foregoing description of the preferred embodiment of the invention has been presented for the purposes of illustration and description. It is not intended to be exhaustive or to limit the invention to the precise form disclosed. Many modifications and variations are possible in light of the above teaching. For example, the substrate contacts and compliant conductors can be disposed proximate the outer periphery of the substrates rather than proximate the power dissipating device as described herein. Further, the compliant conductors may be rigid instead of compliant, while still permitting the detachable design described herein. Also, the compliant conductors can be integrated with other assemblies such as a socket, which might be used to interconnect signals to the microprocessor. Further, mote than one linear set of contacts can be arranged to circumscribe the power dissipating device in a manner to increase the total number of contacts providing power and/or ground to the device, thus reducing the overall connection inductance and increasing total current carrying capability. The z-axis compliant contacts can also be configured so as to permit acceptance of stackup height variations.

It is intended that the scope of the invention be limited not by this detailed description, but rather by the claims appended hereto. The above specification, examples and data provide a complete description of the manufacture and use of the composition of the invention. Since many embodiments of the invention can be made without departing from the spirit and scope of the invention, the invention resides in the claims hereinafter appended.

What is claimed is:

1. An apparatus for providing power to a power dissipating device, comprising:
    a first circuit board having a power conditioner circuit, the first circuit board having a first side and a second side having a plurality of first circuit board contacts thereon, the first circuit board contacts including a first set of first circuit board contacts communicatively coupled to a first power conditioner circuit connector and a second set of first circuit board contacts communicatively coupled to a second power conditioning circuit connector;
    a second circuit board having:
        the power dissipating device mounted thereto;
        a plurality of second circuit board contacts disposed on a first side of the second circuit board, the second circuit board contacts including a first set of second circuit board contacts communicatively coupled to a power dissipating device first connector and a second set of second circuit board contacts communicatively coupled to a second connector of the power dissipating device;
    a plurality of z-axis compliant conductors disposed at least partially between the first circuit board contacts and the second circuit board contacts; and wherein the plurality of z-axis compliant conductors includes a first set of z-axis compliant conductors in contact with and disposed between the first set of first circuit board contacts and the first set of second circuit board contacts, and a second set of z-axis compliant conductors disposed in contact with and between the second set of first circuit board contacts and the second set of second circuit board contacts, and
    wherein the first set of first circuit board contacts, the first set of z-axis compliant conductors, and the first set of second circuit board contacts define a plurality of first paths from the first circuit board to the second circuit board and wherein the second set of circuit board contacts, the second set of z-axis compliant conductors, and the second set of second circuit board contacts define a plurality of second paths from the first circuit board to the second circuit board.

2. The apparatus of claim 1, wherein the plurality of first paths and the plurality of second paths together provide a low impedance power path from the first circuit board to the second circuit board.

3. The apparatus of claim 1, wherein the number of first circuit paths and second circuit paths and a distance between the first circuit board and the second circuit board is selected to provide an aggregate circuit path impedance of less than approximately 100 pico-henries.

4. The apparatus of claim 1, wherein the plurality of first paths are ground paths and the plurality of second paths are power paths.

5. The apparatus of claim 1, wherein the plurality of first paths are positive polarity paths and the plurality of second paths are negative polarity paths.

6. The apparatus of claim 1, wherein the plurality of z-axis compliant conductors are disposed adjacent more than one side of the power dissipating device.

7. The apparatus of claim 1, wherein:
    the plurality of first circuit board contacts comprises a first subset of first circuit board contacts and a second set of first circuit board contacts;
    the plurality of second circuit board contacts comprises a first subset of second circuit board contacts and a second set of second circuit board contacts;
    the first set of z-axis compliant conductors comprises a first subset of first set of z-axis compliant conductors and a second subset of the first set of z-axis compliant conductors;
    the second set of z-axis compliant conductors comprises a first subset of the second set of z-axis compliant conductors and a second subset of the second set of z-axis compliant conductors;
    the first subset of first circuit board contacts, the first subset of the second circuit board contacts, the first subset of the first set of z-axis compliant conductors, and the first subset of the second set of z-axis compliant conductors are disposed circumferentially around the power dissipating device; and
    the second subset of first circuit board contacts, the second subset of the second circuit board contacts, the second subset of the first set of z-axis compliant conductors and the second subset of the second set of z-axis compliant conductors are disposed circumferentially around the first subset of first circuit board contacts, the first subset of the second circuit board contacts, the first subset of the first set of z-axis compliant conductors, and the first subset of the second set of z-axis compliant conductors, respectively.

8. The apparatus of claim 1, wherein:
the first side of the second circuit board is an edge of the first circuit board
the plurality of z-axis compliant conductors are disposed circumferentially about the second circuit board.

9. The apparatus of claim 1, wherein the plurality of z-axis compliant conductors are permanently attached to the plurality of first circuit board contacts or the plurality of second circuit board contacts.

10. The apparatus of claim 1, wherein the first circuit board is detachable from the second circuit board.

11. The apparatus of claim 1, wherein at least one of the plurality of first paths and the plurality of second paths is a power control path or a signal path.

12. The apparatus of claim 1, wherein at least one of the z-axis compliant conductors comprises a cantilevered beam.

13. The apparatus of claim 1, wherein at least one of the z-axis compliant conductors is U-shaped.

14. The apparatus of claim 1, wherein:
at least one z-axis compliant conductor comprises a base portion contacting one of the first circuit board contacts and an interface portion contacting one of the second circuit board contacts; and
the interface portion is disposed substantially along the only the z-axis from the base portion, thereby reducing torsional force on the base portion.

15. The apparatus of claim 1, wherein:
the first set of z-axis compliant conductors are removably in contact with the first set of first circuit board contacts and the first set of second circuit board contacts;
the second set of z-axis compliant conductors are removably in contact with the second set of first circuit board contacts and the second set of second circuit board contacts; and
the apparatus further comprises an insulating overmold disposed around at least a portion of the z-axis compliant conductors and between the first circuit board and the second circuit board, the overmold retaining the first set of z-axis compliant conductors in contact with and disposed between the first set of first circuit board contacts and the first set of second circuit board contacts, and a second set of z-axis compliant conductors disposed in contact with and between the second set of first circuit board contacts and the second set of second circuit board contacts.

16. The apparatus of claim 1, wherein at least one of the z-axis compliant conductors comprises:
a base portion having a first end and a second end distal from the first end;
a first U-shaped bend portion having a first end adjacent the second end of the base portion and a second end;
a upper shaft portion having a first end adjacent the second end of the first U-shaped bend portion and a second end distal from the first end;
a second U-shaped bend portion having a first end adjacent the second end of the upper shaft portion and a second end; and
a middle shaft portion, disposed between the base portion and the upper shaft portion, the third shaft portion having a first end adjacent the second end of the second U-shaped bend portion and a second end distal from the third end.

17. The apparatus of claim 1, wherein at least one of the z-axis compliant conductors comprises a contiguous elongated conductor folded into a compliant paper-clip shape.

18. The apparatus of claim 1, wherein at least one of the z-axis compliant conductors comprises a continuous elongated conductor folded into a base portion, an upper shaft portion, and a middle shaft portion between the base portion and the upper shaft portion.

19. The apparatus of claim 1, wherein the power conditioning circuit further comprises:
a capacitive element disposed on the first side of the first circuit board and at a location opposite at least one of the first circuit board contacts on the second side of the first circuit board.

20. The apparatus of claim 1, wherein the first set of z-axis compliant conductors are oriented in a first direction, and the second set of z-axis compliant conductors are oriented in a second direction rotated 180 degrees from the first direction.

21. The apparatus of claim 1, wherein:
the z-axis compliant conductors each comprise a base and an interface portion disposed away from the base along the z-axis; and
the interface portion of each of the first set of z-axis compliant conductors together define a first row of z-axis compliant conductors and the interface portion of each of the second set of z-axis compliant conductors together define a second row of z-axis compliant conductors displaced from the first row of z-axis compliant conductors along the x or y axis.

22. The apparatus of claim 1, wherein:
the first set of first circuit board contacts includes a first subset of first circuit board contacts and a second subset of first circuit board contacts; and
the first set of z-axis compliant conductors comprises a contiguous elongated conductor having a base portion communicatively coupled to one of the first subset of first circuit board contacts, a cantilevered beam portion communicatively coupled to one of the first set of second circuit board contacts, and a wrap-around portion communicatively coupled to one of the second subset of first circuit board contacts.

23. The apparatus of claim 1, wherein each of the z-axis compliant conductors is held in place between the first circuit board and the second circuit board by a frame about at least a portion of the periphery of the power dissipating device.

24. The method of claim 1, wherein:
the power dissipating device comprises a plurality of signal connectors, the plurality of signal connectors communicatively coupled to a plurality of signal pins disposed on a second side of the second circuit board by a plurality of signal vias disposed at least partially through the second circuit board and by conductive signal layers disposed within the second circuit board;
wherein the first set of second circuit board contacts is communicatively coupled to the power dissipating device first connector by a first conductive layer and one or more vias, and the second set of circuit board contacts is coupled to the power dissipating device second connector by a second conductive layer and one or more vias; and
wherein the first conductive layer and the second conductive layer are disposed on a power dissipating device side of substantially all of the conductive signal layers, thereby substantially minimizing the passage of power through signal interconnect planes.

25. The apparatus of claim 2, wherein at least of the z-axis compliant conductors comprises a slit forming a first current path and a second current path through a substantial portion of a length of the conductor, thereby reducing the inductance of the low impedance power path from the first circuit board to the second circuit board.

26. The apparatus of claim 4, wherein:

the plurality of ground paths are interleaved with the plurality of power paths.

27. The apparatus of claim 5, wherein the plurality of positive polarity paths are interleaved with the plurality of negative polarity paths.

28. The apparatus of claim 6, wherein:

the z-axis compliant conductors are at least partially contained within a socket mounted to the first circuit board.

29. The apparatus of claim 6, wherein:

the power dissipating device comprises a plurality of sides;

the power conditioner circuit provides power output signal having a plurality of phases, each phase at one of the sides of the power dissipating device.

30. The apparatus of claim 16, further comprising a bend portion having a first end disposed adjacent the second end of the third shaft portion and a second end distal from the first end and directed toward the second shaft portion.

31. The apparatus of claim 16 or 18, wherein the base portion has a first side affixed to the second circuit board, the upper shaft portion is disposed adjacent to the first circuit board, and the middle shaft portion contacts a second side of the base portion opposite the first side of the base portion, thereby forming a first conductive path through the upper shaft portion to the base and a second conductive path through the middle shaft portion to the base.

32. The apparatus of claim 19, wherein the capacitive element comprises a first connector communicatively coupled to the at least one of the first circuit board contacts, and a second connector communicatively coupled to another first circuit board contact adjacent the at least one of the first circuit board contacts.

33. The apparatus of claim 19, wherein the capacitive element comprises a first connector communicatively coupled to the at least one of the first circuit board contacts;

the capacitive element comprises a second connector communicatively coupled to another first circuit board contact; and wherein the at least one of the first circuit board contacts is a power contact and the another first circuit board contact is a ground contact.

34. The apparatus of claim 19, wherein the capacitive element comprises a first connector communicatively coupled to the at least one of the first circuit board contacts;

the capacitive element comprises a second connector communicatively coupled to another first circuit board contact; and wherein the at least one of the first circuit board contacts is a positive polarity contact and the another first circuit board contact is a negative polarity contact.

35. The apparatus of claim 20 or 21, wherein the first set of second circuit board contacts form a first continuous conductive surface for electrically communicating with the first set of z-axis compliant conductors and the second set of circuit board contacts form a second contiguous conductive surface for electrically communicating with the second set of z-axis compliant conductors.

36. The apparatus of claim 20 or 21, wherein the first set of second circuit board contacts form a first continuous conductive surface for electrically communicating with the first set of z-axis compliant conductors and the second set of circuit board contacts form a second contiguous conductive surface for electrically communicating with the second set of z-axis compliant conductors, thereby providing a tolerance for misalignment of the z-axis compliant conductors.

37. The apparatus of claim 22, wherein:

the contiguous elongated conductor base portion is soldered to the one of the first subset of first circuit board contacts; and the cantilevered beam portion is removably communicatively coupled to the one of the first set of second circuit board contacts and the wrap-around portion is removably communicatively coupled to the one of the second subset of first circuit board contacts.

* * * * *